(12) United States Patent
Kong

(10) Patent No.: US 11,934,919 B2
(45) Date of Patent: Mar. 19, 2024

(54) METHOD, APPARATUS, TERMINAL AND STORAGE MEDIUM FOR QUANTUM TOPOLOGY GRAPH OPTIMIZATION

(71) Applicant: ORIGIN QUANTUM COMPUTING TECHNOLOGY (HEFEI) CO., LTD., Hefei (CN)

(72) Inventor: Weicheng Kong, Hefei (CN)

(73) Assignee: ORIGIN QUANTUM COMPUTING TECHNOLOGY (HEFEI) CO., LTD., Anhui (CN)

( * ) Notice: Subject to any disclaimer, the term of this patent is extended or adjusted under 35 U.S.C. 154(b) by 0 days.

(21) Appl. No.: 18/029,569

(22) PCT Filed: Sep. 29, 2021

(86) PCT No.: PCT/CN2021/121735
§ 371 (c)(1),
(2) Date: Mar. 30, 2023

(87) PCT Pub. No.: WO2022/068880
PCT Pub. Date: Apr. 7, 2022

(65) Prior Publication Data
US 2024/0005190 A1    Jan. 4, 2024

(30) Foreign Application Priority Data

Sep. 30, 2020  (CN) .......................... 202011054196.4
Sep. 30, 2020  (CN) .......................... 202011065539.7
(Continued)

(51) Int. Cl.
*G06N 10/20*    (2022.01)
*G06F 30/398*   (2020.01)

(52) U.S. Cl.
CPC ........... *G06N 10/20* (2022.01); *G06F 30/398* (2020.01)

(58) Field of Classification Search
CPC ................................................... G06N 10/20
(Continued)

(56) References Cited

U.S. PATENT DOCUMENTS

2020/0125985 A1   4/2020  Narang et al.
2020/0401925 A1*  12/2020  Hertzberg ............... G06F 30/30

FOREIGN PATENT DOCUMENTS

CN    110889507 A    3/2020
CN    111027702 A    4/2020
(Continued)

*Primary Examiner* — Eric D Lee
(74) *Attorney, Agent, or Firm* — SALIWANCHIK, LLOYD & EISENSCHENK

(57) ABSTRACT

Disclosed are a quantum topology graph optimization method, apparatus, terminal and storage medium, comprising: obtaining a first quantum topology graph of a target quantum algorithm, determining an intermediate node in the first quantum topology graph, and removing connecting lines between other graph nodes other than the intermediate node so as to obtain a second quantum topology graph without the crossed connecting lines; if not, updating the first quantum topology graph to a third quantum topology graph; determining an optimized sub-graph corresponding to one node to be optimized and composed of N child nodes connected by connecting lines according to a preset way, assigning connecting lines between non-optimized nodes and each child node so as to obtain a fourth quantum topology graph; restoring connecting lines between non-optimized nodes in the fourth quantum topology graph so as to obtain an optimized quantum topology graph.

9 Claims, 27 Drawing Sheets

(30) Foreign Application Priority Data

| | | |
|---|---|---|
| Oct. 23, 2020 | (CN) | 202011143307.9 |
| Oct. 23, 2020 | (CN) | 202011143309.8 |
| Oct. 31, 2020 | (CN) | 202011196669.4 |
| Oct. 31, 2020 | (CN) | 202011198438.7 |
| Nov. 9, 2020 | (CN) | 202011236044.6 |

(58) Field of Classification Search
USPC .......................................................... 716/132
See application file for complete search history.

(56) References Cited

FOREIGN PATENT DOCUMENTS

| CN | 111461334 A | 7/2020 |
|---|---|---|
| CN | 112381231 A | 2/2021 |

* cited by examiner

|        | node 0 | node 1 | node 2 | node 3 | node 4 | node 5 | node 7 |
|--------|--------|--------|--------|--------|--------|--------|--------|
| node 0 | 0 | 0 | 5 | 18 | 2 | 12 | 5 |
| node 1 | 0 | 0 | 0 | 4 | 1 | 4 | 1 |
| node 2 | 5 | 0 | 0 | 12 | 4 | 4 | 20 |
| node 3 | 18 | 4 | 12 | 0 | 5 | 35 | 30 |
| node 4 | 2 | 1 | 4 | 5 | 0 | 18 | 6 |
| node 5 | 12 | 4 | 4 | 35 | 18 | 0 | 20 |
| node 7 | 5 | 1 | 20 | 30 | 6 | 20 | 0 |
| Sum    | 42 | 10 | 45 | 104 | 36 | 93 | 82 |

FIG.33

|        | node 0 | node 1 | node 2 | node 3 | node 4 | node 5 | node 7 |
|--------|--------|--------|--------|--------|--------|--------|--------|
| node 3 | 18 | 4 | 12 | 0 | 5 | 35 | 30 |

FIG.34

|        | node 0 | node 1 | node 2 | node 4 | node 7 |
|--------|--------|--------|--------|--------|--------|
| node 3 | 18 | 4 | 12 | 5 | 30 |
| node 5 | 12 | 4 | 4 | 18 | 20 |
| Sum    | 30 | 8 | 16 | 23 | 50 |

FIG.35

METHOD, APPARATUS, TERMINAL AND STORAGE MEDIUM FOR QUANTUM TOPOLOGY GRAPH OPTIMIZATION

CROSS REFERENCE TO RELATED APPLICATIONS

The disclosure is a National Stage of International Application No. PCT/CN2021/121735, filed on Sep. 29, 2021, which claims priority to a Chinese patent application No. 202011065539.7 filed on Sep. 30, 2020 and entitled "METHOD, APPARATUS, TERMINAL AND STORAGE MEDIUM FOR QUANTUM TOPOLOGY GRAPH OPTIMIZATION"; a Chinese patent application No. 202011196669.4 filed on Oct. 31, 2020 and entitled "METHOD, APPARATUS, TERMINAL AND STORAGE MEDIUM FOR QUANTUM TOPOLOGY GRAPH OPTIMIZATION"; a Chinese patent application No. 202011054196.4 filed on Sep. 30, 2020 and entitled "METHOD, APPARATUS TERMINAL AND STORAGE MEDIUM FOR CROSSED CONNECTING LINES PROCESSING OF QUANTUM CONNECTIVITY GRAPH"; a Chinese patent application No. 202011143307.9 filed on Oct. 23, 2020 and entitled "METHOD, APPARATUS FOR GRAPH, TERMINAL AND STORAGE MEDIUM FOR CONNECTIVITY OPTIMIZATION OF QUANTUM CONNECTIVITY"; a Chinese patent application No. 202011143309.8 filed on Oct. 23, 2020 and entitled "METHOD, APPARATUS, TERMINAL AND STORAGE MEDIUM FOR QUANTUM CONNECTIVITY GRAPH OPTIMIZATION"; a Chinese patent application No. 202011198438.7 filed on Oct. 31, 2020 and entitled "METHOD, APPARATUS, TERMINAL AND STORAGE MEDIUM FOR INDICATOR EVALUATION OF QUANTUM ALGORITHM"; a Chinese patent application No. 202011236044.6 filed on Nov. 9, 2020 and entitled "METHOD, APPARATUS, TERMINAL AND STORAGE MEDIUM FOR CLUSTERING DIVISION OF QUANTUM CONNECTIVITY GRAPH", all of which are hereby incorporated by reference in their entireties.

TECHNICAL FIELD

The present disclosure relates to the field of quantum computation, in particular to a method, apparatus, terminal and storage medium for quantum topology graph optimization.

BACKGROUND

With the popularity of quantum computation technology, quantum chips for implementing quantum computation have become a focus of research. Compared with traditional integrated chips, quantum chips are featured by powerful parallel computing capability which enhances exponentially with the quantity of bits (qubits) of the quantum chips.

A quantum algorithm is a method of implementing quantum computation, which is simulated in a quantum circuit and needs to run on a quantum chip. When some quantum algorithms for complex operations are compiled onto the quantum chip, there are situations such as the crossover of couplings (i.e., two-qubit logic gates) between multiple qubits, and the excessive quantity of coupling between several qubits and neighboring qubits, which leads to a high depth of the quantum algorithm. However, the quantum chips at present are of a two-dimensional structure, and the coupling between qubits is realized through specific coupling structures (capacitance, inductance, resonant cavity, etc.), such that two coupling structures cannot be crossed; moreover, the coupling of one qubit with too many neighboring qubits will significantly reduce the regulation of the qubit and the accuracy of the quantum computation performed. Therefore, some complex quantum algorithms cannot be effectively implemented on existing quantum chips in a two-dimensional structure.

SUMMARY

An object of the present disclose is to provide a quantum topology graph optimization method, apparatus, terminal and storage medium so as to address deficiencies in prior art, which can optimize the complex quantum algorithm, remove the crossed connecting lines in the quantum topology graph corresponding to the quantum algorithm, minimize the swap gate operation applied in the quantum algorithm, simplify the depth of the quantum algorithm, improve the fidelity of the quantum algorithm, and enable the complex quantum algorithm to run on the quantum chip in a two-dimensional structure.

The technical solution of the present application is as follows.

According to a first aspect of the present disclosure, a quantum topology graph optimization method is provided, and the method includes: obtaining a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits; when there are crossed connecting lines in the first quantum topology graph, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph; when there is a node to be optimized in the second quantum topology graph or the third quantum topology graph, determining an optimized sub-graph corresponding to one node to be optimized and composed of N child nodes connected by connecting lines according to a preset way, wherein the node to be optimized is a graph node in the first quantum topology graph with connectivity greater than a connectivity threshold of a quantum chip to be applied, and none of the child nodes in the optimized sub-graph is of a connectivity greater than the connectivity threshold; assigning connecting lines between non-optimized nodes and each child node so as to obtain a fourth quantum topology graph; wherein, the non-optimized nodes are graph nodes other than the node to be optimized; restoring connecting lines between non-optimized nodes in the fourth quantum topology graph so as to obtain an optimized quantum topology graph.

According to a second aspect of the present disclosure, a quantum topology graph optimization apparatus is provided, and the apparatus includes: an obtaining module configured to obtain a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits; a cross processing module configured that when there are crossed connecting lines in the first quantum topology graph, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph; a determining module configured that when there is a node to be optimized in the second quantum topology graph or the third quantum topology graph, determining an optimized sub-graph corresponding to one node to be optimized and composed of N child nodes connected by connecting lines according to a preset way, wherein the node to be optimized is a graph node in the first quantum topology graph with connectivity greater than a connectivity threshold of a quantum chip to be applied, and none of the child nodes in the optimized sub-graph is of a connectivity greater than the connectivity threshold; an assigning module configured to assign connecting lines between non-optimized nodes and each child node so as to obtain a fourth quantum topology graph; wherein, the non-optimized nodes are graph nodes other than the node to be optimized; a restoring module configured to restore connecting lines between non-optimized nodes in the fourth quantum topology graph so as to obtain an optimized quantum topology graph.

According to a third aspect of the present disclosure, a quantum topology graph optimization method is provided, and the method includes: obtaining a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits; judging whether there are crossed connecting lines and/or a node to be optimized in the first quantum topology graph, wherein the node to be optimized is a graph node in the first quantum topology graph with connectivity greater than a connectivity threshold of a quantum chip to be applied; if there are crossed connecting lines in the first quantum topology graph, determining an intermediate node in the first quantum topology graph, retaining connecting lines between the intermediate node and other graph nodes, obtaining a connecting line weight of each of connecting lines between other graph nodes and removing connecting lines according to the connecting line weight of each of connecting lines between other graph nodes so as to obtain a second quantum topology graph without the crossed connecting lines; if not, updating the first quantum topology graph to a third quantum topology graph; when there is a node to be optimized in the second quantum topology graph or the third quantum topology graph, determining an optimized sub-graph corresponding to one node to be optimized and composed of N child nodes connected by connecting lines according to a preset way, wherein none of the child nodes in the optimized sub-graph is of a connectivity greater than the connectivity threshold; assigning connecting lines between non-optimized nodes and each child node so as to generate an optimized quantum topology graph, wherein the non-optimized nodes are graph nodes other than the node to be optimized in the second quantum topology graph or the third quantum topology graph.

According to a fourth aspect of the present disclosure, a quantum topology graph optimization apparatus is provided, and the apparatus includes: an obtaining module configured to obtain a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits; a judging module configured to judge whether there are crossed connecting lines and/or a node to be optimized in the first quantum topology graph, wherein the node to be optimized is a graph node in the first quantum topology graph with connectivity greater than a connectivity threshold of a quantum chip to be applied; a cross processing module configured that if there are crossed connecting lines in the first quantum topology graph, determining an intermediate node in the first quantum topology graph, retaining connecting lines between the intermediate node and other graph nodes, obtaining a connecting line weight of each of connecting lines between other graph nodes and removing connecting lines according to the connecting line weight of each of connecting lines between other graph nodes so as to obtain a second quantum topology graph without the crossed connecting lines; if not, updating the first quantum topology graph to a third quantum topology graph; a determining module configured that when there is a node to be optimized in the second quantum topology graph or the third quantum topology graph, determining an optimized sub-graph corresponding to one node to be optimized and composed of N child nodes connected by connecting lines according to a preset way, wherein the connectivity of all the child nodes in the optimized sub-graph is no greater than the connectivity threshold; a generating module configured to assign connecting lines between non-optimized nodes and each child node so as to generate an optimized quantum topology graph, wherein the non-optimized nodes are graph nodes other than the node to be optimized in the second quantum topology graph or the third quantum topology graph.

According to a fifth aspect of the present disclosure, a computer terminal is provided and includes a machine-readable storage medium and a processor, the machine-readable storage medium stores a computer program therein, and the processor is configured to run the computer program to execute the quantum topology graph optimization method as described above.

According to a sixth aspect of the present disclosure, a computer readable storage medium is provided, and the computer readable storage medium stores a computer program therein, and the computer program, when executed by a computer, can implement the quantum topology graph optimization method as described above.

Compared with the prior art, in the present application, obtaining a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits; when there are crossed connecting lines in the first quantum topology graph, determining an intermediate node in the first quantum topology graph, retaining connecting lines between the intermediate node and other graph nodes, and removing connecting lines between other graph nodes other than the intemiediate node so as to obtain a second quantum topology graph without the crossed connecting lines; if not, updating the first quantum topology graph to a third quantum topology graph; when there is a node to be optimized in the second quantum topology graph or the third quantum topology graph, determining an optimized sub-graph corresponding to one node to be optimized and composed of N child nodes connected by connecting lines according to a preset way, wherein the node to be optimized is a graph node in the first quantum topology graph with connectivity greater than a connectivity threshold of a quantum chip to be applied, and the connectivity of all the child nodes in the optimized sub-graph is no greater than the connectivity threshold; assigning connecting lines between non-optimized nodes and each child node so as to obtain a fourth quantum topology graph; wherein, the non-optimized nodes are graph nodes other than the node to be optimized; restoring connecting lines between non-optimized nodes in the fourth quantum topology graph so as to obtain an optimized quantum topology graph. Alternatively, judging whether there are crossed connecting lines and/or a node to be optimized in the first quantum topology graph, wherein the node to be optimized is a graph node in the first quantum topology graph with connectivity greater than a connectivity threshold of a quantum chip to be applied; if there are crossed connecting lines in the first quantum topology graph, determining an intermediate node in the first quantum topology graph, retaining connecting lines between the intermediate node and other graph nodes, obtaining a connecting line weight of each of connecting lines between other graph nodes and removing connecting lines according to the connecting line weight of each of connecting lines between other graph nodes so as to obtain a second quantum topology graph without the crossed connecting lines; if not, updating the first quantum topology graph to a third quantum topology graph; when there is a node to be optimized in the second quantum topology graph or the third quantum topology graph, determining an optimized sub-graph corresponding to one node to be optimized and composed of N child nodes connected by connecting lines according to a preset way, wherein the connectivity of all the child nodes in the optimized sub-graph is no greater than the connectivity threshold; assigning connecting lines between non-optimized nodes and each child node so as to generate an optimized quantum topology graph, wherein the non-optimized nodes are graph nodes other than the node to be optimized in the second quantum topology graph or the third quantum topology graph, and the target quantum algorithm is optimized based on the optimized quantum topology graph. The crossed connecting lines in the first quantum topology graph corresponds to the cross-coupling structure (capacitance, inductance, resonator, etc.) between multiple qubits of a quantum chip, which is impossible to be achieved in a quantum chip with a two-dimensional quantum chip. By optimizing to eliminate the crossed connecting lines, it is possible to implement an optimized quantum topology graph without the crossed connecting lines in a quantum chip in a two-dimensional structure; and in the implementation process, it is possible to reduce the quantity of applied swap gates, and then improve the execution effect of the quantum algorithm; by optimizing the node to be optimized that exceeds the connectivity threshold of the quantum chip to be applied, when the logic bits in the optimized quantum topology graph are mapped to the qubits of the quantum chip, it is possible to reduce the effect of neighboring qubits on the qubit to be regulated through the coupling structure and improve the fidelity of the quantum algorithm, such that a complex quantum algorithms can run on the quantum chip.

BRIEF DESCRIPTION OF THE DRAWINGS

FIGS. 13a, 13b, 13c, and 13d illustrate a schematic diagram of connecting lines between N nodes provided by an embodiment of the present disclosure;

FIG. 33 illustrates a schematic diagram of a mutual intensity matrix of nodes to be assigned of an alternative embodiment;

FIG. 34 illustrates a flow diagram of obtaining a first node to be assigned in the step S141 of an alternative embodiment;

FIG. 35 illustrates a flow diagram of obtaining other nodes to be assigned in the step S141 of an alternative embodiment;

DETAILED DESCRIPTION

The embodiments described below by reference to the accompanying drawings are exemplary and are intended to explain the invention only and are not to be construed as limiting the invention. Further, it should be understood that the illustrative accompanying drawings are not drawn to physical scale. The flowcharts used in the present disclosure illustrate operations implemented according to some embodiments of the embodiments of the present disclosure.

It should be understood that the operations of the flowcharts may be implemented out of sequence, and steps without logic contextual relationships may be implemented in reverse order or simultaneously. In addition, a person skilled in the art, guided by the contents of the present application, may add one or more other operations to the flowchart and may remove one or more operations from the flowchart.

Based on technical solutions obtained from the background, it can be seen that when the quantum algorithm is compiled onto a quantum chip, there may be a situation where the couplings between multiple qubits (i.e., qubit logic gates) may cross, resulting in a high depth of the quantum algorithm and poor performance on a quantum chip in a two-dimensional structure.

Figure 1:
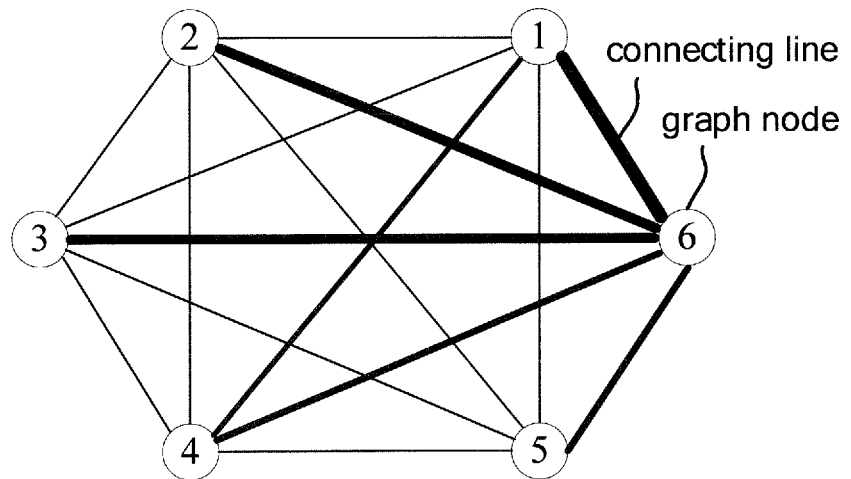
FIG. 1 a schematic diagram of a quantum topology graph corresponding to a conventional quantum algorithm provided by an embodiment of the present disclosure.

For example, referring to FIG. 1, it shows a schematic diagram of a quantum topology graph of a quantum algorithm, and the quantum topology graph may include a plurality of graph nodes and connecting lines between two graph nodes. Among them, the graph nodes may be used to represent the logic bits in the target quantum algorithm, and the connecting line may be used to represent the qubit logic gates between two qubits. It can be seen that, in the quantum topology graph, there are many intersections of connecting lines between the graph node 1, the graph node 2, the graph node 3, the graph node 4, the graph node 5, and the graph node 6.

Figure 2:
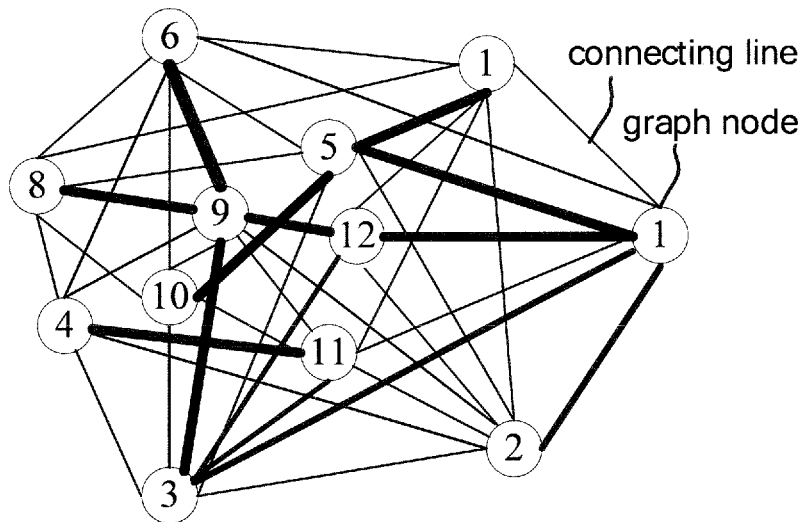
FIG. 2 a schematic diagram of a quantum topology graph corresponding to a complex quantum algorithm provided by an embodiment of the present disclosure.

In contrast to the quantum topology graph of FIG. 1, FIG. 2 shows a quantum topology graph of a more complex quantum algorithm. That is, when the quantity of logic bits in the quantum algorithm is large and thus the quantity of quantum logic gates to be executed between two logic bits is also large, the quantum topology corresponding to the quantum algorithm appears to be more complex.

The inventors have found that the quantum chips that can be produced at this stage are small and medium-sized chips with noise, and the short quantum state lifetime and high error rate make large-scale and long-depth operations impossible under the current technology. Further, since a quantum error correction (QEC) algorithm has little chance of being implemented in the near future due to the large quantity of bits required, the quantum computation can only focus on small-scale and error-free areas. In order to increase the accuracy of computational results, it is necessary to reduce the depth of the quantum algorithm as much as possible.

However, quantum chips in related technologies are usually in a two-dimensional structure, and coupling between qubits is usually achieved through specific coupling structures (e.g., capacitors, inductors, resonant cavities, etc.). Therefore, two coupling structures cannot be crossed in practical implementation, while cross-coupling between logic bits in the quantum algorithm is going to occur frequently. The cross-coupling between logic bits in the quantum algorithm needs to be implemented on the quantum chip.

In order to address the above problems, the inventors have found in the course of further research that the current conventional method changes the mapping relationship between qubits by applying swap gates. For example, see FIG. 3, it is a quantum circuit diagram corresponding to a simple quantum algorithm, where q1, q2, q3, and q4 represent 4 logic bits respectively, and the connecting line between logic bits represents the two logic bits that need to be applied to the quantum logic gate; FIG. 3b is a two-dimensional lattice structure of the quantum chip corresponding to the quantum algorithm in FIG. 3a, where Q1, Q2, Q3, and Q4 represent qubits, and the connecting lines between qubits represent the specific coupling structure. When executing a quantum program, $n_q \leq n_Q$ must be obeyed between the quantity $n_q$ of logic bits in a quantum algorithm and the quantity $n_Q$ of bits in the quantum chip, and each logic bit shall be mapped to a qubit. Only when two logic bits are mapped to two directly connected qubits, a two-bit gate operation can be performed; otherwise, the swap gate can only be used to remap two logic bits that were originally mapped to two non-directly connected qubits to two directly connected qubits.

Figure 3A:
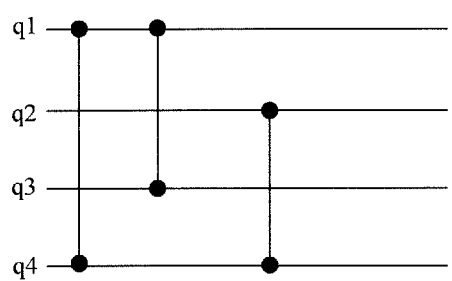
FIGS. 3a and 3b illustrate a schematic diagram of a quantum circuit diagram corresponding to a quantum algorithm and a schematic diagram of a two-dimensional lattice structure of a corresponding quantum chip, respectively.
Figure 3B:
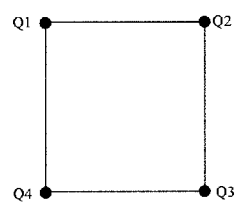

In an example, by combining the sequential lines between Q1, Q2, Q3, and Q4 in FIG. 3b, it can be seen that the qubit logic gate can be applied directly between q1 and q4 in FIG. 3a, while the swap gate operation is required when the qubit logic gate is applied between q1 and q3, for example, by swapping the positions of q1 and q2 to apply the qubit logic gate; for another example, the qubit logic gate operation is not possible either between q2 and q4, and the swap gate also needs to be applied. It should be noted that swap gates are all applied in pairs, i.e., after swapping the positions of q1 and q2 by applying the swap gate and applying the corresponding qubit logic gate, another swap gate needs to be applied to restore the positions of q1 and q2. Therefore, it will lead to an increase in the depth of the algorithm by introducing the swap gate to address the problems caused by crossed connecting lines of quantum connectivity graph, and a high quantity of swap gates will significantly prolong running time of the algorithm, which still cannot achieve a better algorithm execution effect.

It should be noted that FIG. 3b only lists the two-dimensional lattice structure of a quantum chip including 4 qubits, and when the quantity of qubits is large, the quantity of swap gates that need to be applied in the quantum algorithm will also increase greatly, which greatly increases the complexity of the quantum algorithm, and it is difficult to ensure the fidelity of the calculation result when the subsequent quantum chip runs the quantum algorithm.

It should be added that on a quantum chip, the quantity of coupling structures connected to any one qubit is not infinite but a specific limited quantity for the reasons that two neighboring qubits can interact with each other through the coupling structure, and when one qubit is connected with many neighboring qubits through the coupling structures, even if only two-qubit logic gate is applied to the qubit to be regulated and one of the neighboring qubits, the other neighboring qubits will affect the qubit to be regulated through the coupling structure, making the regulation of the qubit to be regulated erroneous, which will affect the quantum algorithm running on the qubit to be regulated and greatly reduce the fidelity of the quantum algorithm.

The defects of the above solutions in the prior art are the result of the inventor's practice and careful study. Therefore, the process of discovering the above technical problems and the solutions proposed by the embodiments of the present disclosure below for the above problems should be the inventor's contribution to the present disclosure during the creation of the invention, and should not be understood as technical content that is known to those skilled in the art.

Based on the above technical problems found by the inventors, embodiments of the present disclosure provide a quantum topology graph optimization method, aiming at improving crossed connecting lines and/or node to be optimized in a quantum topology graph of a conventional quantum algorithm. When there are crossed connecting lines in a first quantum topology graph corresponding to a quantum algorithm, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph; further, when it is determined that there is node to be optimized in the second quantum topology graph or the third quantum topology graph, determining an optimized sub-graph corresponding to one node to be optimized and composed of N child nodes connected through connecting lines according to a preset method; and assigning connecting lines between non-optimized nodes and the child nodes to obtain a fourth quantum topology graph; restoring connecting lines between the non-optimized nodes in the fourth quantum topology graph to obtain an optimized quantum topology graph. In this way, by optimizing to eliminate the crossed connecting lines, it is possible to effectively shorten the depth of the quantum algorithm, reduce the running time of the quantum algorithm, and reduce the quantity of swap gates applied during a implementation process when an optimized quantum topology graph without crossed connecting lines is implemented on the quantum chip in a two-dimensional structure; and by optimizing the nodes to be optimized that exceed the connectivity threshold of the quantum chip to be applied, it is possible to reduce the effect of neighboring qubits on the qubits to be regulated through the coupling structure and greatly improve the fidelity of the quantum algorithm when the logic bits in the optimized quantum topology graph are mapped to the qubits of the quantum chip.

The following is a detailed introduction to some exemplary implementations of crossed connecting lines processing method of the above quantum connectivity graph in conjunction with the accompanying diagrams in the specification.

Figure 4:
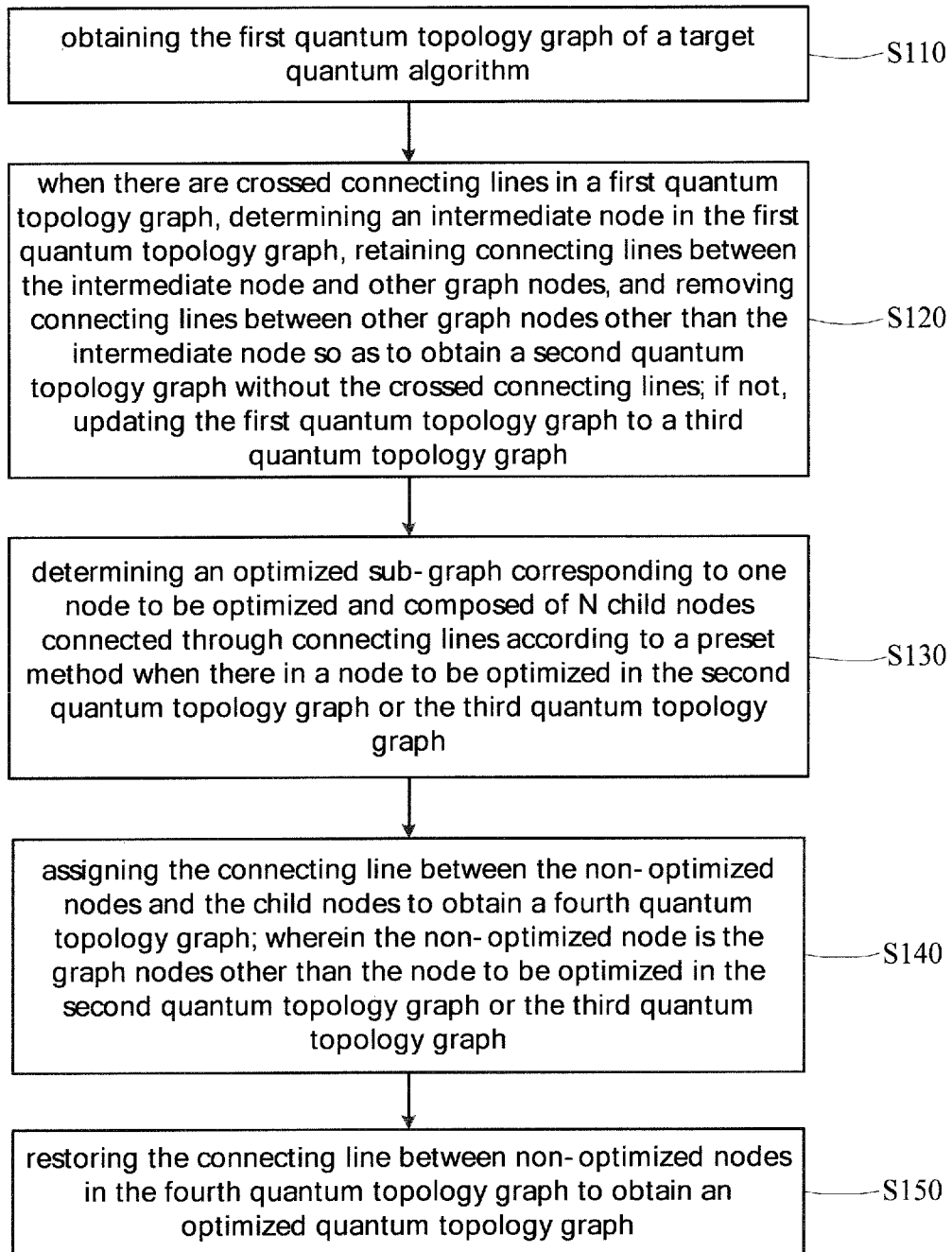
FIG. 4 illustrates a flow diagram of a quantum topology graph optimization method provided by an embodiment of the present disclosure.

Referring to FIG. 4, it illustrates a flow diagram of an optimization method for the quantum topology graph provided by an embodiment of the present disclosure, including:

Step S110, obtaining the first quantum topology graph of a target quantum algorithm.

In the present embodiment, the first quantum topology graph may include a plurality of graph nodes and connecting lines between two graph nodes, where the graph nodes may represent logic bits in the target quantum algorithm, and the connecting line may represent a qubit logic gate between two qubits.

Wherein, the quantum connectivity graph can be obtained based on the logic bits in the target quantum algorithm and the number of qubit logic gates applied on any two qubits. Wherein, the qubits may refer to a physical system that can be in a ground state |0>, an excited state |1> and a superposition state ($\alpha$|0>+$\beta$|1>) at the same time. Mathematically, the qubits can be represented by vectors of states on Hilbert space. Quantum circuits are implemented by manipulating several qubits at the same time.

A quantum circuit is a representation of a quantum program that can be consisted of a sequence of qubits initially located in the |0> state and a quantity of subsequent quantum logic gates, and terminated by a measurement operation (not necessarily every bit needs to be measured). Typically, each quantum program can eventually be decomposed into a quantum program consisting only of a sequence of elementary quantum logic gates. In addition, the qubit logic gates may refer to some reversible unitary transformations, and may be used to manipulate several qubits to make these qubits evolve towards a target state in order to evolve into a final state, that is, the result of quantum computation.

Step S120, when there are crossed connecting lines in a first quantum topology graph, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph.

For example, in some possible examples, it is possible to detect whether the first quantum topology graph is a plane graph, that is, to detect whether there is an intersection between the various connecting lines in the first quantum topology graph. That is, when there is an intersection between any two connecting lines, it can be determined that there are crossed connecting lines in the first quantum topology graph; when there are no intersections between all connecting lines, it can be determined that there are no crossed connecting lines in the quantum connectivity graph.

When the first quantum topology graph is not a planar graph, it means that there are crossed connecting lines in the quantum connectivity graph, that is, it is necessary to achieve the cross-coupling in the corresponding quantum chip structure; however, the structure of the actual quantum chip is a two-dimensional lattice structure, and therefore cannot achieve a specific structure corresponding to the cross-coupling between qubits. The crossed connecting lines is not optimized in related technologies, that is, the two-dimensional lattice structure of the quantum chip is not changed in the subsequent process of running the quantum algorithm through the quantum chip, but the mapping relationship between the qubits is changed by applying the swap gate. In this way, when too many swap gates are applied, it is possible to increase the depth of the algorithm as well as the algorithm running time.

In the present embodiment, however, when there are crossed connecting lines in the first quantum topology graph, the second quantum topology without crossed connecting lines is obtained by determining the intermediate node in the first quantum topology graph and retaining the connecting lines between the intermediate node and other graph nodes.

For example, in some possible examples, in the process of determining the intermediate node in the first quantum topology graph, the intermediate node may represent the highest priority graph node in the first quantum topology graph, and thus the graph node with the highest priority in this first quantum topology graph can be selected as the intermediate node. This priority can be calculated in conjunction with the node value of the graph node in the first quantum topology graph.

For another example, in the process of retaining the connecting lines between the intermediate node and other graph nodes, it is possible to choose to remove the connecting lines between other graph nodes other than the intermediate point, specifically removing all connecting lines between other graph nodes, or only removing crossed connecting lines between other graph nodes.

Step S130, determining an optimized sub-graph corresponding to one node to be optimized and composed of N child nodes connected through connecting lines according to a preset method when there in a node to be optimized in the second quantum topology graph or the third quantum topology graph.

For example, in some possible examples, it is possible to detect whether there is a node in the first quantum topology graph whose connectivity is greater than the connectivity threshold of the quantum chip to be applied, i.e., detect the quantity of connecting lines connected to each graph node. It should be noted that the connectivity threshold of the quantum chip to be applied is determined based on the parameters of the fidelity of the quantum algorithm. For example, the fidelity of the quantum algorithm at this stage is required to be not less than 97%, and by calculating the effect factor of each neighboring qubit on the qubit to be regulated through the coupling structures, it is possible to determine the quantity of the neighboring qubits that can be connected on the qubit to be regulated, i.e., the connectivity threshold. In embodiments of the present disclosure, the connectivity threshold may be predetermined to be 4. When there is a graph node with connectivity greater than the connectivity threshold in the first quantum topology graph, the graph node is defined as the node to be optimized.

After determining the node to be optimized for optimization by detecting the quantity of connecting lines of each graph node in the second quantum topology graph or the third quantum topology graph, it is possible to process the nodes to be optimized; specifically, for one node to be optimized, the node to be optimized is converted into an optimized sub-graph composed of multiple child nodes connected by connecting lines, the child node acts equivalent to the graph node in the second quantum topology graph or the third quantum topology graph, represents a logic bit and connected by a connecting line. The optimized sub-graph is used to connect the connecting line originally connected to the node to be optimized.

It is conceivable that for the node to be optimized, the quantity of connecting lines exceeds the connectivity threshold of the quantum chip, so after assigning the connecting lines of the node to be optimized to each child node of the optimized sub-graph, the quantity of connecting lines of each child node is significantly reduced compared to the quantity of connecting lines of the node to be optimized. Therefore, it is possible to determine the appropriate quantity N of child nodes, to form the optimized sub-graph consisting of the N child nodes, to allow each child node in the optimized sub-graph to connect to other graph nodes instead of the node to be optimized, and to make the connectivity of all child nodes in the optimized sub-graph no greater than the connectivity threshold. In this way, it is possible to effectively reduce the connectivity of the nodes to be optimized in the second quantum topology graph or the third quantum topology graph, so that the corresponding optimized topology graph can be implemented on the quantum chip.

Step S140, assigning the connecting line between the non-optimized nodes and the child nodes to obtain a fourth quantum topology graph; wherein the non-optimized node is the graph nodes other than the node to be optimized in the second quantum topology graph or the third quantum topology graph.

After determining the nodes to be optimized by detecting the quantity of connecting lines connected by each graph node in the second quantum topology graph or the third quantum topology graph, the graph nodes other than the nodes to be optimized are defined as non-optimized nodes, that is, nodes that do not need to be optimized.

After determining the optimized sub-graph corresponding to the node to be optimized and composed of N child nodes connected by the connecting line by a preset way, the optimized node needs to be replaced with the optimized sub-graph, and those connecting lines that originally connected to the node to be optimized need to be connected to the child node of the optimized sub-graph one by one, which enables the quantum algorithm to efficiently implement the interaction between two logic bits, i.e., to apply the quantum logic gate.

Step S150, restoring the connecting line between non-optimized nodes in the fourth quantum topology graph to obtain an optimized quantum topology graph.

When optimizing the crossed connecting lines in the first quantum topology graph, the connecting line between graph nodes other than the intermediate node is removed, i.e., the path of applying quantum logic gates directly between other graph nodes for the quantum algorithm is disconnected; at this time, when quantum logic gates need to be applied between other graph nodes for the quantum algorithm, the quantum logic gate can be applied only after the swap gate is applied through the intermediate node.

Therefore, after obtaining the fourth quantum topology graph by optimizing the node to be optimized and assigning the connection relationship between the non-optimized node and the child node, it is possible to restore the connecting lines between the non-optimized nodes in the fourth quantum topology graph. In this way, it is possible to directly apply the qubit logic gate for operation between the two graph nodes of the connecting line to be restored, and avoid the defects of increasing the depth of the quantum algorithm and prolonging the time of the quantum operation caused by applying the swap gate, and improve the fidelity of the quantum algorithm.

It should be added that the non-optimized nodes in the fourth quantum topology graph correspond to other graph nodes other than the intermediate node in the first quantum topology graph; moreover, when the connecting lines between the non-optimized nodes in the fourth quantum topology graph are restored, it must follow a rule that crossed connecting lines cannot appear, that is, there are no crossed connecting lines in the optimized quantum topology graph.

In this way, by optimizing to eliminate the crossed connecting lines, it is possible that the optimized quantum topology graph without the crossed connecting lines may be implemented on a quantum chip in a two-dimensional structure; and by optimizing the nodes in the quantum topology graph with a node connectivity greater than the connectivity threshold of the quantum chip, it is possible that one qubit performs the two-qubit logic gate with as few neighboring qubits as possible, which reduces the effect of the two-qubit logic gate applied on the multiple qubits on the qubit and improves the precision of regulation on the qubits, so that the effect of the two-qubit logic gate applied on a single qubit in the quantum algorithm can operate precisely on the quantum chip, thus implementing a complex quantum algorithm on the quantum chip.

Figure 5:
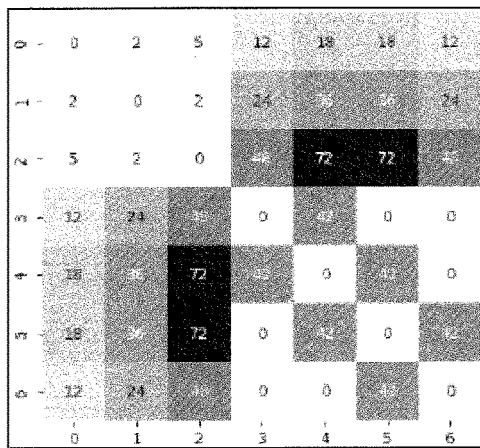
FIG. 5 illustrates a schematic diagram of an adjacency matrix corresponding to a quantum algorithm provided by an embodiment of the present disclosure.

In a possible implementation, in the process of obtaining the first quantum topology graph of the target quantum algorithm, it is possible to obtain the logic bits in the quantum algorithm and the number of qubit logic gates applied on any two logic bits; then, the adjacency matrix may be obtained based on the number of qubit logic gates applied on any two qubits, such as the adjacency matrix shown in FIG. 5, where the values 0, 1 . . . 6 on the horizontal and vertical axes represent the logic bits in the target quantum algorithm, and the values at the intersection of the horizontal and vertical axes represent the quantity of the quantum logic gates applied to the corresponding two logic bits; in turn, the adjacency matrix is converted into the first quantum topology graph, wherein the first quantum topology graph corresponding to the adjacency matrix of FIG. 5 is shown in FIG. 1.

In one possible implementation, however, the multiple qubit logic gates are applied between two logic bits, and the number of the qubit logic gates applied between the two logic bits is counted only once when counting the quantity to obtain the adjacency matrix. Since a first qubit logic gate can be applied between the two qubits, the subsequent successive qubit logic gates can be applied directly without any swap gate operation.

Continuing back to the first quantum topology graph shown in FIG. 1, it may be found that the connecting line has a coarseness that represents the number of the qubit logic gates applied between any two logic bits in the quantum algorithm, i.e., corresponding to the values in the adjacency matrix in FIG. 5.

Figure 6:
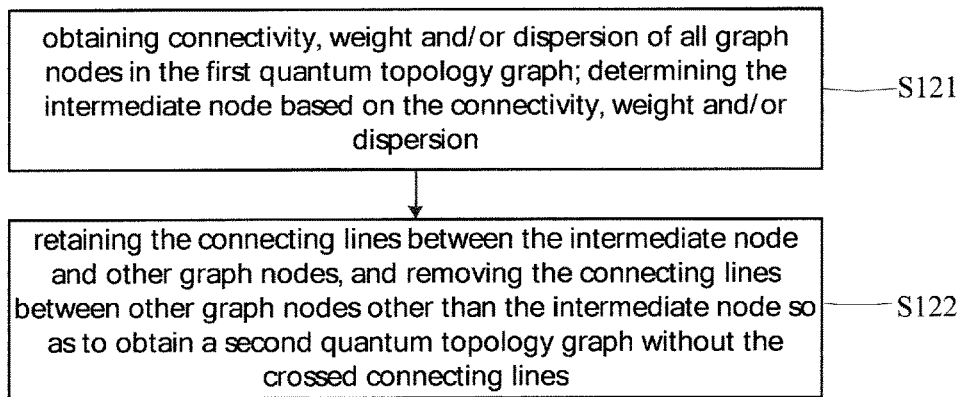
FIG. 6 illustrates a flow diagram of an optimized second quantum topology graph without crossed connecting lines provided by an embodiment of the present disclosure.

As shown in FIG. 6, in one possible implementation, the inventors found in the course of their research that since each graph node in the first quantum topology graph has a different value, it is necessary to avoid changing the graph node with a high value in the first quantum topology graph as much as possible in the process of optimizing the crossed connecting lines; otherwise, too many swap operations may be introduced. Based on this, for the step S120, it can be implemented by the following exemplary sub-steps, which are described in detail as follows.

Sub-step S121, obtaining connectivity, weight and/or dispersion of all graph nodes in the first quantum topology graph; determining the intermediate node based on the connectivity, weight and/or dispersion.

Figure 7:
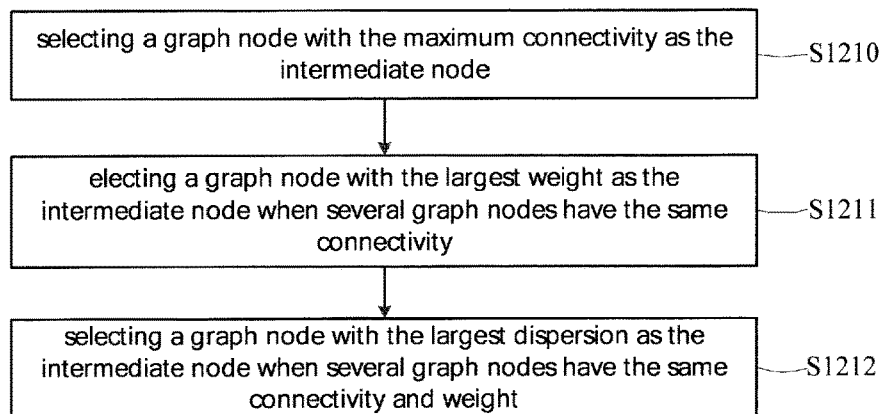
FIG. 7 illustrates an acquisition diagram of an intermediate node provided by an embodiment of the present disclosure.

As shown in FIG. 7, in the first quantum topology graph, the connectivity is a quantity of connecting lines connected by each graph node, the weight is a sum of the coarseness of all connecting lines connected by each graph node, and the dispersion is a variance of the coarseness of all connecting lines connected by each graph node. After obtaining the connectivity, the weight, and/or the dispersion of all graph nodes in the first quantum topology graph, the intermediate node can be determined based on the connectivity, the weight, and/or the dispersion. The exemplary steps are as follows.

Sub-step S1210, selecting a graph node with the maximum connectivity as the intermediate node.

As shown in FIG. 1 or FIG. 2, the connectivity is used to measure the interaction between two graph nodes, and therefore, the greater the connectivity of the graph node, the higher the value of the graph node in the quantum algorithm, and when optimizing the crossed line in the first quantum topology graph, it is necessary to select the node as the intermediate node and retain the intermediate node.

Sub-step S1211, selecting a graph node with the largest weight as the intermediate node when several graph nodes have the same connectivity.

The inventors found in the course of their research that in some specific cases, it may happen that the connectivity of multiple graph nodes in the first quantum topology graph are all the same, for example, when the connectivity of all six logic bits in FIG. 1 are 5, it is necessary to use the weight parameter of the graph node, i.e., the sum of the number of the qubit logic gates applied between the graph node with the maximum connectivity and the neighboring graph nodes.

Sub-step S1212, selecting a graph node with the largest dispersion as the intermediate node when several graph nodes have the same connectivity and weight.

The inventors also found in the course of their research that in another specific case, it may happen that the multiple graph nodes have the same connectivity, and based on this, it is further necessary to determine the intermediate node in conjunction with the dispersion of the graph nodes.

Taking the first quantum topology graph represented by FIG. 1 as an example, when the intermediate node in the first quantum topology graph is determined to be the graph node 6 by the above exemplary steps, it is possible to optimize the crossed connecting lines in the first quantum topology graph based on the intermediate node.

Sub-step S122, retaining the connecting lines between the intermediate node and other graph nodes, and removing the connecting lines between other graph nodes other than the intermediate node so as to obtain a second quantum topology graph without the crossed connecting lines.

Figure 8:
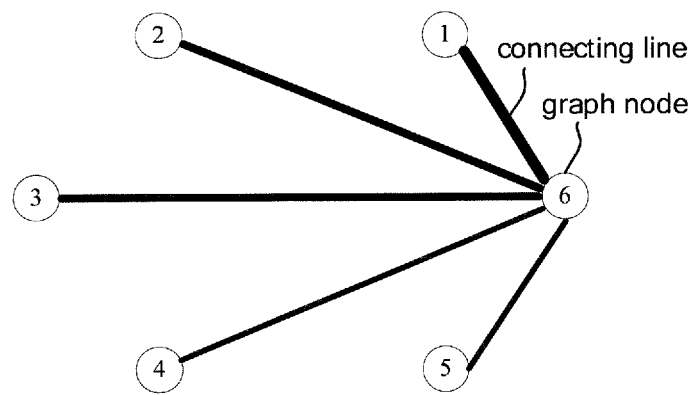
FIG. 8 illustrates a schematic diagram of an optimized second quantum topology graph without crossed connecting lines provided by an embodiment of the present disclosure.

As shown in FIG. 8, when the graph node 6 in FIG. 1 is determined to be the intermediate node by the above exemplary steps, it is possible to retain the connecting lines between the graph node 6 and the graph node 1, graph node 2, graph node 3, graph node 4, graph node 5, and remove the connecting lines between the graph node 1, graph node 2, graph node 3, graph node 4, and graph node 5 other than the above connecting line so as to obtain the second quantum topology graph without the crossed connecting lines, i.e., the second quantum topology graph shown in FIG. 8.

The second quantum topology graph shown in FIG. 8 is obtained by optimizing the crossed connecting lines present in the first quantum topology graph, and it may be found that the connectivity of the graph node 6 in FIG. 8 is 5, which exceeds the predefined connectivity threshold of the quantum chip (i.e., the value 4 as described earlier), so it needs to be optimized for such graph nodes that exceed the connectivity threshold.

Continuing as shown in FIG. 8, in one possible implementation, for the second quantum topology graph, only the connecting lines between the intermediate node and the other graph nodes are retained, i.e., the connectivity of all other graph nodes is 1. The graph node with the highest connectivity is selected as the intermediate node when determining the intermediate node, so it is preferred to determine whether the intermediate node is the node to be optimized when determining the node to be optimized.

In one possible implementation, the inventors found that the optimized sub-graph consisting of N child nodes can replace the nodes to be optimized in the second quantum topology graph or the third quantum topology graph to connect to other graph nodes, which effectively reduces the connectivity of the nodes to be optimized in the second quantum topology graph or the third quantum topology graph.

In one possible implementation, incrementing a child node in sequence until the connectivity of N child nodes in the generated optimized sub-graph is not greater than the connectivity threshold, and the optimized sub-graph is connected to the non-optimized node through the connecting line, wherein N is a positive integer greater than 1.

Taking FIG. 8 as an example, the graph node 6 has connectivity greater than the connectivity threshold and is determined as the node to be optimized, and the remaining graph node 1, graph node 2, graph node 3, graph node 4, and graph node 5 are all non-optimized nodes. In the specific implementation, one child node is incremented at a time, i.e., the optimized sub-graph of two child nodes connected by the connecting line is generated for one node to be optimized, as shown in FIG. 9.

Figure 9:
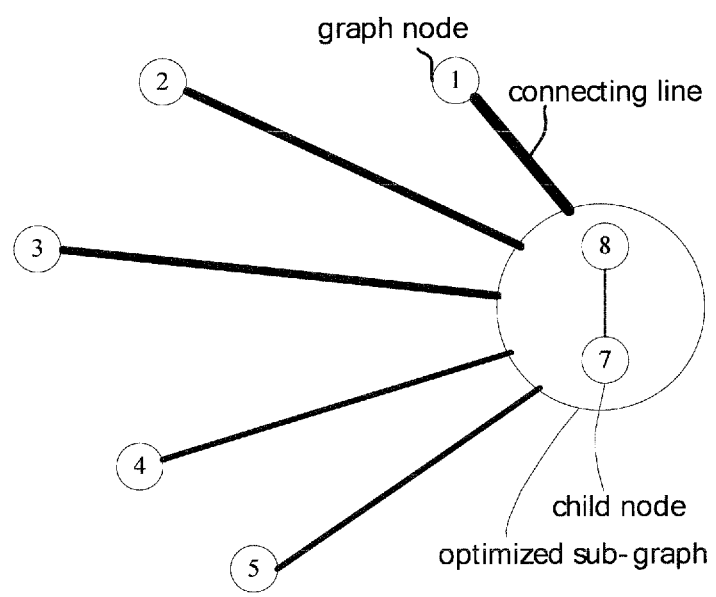
FIG. 9 illustrates a schematic diagram of an optimized sub-graph composed of two child nodes provided by an embodiment of the present disclosure.

In FIG. 9, the optimized sub-graph is composed of a child node 7 and a child node 8, and at this time, the connecting lines of other graph node 1, graph node 2, graph node 3, graph node 4, and graph node 5 with the nodes to be optimized are connected to the optimized sub graph, that is, to child node 7 and child node 8 in the optimized sub-graph. The connecting lines of the child node 7 and the child node 8 with the graph node 1, graph node 2, graph node 3, graph node 4, and graph node 5 are assigned according to 2 and 3 or 3 and 2, which may ensure that the connectivity of the child node is not greater than the connectivity threshold.

FIG. 9, as a possible embodiment, shows schematically a second quantum topology graph or a third quantum topology graph consisting of 6 logic bits only. In another possible example, the quantity of logic bits is higher, the connectivity of the node to be optimized is higher, and in the case where the connectivity is much greater than the connectivity threshold, it is impossible to reduce the connectivity of the node to be optimized to below the connectivity threshold by adding just one child node, but requires adding multiple child nodes.

Figure 10:
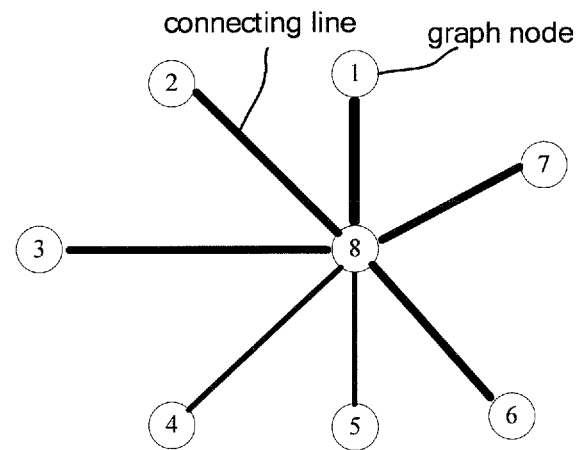
FIG. 10 illustrates a schematic diagram of a second quantum topology graph containing a node to be optimized with high connectivity provided by an embodiment of the present disclosure.

As shown in FIG. 10, it can be expected that it is impossible to guarantee that the connectivity of the generated child nodes is not greater than the connectivity threshold by adding one child node to form the optimized sub-graph, but requires adding one, two, three or more child nodes in order to form an optimized sub-graph, and in the process of addition, it is necessary to determine whether the connectivity of the child nodes in the optimized sub-graph formed after each addition of one child node is not greater than the connectivity threshold. The optimized sub-graph, finally obtained by incrementing one child node in sequence, that meets the connectivity threshold requirement may ensure that the quantity of child nodes N is both compliant and minimal. Wherein, for the second quantum topology graph or the third quantum topology graph, each additional child node increases the quantity of swap gates applied between the non-optimized nodes, and the more the child nodes are added, the more the quantity of swap gates is increased. By determining the quantity N of the child nodes in the optimized sub-graph in an incremental manner, it is possible to ensure that the quantity N of the child nodes is both compliant and minimal, and to avoid the prolongation of the running time of the quantum algorithm caused by the large quantity of increased swap gates.

Moreover, in another possible implementation, it provides another method of determining the quantity N of child nodes in the optimized sub-graph. The quantity N of the child nodes corresponding to the nodes to be optimized is calculated based on a predetermined formula. The formula is as follows.

$$X = \frac{d}{N} + k$$

Wherein X represents the connectivity threshold, which is a known parameter, d represents the connectivity of the node to be optimized, N is the quantity of child nodes, and k is a constant.

Figure 11:
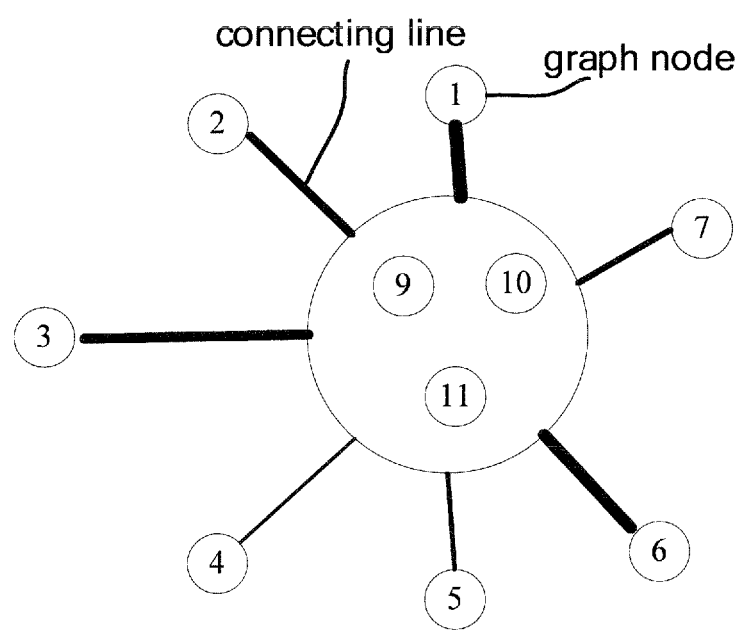
FIG. 11 illustrates a schematic diagram of an optimized sub-graph composed of a plurality of child nodes provided by an embodiment of the present disclosure.

Taking FIG. 10 as an example, the node to be optimized is graph node 8, and N=2.33 can be calculated by using the above formula with k as a constant 1. In the specific implementation, N is a positive integer and takes the value of 3, so that the quantity of child nodes corresponding to node 8 to be optimized is three. The resulting optimized sub-graph composed of three child nodes is shown in FIG. 11.

Based on the above example, after determining the quantity N of child nodes in the optimized sub-graph, it is necessary to further determine the connection relationship between the N child nodes, and the connectivity of the N child nodes will vary depending on the connection relationship.

Figure 12:
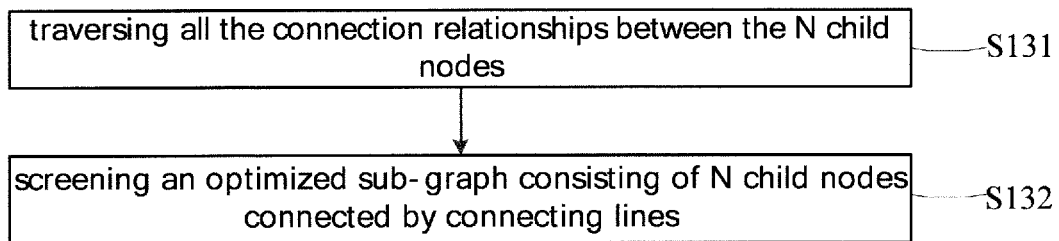
FIG. 12 illustrates a flow diagram of traversing connecting lines between N nodes in an optimized sub-graph provided by an embodiment of the present disclosure.

As shown in FIG. 12, a method for determining connection relationships between N child nodes connected by connecting lines is illustrated, including the steps of:

Sub-step S131, traversing all the connection relationships between the N child nodes.

Figure 13:
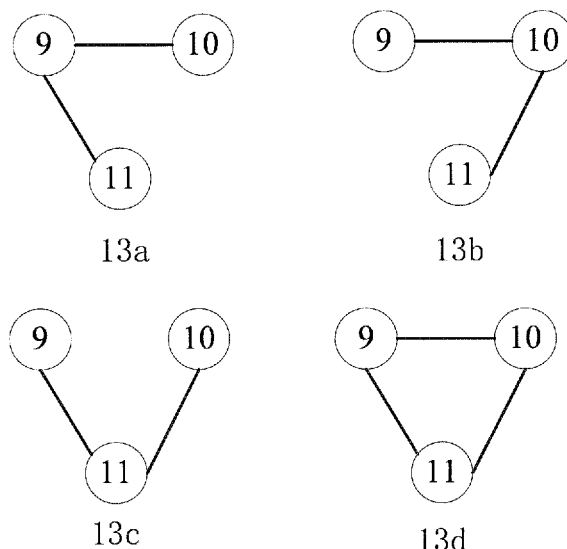
FIG. 13 illustrates a schematic diagram of an optimized sub-graph composed of a plurality of child nodes provided by an embodiment of the present disclosure.

As shown in FIG. 13, taking the optimized sub-graph in FIG. 11 as an example, the optimized sub-graph includes three child nodes, and the connection relationships between the corresponding three child nodes are shown in FIG. 13a, FIG. 13b, FIG. 13c, and FIG. 13d. For different connection relationships, after each child node in the optimized sub-graph is connected to the non-optimized node, the connectivity of each child node is different, and therefore after determining the quantity N of a specific child node, it is necessary to traverse the connection relationships of the N child nodes and enumerate all the connection relationships.

In sub-step S132, screening an optimized sub-graph consisting of N child nodes connected by connecting lines.

After determining the connection relationships between the N child nodes by traversal, it is necessary to select the connection method that satisfies the requirements, i.e., the connectivity of all child nodes is not greater than the connectivity threshold while avoiding the existence of crossed connecting lines in the optimized sub-graph.

Figure 14:
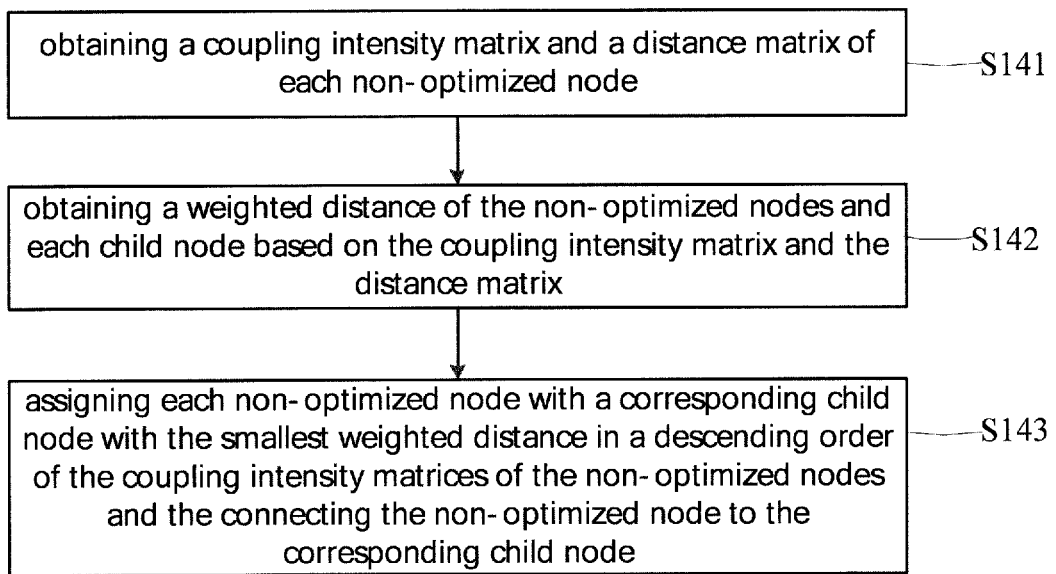
FIG. 14 illustrates a flow diagram of assigning connecting lines between a non-optimized node and individual child nodes to obtain a fourth quantum topology graph provided by an embodiment of the present disclosure.

As shown in FIG. 14, after determining the connection relationships of the N child nodes in the optimized sub-graph, the connection relationship between the N child nodes and the non-optimized node is not determined at this point, and it is necessary to distribute the connecting lines between the non-optimized node and each child node in the optimized sub-graph. The specific steps are as follows.

Sub-step S141, obtaining a coupling intensity matrix and a distance matrix of each non-optimized node; wherein the coupling intensity matrix characterizes a sum of a number of qubit logic gates applied between two non-optimized nodes in the first quantum topology graph and a quantity of swap gates added after the non-optimized nodes are connected to the child nodes, and may be used to characterize the value of the non-optimized node in the first quantum topology graph; the distance matrix characterizes distances between the non-optimized nodes and each child node.

For example, in one possible embodiment, in the first quantum topology graph, the non-optimized node is directly connected to the node to be optimized (i.e., the intermediate node), and when optimizing the non-optimized node to the optimized sub-graph containing the child nodes, which is equivalent to when the two non-optimized nodes originally connected to the same graph node (the node to be optimized) are connected to different child nodes in the optimized sub-graph, it is necessary to apply a swap gate. Thus, obtaining the coupling intensity matrix $I_{ml}$ of the two non-optimized nodes is necessary not only to obtain the quantity $W_{ml}$ of the qubit logic gates applied in the first quantum topology graph by the two non-optimized nodes, but also to obtain the quantity $S_{ml}$ of increased swap gates after the two non-optimized nodes are connected to the child nodes in the optimized sub-graph. The details are as follows:

$$Iml = \alpha Wml + (1-\alpha)Sm$$

Wherein, a is the combination weight and takes a constant value, e.g., 0.5.

Taking the second quantum topology graph shown in FIG. 11 as an example, in addition to calculating the coupling intensity matrix $I_{ml}$ of the non-optimized node, it is also necessary to calculate the distance matrix $D_{mi}$ of the non-optimized node. Specifically, the distance between non-optimized node 1 and child node 9, child node 10, and child node 11 is calculated respectively, and a distance matrix containing three distance values is generated. Wherein, m and l represent non-optimized nodes, which can be positive integers from 1 to 7; i represents the child node, which can be a positive integer from 9 to 11.

Sub-step S142, obtaining a weighted distance of the non-optimized nodes and each child node based on the coupling intensity matrix and the distance matrix.

For any non-optimized node, the corresponding coupling intensity matrix Tim and distance matrix $D_{mi}$ can be calculated, and the weighted distance $L = \Sigma_m^N D_{mi} I_{ml}$ between any non-optimized node and each child node can be obtained.

Taking FIG. 13 as an example, when it is necessary to calculate the weighted distance of non-optimized node 1, first calculating the coupling intensity matrices $I_{12}$, $I_{13}$, $I_{14}$, $I_{15}$, $I_{16}$, $I_{17}$ of the non-optimized node 1 with the non-optimized node 2, the non-optimized node 3, the non-optimized node 4, the non-optimized node 5, the non-optimized node 6, and the non-optimized node 7 respectively, and then calculating the distance matrices $D_{19}$, $D_{1\ 10}$, $D_{1\ 11}$ of the non-optimized node 1 with the child node 9, the child node 10, and the child node 11 respectively.

When it is necessary to calculate the weighted distance of non-optimized node 2, first calculating the coupling intensity matrices $I_{21}$, $I_{23}$, $I_{24}$, $I_{25}$, $I_{26}$, $I_{27}$ of the non-optimized node 2 with the non-optimized node 1, the non-optimized node 3, the non-optimized node 4, the non-optimized node 5, the non-optimized node 6, and the non-optimized node 7 respectively, and then calculating the distance matrices $D_{29}$, $D_{2\ 10}$, $D_{2\ 11}$ of the non-optimized node 2 with the child node 9, the child node 10, and the child node 11 respectively. The method for calculating the weighted distance L of other non-optimized nodes is the same and will not be repeated.

Sub-step S143, assigning each non-optimized node with a corresponding child node with the smallest weighted distance in a descending order of the coupling intensity matrices of the non-optimized nodes and the connecting the non-optimized node to the corresponding child node.

Taking the second quantum topology graph shown in FIG. 11 as an example, the connection relationship shown in FIG. 13a is used by traversing the connection relationships between the three selected child nodes. The coupling intensity matrices $I_{m1}$, $I_{m2}$, $I_{m3}$, $I_{m4}$, $I_{m5}$, $I_{m6}$, and $I_{m7}$ of the seven non-optimized nodes are obtained through the sub-step S141, and the descending order is obtained: $I_{m1}>I_{m6}>I_{m3}>I_{m2}>I_{m7}>I_{m5}>I_{m4}$.

According to the ordering of the coupling intensity matrices, the non-optimized node 1 is assigned first, and the weighted distance $L_{19}$, $L_{10}$, and $L_{111}$ of the non-optimized node 1 with the child node 9, the child node 10 and the child node 11 are calculated by the weighted distance formula to determine that the child node with the smallest weighted distance value is connected to the non-optimized node 1; similarly, calculating the weighted distances of other non-optimized nodes with the child node 9, the child node 10, and the child node 11 in a descending order of the coupling intensity matrices, and connecting it to the child node with the smallest weighted distance.

Figure 15:
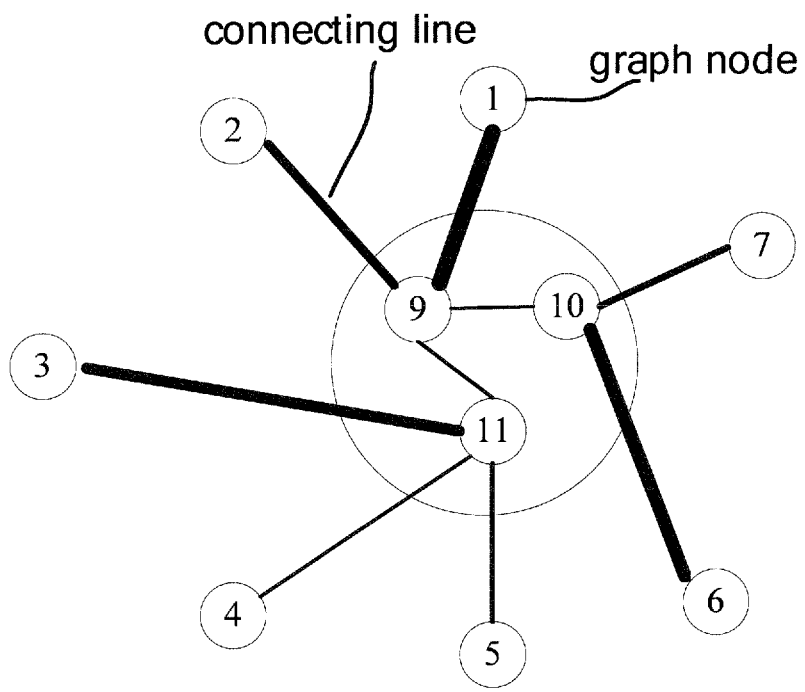
FIG. 15 illustrates an effect diagram of assigning connecting lines between a non-optimized node and individual child nodes to obtain a fourth quantum topology graph provided by an embodiment of the present disclosure.

It should be added that when one child node is connected to one non-optimized node, the current connectivity of the child node will increase by 1, and when the connectivity of the child node reaches the connectivity threshold, there is no need to calculate the weighted distance of other nodes to be optimized with the child node when calculating the weighted distance of other nodes to be optimized but only needs to calculate the weighted distance of other nodes to be optimized with other child nodes other than the child node, and then screen the minimum value. FIG. 15 shows the effect view of the assigned nodes to be optimized in the second quantum topology graph or the third quantum topology graph in FIG. 11.

Figure 16:
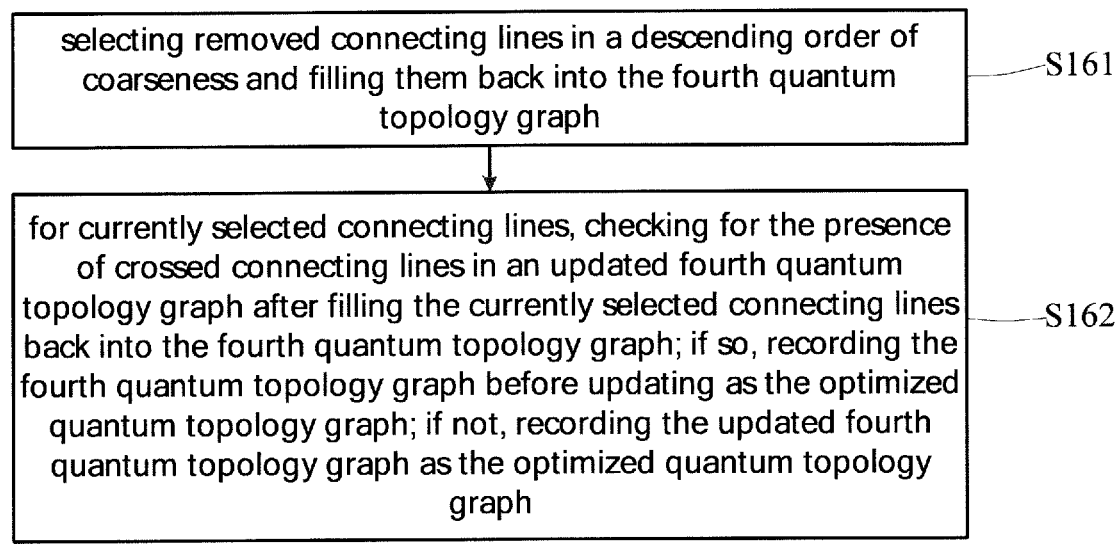
FIG. 16 illustrates a flow diagram of restoring the removed connecting line to obtain an optimized quantum topology graph provided by an embodiment of the present disclosure.

As shown in FIG. 16, in another possible example, the inventor have considered that there are no crossed connecting lines between some other graph nodes, and in order to keep as many connecting lines as possible to reduce subsequent swap gate operations, it is possible to selectively restore the connecting lines between non-optimized nodes. As described earlier, the node to be optimized corresponds to the intermediate node in the first quantum topology graph, while the non-optimized node corresponds to the connecting line between the graph nodes other than the intermediate node in the first quantum topology graph. The specific steps are as follows.

Sub-step S161, selecting removed connecting lines in a descending order of coarseness and filling them back into the fourth quantum topology graph.

As mentioned above, the coarseness represents the number of qubit logic gates applied between any two logic bits in the quantum algorithm, and the greater the coarseness, the more qubit logic gates are applied on the corresponding graph node, and the higher the value in the fourth quantum topology graph. Therefore, when restoring the removed connecting lines, it is necessary to select the removed connecting lines in a descending order of coarseness, and fill them back into the fourth quantum topology graph.

Sub-step S162, for currently selected connecting lines, checking for the presence of crossed connecting lines in an updated fourth quantum topology graph after filling the currently selected connecting lines back into the fourth quantum topology graph; if so, recording the fourth quantum topology graph before updating as the optimized quantum topology graph; if not, recording the updated fourth quantum topology graph as the optimized quantum topology graph.

Figure 17:
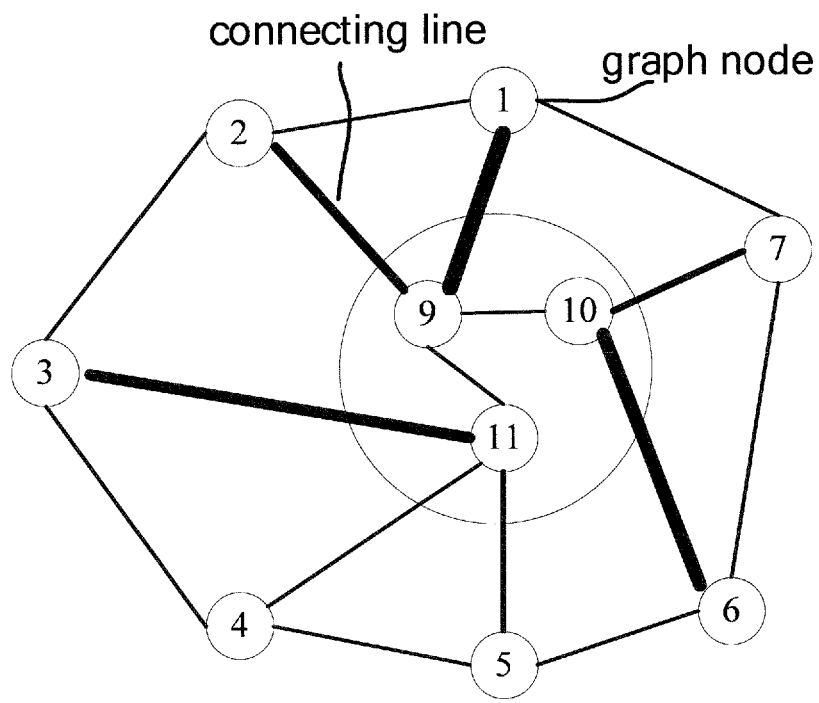
FIG. 17 illustrates a schematic diagram of an optimized quantum topology graph provided by an embodiment of the present disclosure.

As shown in FIG. 17, when restoring a removed connecting lines, it is necessary to check whether there are crossed connecting lines in the fourth quantum topology graph, and if there are crossed connecting lines in the fourth quantum topology graph after restoring the connecting line, then the connecting line needs to be abandoned and cannot be filled back into the fourth quantum topology graph.

Figure 18:
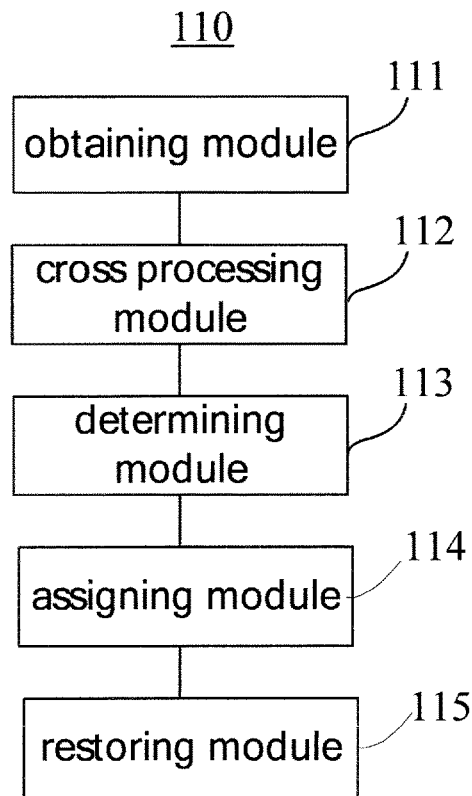
FIG. 18 illustrates a schematic diagram of functional modules of the quantum topology graph optimization apparatus provided by an embodiment of the present disclosure.

Based on the same inventive concept, see FIG. 18, it shows a schematic diagram of functional modules of the quantum topology graph optimization apparatus 110 provided by embodiments of the present disclosure. This embodiment may divide the functional modules of the quantum topology graph optimization apparatus 110 according to the method implementation performed by the computer terminal 100 described above. For example, it is possible to divide individual functional modules corresponding to individual functions, or it is possible to integrate two or more functions in a single processing module. The integrated module may be implemented either in the form of hardware or in the form of a software function module. It should be noted that the division of modules in the embodiments of the present disclosure is schematic and is only a logic functional division, and that another division may be used in practical implementation. For example, in the case of dividing individual functional modules corresponding to individual functions, the quantum topology graph optimization apparatus 110 shown in FIG. 18 is only a schematic diagram of an apparatus. Wherein, the quantum topology graph optimization apparatus 110 may include an obtaining module 111, a cross processing module 112, a determining module 113, an assigning module 114, and a restoring module 115. The functions of individual functional modules of the quantum topology graph optimization apparatus 110 are described in detail below.

The obtaining module 111 is configured to obtain a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits. It is to be understood that the obtaining module 111 may be used to perform the step S110 described above.

The cross processing module 112 is configured that when there are crossed connecting lines in the first quantum topology graph, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph. It is to be understood that the cross processing module 112 may be used to perform the above step S120, and the details of the implementation of the cross processing module 112 may be found above in relation to step S120.

The determining module 113 is configured that when there is a node to be optimized in the second quantum topology graph or the third quantum topology graph, determining an optimized sub-graph corresponding to one node to be optimized and composed of N child nodes connected by connecting lines according to a preset way, wherein the node to be optimized is a graph node in the first quantum topology graph with connectivity greater than a connectivity threshold of a quantum chip to be applied, and the connectivity of all the child nodes in the optimized sub-graph is no greater than the connectivity threshold. It is to be understood that the determining module 113 may be used to perform the above step S130, and the details of the implementation of the determining module 113 may be found above in relation to step S130.

The assigning module 114 is configured to assign connecting lines between non-optimized nodes and each child node so as to obtain a fourth quantum topology graph; wherein, the non-optimized node is the graph node other than the node to be optimized in the second quantum topology graph or third quantum topology graph. It is to be understood that the assigning module 114 may be used to perform the above step S140, and the details of the implementation of the assigning module 114 may be found above in relation to step S140.

The restoring module 115 is configured to restore connecting lines between non-optimized nodes in the fourth quantum topology graph so as to obtain an optimized quantum topology graph. It is to be understood that the restoring module 115 may be used to perform the above step S150, and the details of the implementation of the restoring module 114 may be found above in relation to step S150.

Figure 19:
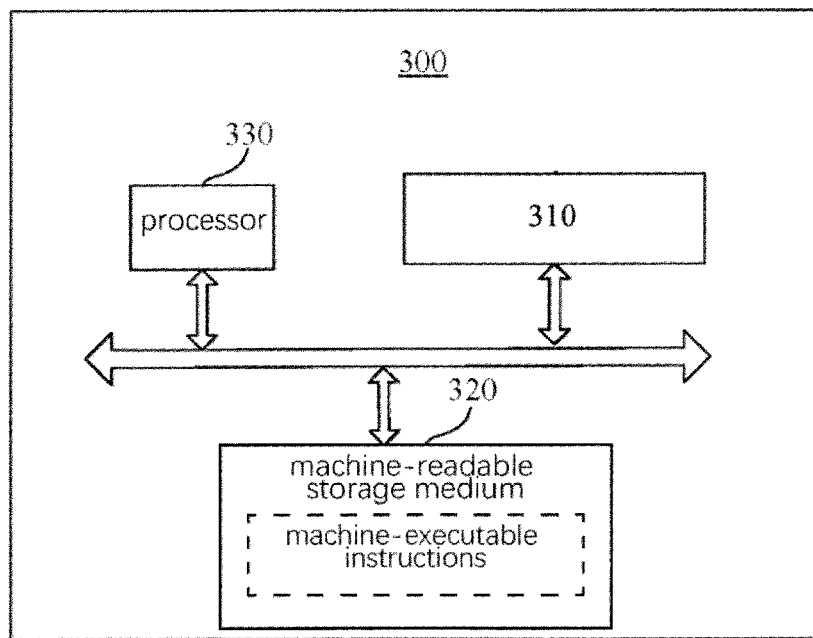
FIG. 19 illustrates a schematic block diagram of the assembly structure of the computer terminal for implementing the quantum topology graph optimization method provided by an embodiment of the present disclosure.

Based on the same inventive concept, see FIG. 19, it shows a schematic block diagram of the structure of the computer terminal 300 for executing the quantum topology graph optimization method provided by embodiments of the present disclosure. The computer terminal 300 may include a quantum topology graph optimization apparatus 310, a machine-readable storage medium 320 and a processor 330.

In the present embodiment, the machine-readable storage medium 320 and the processor 330 are located in the computer terminal 300 and are provided separately. However, it should be understood that the machine-readable storage medium 320 may also be independent of the computer terminal 300, and may be accessed by the processor 330 through a bus interface. Alternatively, the machine-readable storage medium 320 may also be integrated into the processor 330, for example, may be a cache and/or a general-purpose register.

The quantum topology graph optimization apparatus 310 may include software functional modules stored in the machine-readable storage medium 120 (such as the obtaining module 111, the cross processing module 112, the determining module 113, the assigning module 114 and the restoring module 115 as shown in FIG. 18), and when the processor 330 executes the software functional modules in the quantum topology graph optimization apparatus 310, it is possible to implement the quantum topology graph optimization method provided by the aforementioned method embodiment.

Since the computer terminal 300 provided by the embodiment of the present disclosure is another embodiment of the quantum topology graph optimization method embodiment executed by the computer terminal 300, and the computer terminal 300 may be used to execute the quantum topology graph optimization method provided by the above method embodiment, the technical effect it can obtain may refer to the above method embodiment, which will not be repeated herein.

Compared with the prior art, in the present application, obtaining a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits; when there are crossed connecting lines in the first quantum topology graph, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph; when there is a node to be optimized in the second quantum topology graph or the third quantum topology graph, determining an optimized sub-graph corresponding to one node to be optimized and composed of N child nodes connected by connecting lines according to a preset way, wherein the node to be optimized is a graph node in the first quantum topology graph with connectivity greater than a connectivity threshold of a quantum chip to be applied, and the connectivity of all the child nodes in the optimized sub-graph is no greater than the connectivity threshold; assigning connecting lines between non-optimized nodes and each child node so as to obtain a fourth quantum topology graph; wherein, the non-optimized nodes are graph nodes other than the node to be optimized; restoring connecting lines between non-optimized nodes in the fourth quantum topology graph so as to obtain an optimized quantum topology graph. The crossed connecting lines in the first quantum topology graph corresponds to the cross-coupling structure (capacitance, inductance, resonator, etc.) between multiple qubits of a quantum chip, which is impossible to be achieved in a quantum chip with a two-dimensional quantum chip. By optimizing to eliminate the crossed connecting lines, it is possible to implement an optimized quantum topology graph without the crossed connecting lines in a quantum chip in a two-dimensional structure; and in the implementation process, it is possible to reduce the quantity of applied swap gates, and then improve the execution effect of the quantum algorithm; by optimizing the node to be optimized that exceeds the connectivity threshold of the quantum chip to be applied, when the logic bits in the optimized quantum topology graph are mapped to the qubits of the quantum chip, it is possible to reduce the effect of neighboring qubits on the qubit to be regulated through the coupling structure and improve the fidelity of the quantum algorithm, such that a complex quantum algorithms can run on the quantum chip.

In addition, based on the above technical problems found by the inventors, a quantum topology graph optimization method is also provided, aiming at improving the crossed connecting lines and/or the node to be optimized that are in the quantum topology graph of a conventional quantum algorithm. When there are crossed connecting lines in the first quantum topology graph, determining an intermediate node in the first quantum topology graph, retaining connecting lines between the intermediate node and other graph nodes, obtaining a connecting line weight of each of connecting lines between other graph nodes and removing connecting lines according to the connecting line weight of each of connecting lines between other graph nodes so as to obtain a second quantum topology graph without the crossed connecting lines; if not, updating the first quantum topology graph to a third quantum topology graph; when there is a node to be optimized in the second quantum topology graph or the third quantum topology graph, determining an optimized sub-graph corresponding to one node to be optimized and composed of N child nodes connected by connecting lines according to a preset way, wherein the connectivity of all the child nodes in the optimized sub-graph is no greater than the connectivity threshold; assigning connecting lines between non-optimized nodes and each child node so as to generate an optimized quantum topology graph, wherein the non-optimized nodes are graph nodes other than the node to be optimized in the second quantum topology graph or the third quantum topology graph. Alternatively, a technical solution such as the following can be taken: when there are crossed connecting lines in a first quantum topology graph corresponding to a quantum algorithm, determining an intermediate node in the first quantum topology graph, retaining connecting lines between the intermediate node and other graph nodes so as to obtain a second quantum topology graph without the crossed connecting lines; if not, updating the first quantum topology graph to a third quantum topology graph; further, when it is determined that there is node to be optimized in the second quantum topology graph or the third quantum topology graph, determining an optimized sub-graph corresponding to one node to be optimized and composed of N child nodes connected through connecting lines according to a preset method; and assigning connecting lines between non-optimized nodes and the child nodes to obtain a fourth quantum topology graph; restoring connecting lines between the non-optimized nodes in the fourth quantum topology graph to obtain an optimized quantum topology graph. In this way, by optimizing to eliminate the crossed connecting lines, it is possible to effectively shorten the depth of the quantum algorithm, reduce the running time of the quantum algorithm, and reduce the quantity of swap gates applied during a implementation process when an optimized quantum topology graph without crossed connecting lines is implemented on the quantum chip in a two-dimensional structure; and by optimizing the nodes to be optimized that exceed the connectivity threshold of the quantum chip to be applied, it is possible to reduce the effect of neighboring qubits on the qubits to be regulated through the coupling structure and greatly improve the fidelity of the quantum algorithm when the logic bits in the optimized quantum topology graph are mapped to the qubits of the quantum chip.

Some exemplary implementations of crossed connecting lines processing method of the above-mentioned quantum connectivity graph are described in detail below in conjunction with the accompanying drawings of the specification.

Figure 20:
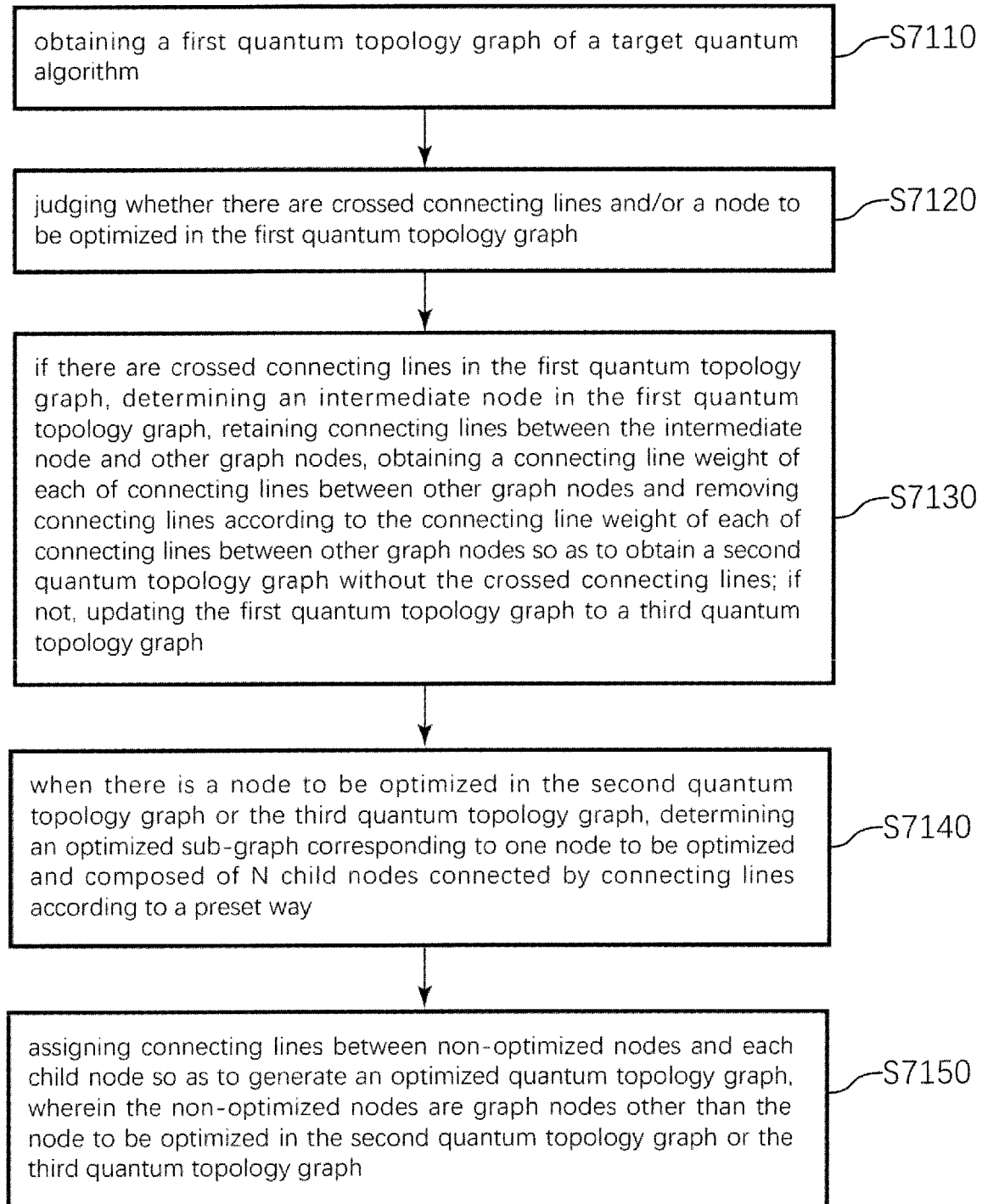
FIG. 20 illustrates a flow diagram of a quantum topology graph optimization method provided by an embodiment of the present disclosure.

Referring to FIG. 20, it shows a flow diagram of the quantum topology graph optimization method provided by an embodiment of the present disclosure, which includes:

Sub-step S7110, obtaining a first quantum topology graph of a target quantum algorithm.

In the present embodiment, the first quantum topology graph may include a plurality of graph nodes and connecting lines between two graph nodes, the graph nodes may be used to represent logic bits in the target quantum algorithm, and the connecting lines may be used to represent qubit logic gates between two logic bits.

Wherein, the quantum connectivity graph can be obtained based on the logic bits in the target quantum algorithm and the number of qubit logic gates applied on any two qubits. Wherein, the qubits may refer to a physical system that can be in a ground state an excited state |1> and a superposition state ($\alpha|0>+\beta|1>$) at the same time. Mathematically, the qubits can be represented by vectors of states on Hilbert space. Quantum circuits are implemented by manipulating several qubits at the same time.

A quantum circuit is a representation of a quantum program that can be consisted of a sequence of qubits initially located in the |0> state and a quantity of subsequent quantum logic gates, and terminated by a measurement operation (not necessarily every bit needs to be measured). Typically, each quantum program can eventually be decomposed into a quantum program consisting only of a sequence of elementary quantum logic gates. In addition, the qubit logic gates may refer to some reversible unitary transformations, and may be used to manipulate several qubits to make these qubits evolve towards a target state in order to evolve into a final state, that is, the result of quantum computation.

Sub-step S7120, judging whether there are crossed connecting lines and/or a node to be optimized in the first quantum topology graph.

For example, in some possible examples, it is possible to detect whether the first quantum topology graph is a plane graph, that is, to detect whether there is an intersection between the various connecting lines in the first quantum topology graph. That is, when there is an intersection between any two connecting lines, it can be determined that there are crossed connecting lines in the first quantum topology graph; when there are no intersections between all connecting lines, it can be determined that there are no crossed connecting lines in the quantum connectivity graph.

It is possible to detect whether there is a node in the first quantum topology graph whose connectivity is greater than the connectivity threshold of the quantum chip to be applied, i.e., detect the quantity of connecting lines connected to each graph node. It should be noted that the connectivity threshold of the quantum chip to be applied is determined based on the parameters of the fidelity of the quantum algorithm. For example, the fidelity of the quantum algorithm at this stage is required to be not less than 97%, and by calculating the effect factor of each neighboring qubit on the qubit to be regulated through the coupling structures, it is possible to determine the quantity of the neighboring qubits that can be connected on the qubit to be regulated, i.e., the connectivity threshold. In embodiments of the present disclosure, the connectivity threshold may be predetermined to be 4. When there is a graph node with connectivity greater than the connectivity threshold in the first quantum topology graph, the graph node is defined as the node to be optimized.

Sub-step S7130, if there are crossed connecting lines in the first quantum topology graph, determining an intermediate node in the first quantum topology graph, retaining connecting lines between the intermediate node and other graph nodes, obtaining a connecting line weight of each of connecting lines between other graph nodes and removing connecting lines according to the connecting line weight of each of connecting lines between other graph nodes so as to obtain a second quantum topology graph without the crossed connecting lines; if not, updating the first quantum topology graph to a third quantum topology graph.

When there are crossed connecting lines in the first quantum topology graph, determining the intermediate node in the first quantum topology graph, retaining the connecting lines between the intermediate node and other graph nodes, then calculating the connecting line weight of the connecting lines between other graph nodes, and removing the connecting line with low connecting line weight preferentially according to the connecting line weight, so as to obtain the second quantum topology graph without the crossed connecting lines. Wherein, the connecting line weight is the coarseness of the connecting line, and the coarseness represents the number of qubit logic gates applied between any two logic bits in the quantum algorithm. The greater the roughness, the greater the number of qubits logic gates applied to the corresponding graph node.

Alternatively, a technical solution such as the following can be taken: determining an intermediate node in the first quantum topology graph, retaining connecting lines between the intermediate node and other graph nodes so as to obtain a second quantum topology graph without the crossed connecting lines; if not, updating the first quantum topology graph to a third quantum topology graph.

When the first quantum topology graph is not a planar graph, it means that there are crossed connecting lines in the quantum connectivity graph, that is, it is necessary to achieve the cross-coupling in the corresponding quantum chip structure; however, the structure of the actual quantum chip is a two-dimensional lattice structure, and therefore cannot achieve a specific structure corresponding to the cross-coupling between qubits. The crossed connecting lines is not optimized in related technologies, that is, the two-dimensional lattice structure of the quantum chip is not changed in the subsequent process of running the quantum algorithm through the quantum chip, but the mapping relationship between the qubits is changed by applying the swap gate. In this way, when too many swap gates are applied, it is possible to increase the depth of the algorithm as well as the algorithm running time In the present embodiment, however, when there are crossed connecting lines in the first quantum topology graph, the second quantum topology without crossed connecting lines is obtained by determining the intermediate node in the first quantum topology graph and retaining the connecting lines between the intermediate node and other graph nodes.

For example, in some possible examples, in the process of determining the intermediate node in the first quantum topology graph, the intermediate node may represent the highest priority graph node in the first quantum topology graph, and thus the graph node with the highest priority in this first quantum topology graph can be selected as the intermediate node. This priority can be calculated in conjunction with the node value of the graph node in the first quantum topology graph.

For another example, in the process of retaining the connecting lines between the intermediate node and other graph nodes, it is possible to choose to remove the connecting lines between other graph nodes other than the intermediate point, specifically removing all connecting lines between other graph nodes, or only removing crossed connecting lines between other graph nodes.

Sub-step S7140, when there is a node to be optimized in the second quantum topology graph or the third quantum topology graph, determining an optimized sub-graph corresponding to one node to be optimized and composed of N child nodes connected by connecting lines according to a preset way, wherein the connectivity of all the child nodes in the optimized sub-graph is no greater than the connectivity threshold.

After determining the node to be optimized for optimization by detecting the quantity of connecting lines of each graph node in the second quantum topology graph or the third quantum topology graph, it is possible to process the nodes to be optimized; specifically, for one node to be optimized, the node to be optimized is converted into an optimized sub-graph composed of multiple child nodes connected by connecting lines, the child node acts equivalent to the graph node in the second quantum topology graph or the third quantum topology graph, represents a logic bit and connected by a connecting line. The optimized sub-graph is used to connect the connecting line originally connected to the node to be optimized.

It is conceivable that for the node to be optimized, the quantity of connecting lines exceeds the connectivity threshold of the quantum chip, so after assigning the connecting lines of the node to be optimized to each child node of the optimized sub-graph, the quantity of connecting lines of each child node is significantly reduced compared to the quantity of connecting lines of the node to be optimized. Therefore, it is possible to determine the appropriate quantity N of child nodes, to form the optimized sub-graph consisting of the N child nodes, to allow each child node in the optimized sub-graph to connect to other graph nodes instead of the node to be optimized, and to make the connectivity of all child nodes in the optimized sub-graph no greater than the connectivity threshold. In this way, it is possible to effectively reduce the connectivity of the nodes to be optimized in the second quantum topology graph or the third quantum topology graph, so that the corresponding optimized topology graph can be implemented on the quantum chip.

Sub-step S7150, assigning connecting lines between non-optimized nodes and each child node so as to generate an optimized quantum topology graph, wherein the non-optimized nodes are graph nodes other than the node to be optimized in the second quantum topology graph or the third quantum topology graph.

After determining the nodes to be optimized by detecting the quantity of connecting lines connected by each graph node in the second quantum topology graph or the third quantum topology graph, the graph nodes other than the nodes to be optimized are defined as non-optimized nodes, that is, nodes that do not need to be optimized.

After determining the optimized sub-graph corresponding to the node to be optimized and composed of N child nodes connected by the connecting line by a preset way, the optimized node needs to be replaced with the optimized sub-graph, and those connecting lines that originally connected to the node to be optimized need to be connected to the child node of the optimized sub-graph one by one, which enables the quantum algorithm to efficiently implement the interaction between two logic bits, i.e., to apply the quantum logic gate. Therefore, by preferentially determining the weight of the connecting lines between other graph nodes, it is possible to determine the removing priority between the connecting lines, reduce the assigning time of the connecting lines, and improve the optimization efficiency.

Further, the connecting lines in the first quantum topology graph has a coarseness that represents a number of qubit logic gates applied between any two logic bits in the quantum algorithm, and the step of obtaining a connecting line weight of each of connecting lines between other graph nodes and removing connecting lines according to the connecting line weight of each of connecting lines between other graph nodes so as to obtain a second quantum topology graph without the crossed connecting lines, further includes:
  obtaining a connecting line coarseness of each of connecting lines between other graph nodes in the first quantum topology graph as the connecting line weight and determining a priority of each of connecting lines between other graph nodes;
  determining connecting lines to be removed among the crossed connecting lines in the first quantum topology graph according to the priority of each of connecting lines between other graph nodes, and removing the connecting lines to be removed so as to obtain the second quantum topology graph without the crossed connecting lines.

Further, the step of determining connecting lines to be removed among the crossed connecting lines in the first quantum topology graph according to the priority of each of connecting lines between other graph nodes specifically includes:

when the connecting lines between other graph nodes have the same priority between the crossed connecting lines in the first quantum topology graph, determining relevant nodes corresponding to the connecting lines between the other graph nodes having the same priority;

obtaining connectivity corresponding to the relevant nodes and treating the connecting lines of a node corresponding to the related node with a higher connectivity as the connecting lines to be removed.

As described above, the coarseness represents the number of qubit logic gates applied between any two logic bits in the quantum algorithm. The greater the coarseness, the greater the connecting line weight, and then the higher the corresponding priority. When determining the crossed connecting lines of the first quantum topology graph, the connecting line with low priority is obtained and removed preferentially. That is, the connecting line with a low coarseness and a low connecting line weight is removed preferentially. In the present embodiment, the connecting lines between other graph nodes are removed preferentially, and the connecting lines between the intermediate node and other graph nodes are retained preferentially.

Further, the step of determining connecting lines to be removed among the crossed connecting lines in the first quantum topology graph according to the priority of each of connecting lines between other graph nodes specifically includes:

when the connecting lines between other graph nodes have the same priority between the crossed connecting lines in the first quantum topology graph, determining relevant nodes corresponding to the connecting lines between the other graph nodes having the same priority;

obtaining connectivity corresponding to the relevant nodes and treating the connecting lines of a node corresponding to the related node with a higher connectivity as the connecting lines to be removed.

When there are multiple connecting lines with the same weight priority, in order to further avoid that the node needs to be optimized due to high connectivity, the connecting lines corresponding to other graph nodes with high connectivity are removed preferentially.

Corresponding to the above solution: determining an intermediate node in the first quantum topology graph and retaining connecting lines between the intermediate node and other graph nodes so as to obtain a second quantum topology graph without crossed connecting lines; and if not, updating the first quantum topology graph to a third quantum topology graph. The step can also adopt the following solution: assigning the connecting lines between the non-optimized nodes and each child node so as to obtain a fourth quantum topology graph; wherein the non-optimized nodes are graph nodes other than the node to be optimized in the second quantum topology graph or the third quantum topology graph.

That is, the present solution generates a fourth quantum topology graph so as to restore the connecting lines after removing the connecting lines between the nodes.

That is, after the step of assigning connecting lines between non-optimized nodes and each child node so as to obtain a fourth quantum topology graph, further including: restoring connecting lines between non-optimized nodes in the fourth quantum topology graph so as to obtain an optimized quantum topology graph.

When optimizing the crossed connecting lines in the first quantum topology graph, removing the connecting lines between other graph nodes other than the intermediate node, that is, the path for directly applying quantum logic gates between other graph nodes to execute quantum algorithm is broken; at this time, when it is necessary to apply quantum logic gates between other graph nodes to execute quantum algorithm, it is necessary to apply swap gates through the intermediate node before the quantum logic gates can be applied for operation.

Therefore, after optimizing the nodes to be optimized and assigning the connection relationship between the non-optimized nodes and child nodes to obtain the fourth quantum topology graph, it is possible to restore the connecting lines between the non-optimized nodes in the fourth quantum topology graph. In this way, it is possible to apply qubit logic gates operation directly between the two graph nodes whose connecting lines should be restored, avoid defects of increasing the depth of the quantum algorithm and prolonging the time of the quantum operation caused by applying the swap gate, and improve the fidelity of the quantum algorithm. It should be added that the non-optimized nodes in the fourth quantum topology graph correspond to the other graph nodes other than the intermediate node in the first quantum topology graph; moreover, when restoring the connecting lines between the non-optimized nodes in the fourth quantum topology graph, a rule that the crossed connecting lines cannot appear needs to be followed, that is, there are no crossed connecting lines in the optimized quantum topology graph.

In this way, by optimizing to eliminate the crossed connecting lines, it is possible that the optimized quantum topology graph without the crossed connecting lines may be implemented on a quantum chip in a two-dimensional structure; and by optimizing the nodes in the quantum topology graph with a node connectivity greater than the connectivity threshold of the quantum chip, it is possible that one qubit performs the two-qubit logic gate with as few neighboring qubits as possible, which reduces the effect of the two-qubit logic gate applied on the multiple qubits on the qubit and improves the precision of regulation on the qubits, so that the effect of the two-qubit logic gate applied on a single qubit in the quantum algorithm can operate precisely on the quantum chip, thus implementing a complex quantum algorithm on the quantum chip.

In a possible implementation, in the process of obtaining the first quantum topology graph of the target quantum algorithm, it is possible to obtain the logic bits in the quantum algorithm and the number of qubit logic gates applied on any two logic bits; then, the adjacency matrix may be obtained based on the number of qubit logic gates applied on any two qubits, such as the adjacency matrix shown in FIG. 5, where the values 0, 1 . . . 6 on the horizontal and vertical axes represent the logic bits in the target quantum algorithm, and the values at the intersection of the horizontal and vertical axes represent the quantity of the quantum logic gates applied to the corresponding two logic bits; in turn, the adjacency matrix is converted into the first quantum topology graph, wherein the first quantum topology graph corresponding to the adjacency matrix of FIG. 5 is shown in FIG. 1.

In one possible implementation, however, the multiple qubit logic gates are applied between two logic bits, and the number of the qubit logic gates applied between the two logic bits is counted only once when counting the quantity to obtain the adjacency matrix. Since a first qubit logic gate can be applied between the two qubits, the subsequent successive qubit logic gates can be applied directly without any swap gate operation.

Continuing back to the first quantum topology graph shown in FIG. 1, it may be found that the connecting line has a coarseness that represents the number of the qubit logic gates applied between any two logic bits in the quantum algorithm, i.e., corresponding to the values in the adjacency matrix in FIG. 5.

In one possible implementation, the inventors found in the course of their research that since each graph node in the first quantum topology graph has a different value, it is necessary to avoid changing the graph node with a high value in the first quantum topology graph as much as possible in the process of optimizing the crossed connecting lines; otherwise, too many swap operations may be introduced. Based on this, for the step S7130, it can be implemented by the following exemplary sub-steps, which are described in detail as follows.

obtaining connectivity, weight and/or dispersion of all graph nodes in the first quantum topology graph; determining the intermediate node based on the connectivity, weight and/or dispersion.

In the first quantum topology graph, the connectivity is a quantity of connecting lines connected by each graph node, the weight is a sum of the coarseness of all connecting lines connected by each graph node, and the dispersion is a variance of the coarseness of all connecting lines connected by each graph node. After obtaining the connectivity, the weight, and/or the dispersion of all graph nodes in the first quantum topology graph, the intermediate node can be determined based on the connectivity, the weight, and/or the dispersion. The exemplary steps are as follows.

Selecting a graph node with the maximum connectivity as the intermediate node.

As shown in FIG. 1 or FIG. 2, the connectivity is used to measure the interaction between two graph nodes, and therefore, the greater the connectivity of the graph node, the higher the value of the graph node in the quantum algorithm, and when optimizing the crossed line in the first quantum topology graph, it is necessary to select the node as the intermediate node and retain the intermediate node.

Selecting a graph node with the largest weight as the intermediate node when several graph nodes have the same connectivity.

The inventors found in the course of their research that in some specific cases, it may happen that the connectivity of multiple graph nodes in the first quantum topology graph are all the same, for example, when the connectivity of all six logic bits in FIG. 1 are 5, it is necessary to use the weight parameter of the graph node, i.e., the sum of the number of the qubit logic gates applied between the graph node with the maximum connectivity and the neighboring graph nodes.

Selecting a graph node with the largest dispersion as the intermediate node when several graph nodes have the same connectivity and weight.

The inventors also found in the course of their research that in another specific case, it may happen that the multiple graph nodes have the same connectivity, and based on this, it is further necessary to determine the intermediate node in conjunction with the dispersion of the graph nodes.

Taking the first quantum topology graph represented by FIG. 1 as an example, when the intermediate node in the first quantum topology graph is determined to be the graph node 6 by the above exemplary steps, it is possible to optimize the crossed connecting lines in the first quantum topology graph based on the intermediate node.

Retaining the connecting lines between the intermediate node and other graph nodes, and removing the connecting lines between other graph nodes other than the intermediate node so as to obtain a second quantum topology graph without the crossed connecting lines.

As shown in FIG. 8, when the graph node 6 in FIG. 1 is determined to be the intermediate node by the above exemplary steps, it is possible to retain the connecting lines between the graph node 6 and the graph node 1, graph node 2, graph node 3, graph node 4, graph node 5, and remove the connecting lines between the graph node 1, graph node 2, graph node 3, graph node 4, and graph node 5 other than the above connecting line so as to obtain the second quantum topology graph without the crossed connecting lines, i.e., the second quantum topology graph shown in FIG. 8.

In another possible example, the inventor have considered that there are no crossed connecting lines between some other graph nodes, and in order to keep as many connecting lines as possible to reduce subsequent swap gate operations, it is possible to selectively restore the connecting lines between non-optimized nodes. The specific steps are as follows.

Selecting removed connecting lines in a descending order of coarseness and filling them back into the fourth quantum topology graph.

As mentioned above, the coarseness represents the number of qubit logic gates applied between any two logic bits in the quantum algorithm, and the greater the coarseness, the more qubit logic gates are applied on the corresponding graph node, and the higher the value in the fourth quantum topology graph. Therefore, when restoring the removed connecting lines, it is necessary to select the removed connecting lines in a descending order of coarseness, and fill them back into the fourth quantum topology graph.

For currently selected connecting lines, checking for the presence of crossed connecting lines in an updated fourth quantum topology graph after filling the currently selected connecting lines back into the fourth quantum topology graph; if so, recording the fourth quantum topology graph before updating as the optimized quantum topology graph; if not, recording the updated fourth quantum topology graph as the optimized quantum topology graph.

Figure 21:
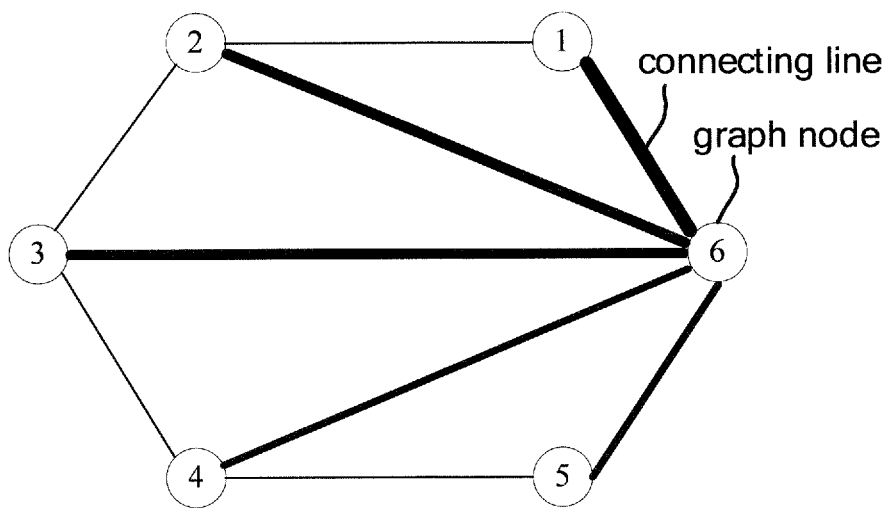
FIG. 21 illustrates a flow diagram of restoring the removed connecting line to obtain an optimized quantum topology graph provided by an embodiment of the present disclosure.

As shown in FIG. 21, when restoring removed connecting lines, it is necessary to check whether there are crossed connecting lines in the fourth quantum topology graph, and if there are crossed connecting lines in the fourth quantum topology graph after restoring the connecting line, then the connecting line needs to be abandoned and cannot be filled back into the fourth quantum topology graph.

The second quantum topology graph shown in FIG. 8 is obtained by optimizing the crossed connecting lines present in the first quantum topology graph, and it may be found that the connectivity of the graph node 6 in FIG. 8 is 5, which exceeds the predefined connectivity threshold of the quantum chip (i.e., the value 4 as described earlier), so it needs to be optimized for such graph nodes that exceed the connectivity threshold.

Continuing as shown in FIG. 8, in one possible implementation, for the second quantum topology graph, only the connecting lines between the intermediate node and the other graph nodes are retained, i.e., the connectivity of all other graph nodes is 1. The graph node with the highest connectivity is selected as the intermediate node when determining the intermediate node, so it is preferred to determine whether the intermediate node is the node to be optimized when determining the node to be optimized.

In one possible implementation, the inventors found that the optimized sub-graph consisting of N child nodes can replace the nodes to be optimized in the second quantum topology graph or the third quantum topology graph to connect to other graph nodes, which effectively reduces the connectivity of the nodes to be optimized in the second quantum topology graph or the third quantum topology graph.

In one possible implementation, incrementing a child node in sequence until the connectivity of N child nodes in the generated optimized sub-graph is not greater than the connectivity threshold, and the optimized sub-graph is connected to the non-optimized node through the connecting line, wherein N is a positive integer greater than 1.

Taking FIG. 8 as an example, the graph node 6 has connectivity greater than the connectivity threshold and is determined as the node to be optimized, and the remaining graph node 1, graph node 2, graph node 3, graph node 4, and graph node 5 are all non-optimized nodes. In the specific implementation, one child node is incremented at a time, i.e., the optimized sub-graph of two child nodes connected by the connecting line is generated for one node to be optimized, as shown in FIG. 9.

In FIG. 9, the optimized sub-graph is composed of a child node 7 and a child node 8, and at this time, the connecting lines of other graph node 1, graph node 2, graph node 3, graph node 4, and graph node 5 with the nodes to be optimized are connected to the optimized sub graph, that is, to child node 7 and child node 8 in the optimized sub-graph. The connecting lines of the child node 7 and the child node 8 with the graph node 1, graph node 2, graph node 3, graph node 4, and graph node 5 are assigned according to 2 and 3 or 3 and 2, which may ensure that the connectivity of the child node is not greater than the connectivity threshold.

FIG. 9, as a possible embodiment, shows schematically a second quantum topology graph or a third quantum topology graph consisting of 6 logic bits only. In another possible example, the quantity of logic bits is higher, the connectivity of the node to be optimized is higher, and in the case where the connectivity is much greater than the connectivity threshold, it is impossible to reduce the connectivity of the node to be optimized to below the connectivity threshold by adding just one child node, but requires adding multiple child nodes.

As shown in FIG. 10, it can be expected that it is impossible to guarantee that the connectivity of the generated child nodes is not greater than the connectivity threshold by adding one child node to form the optimized sub-graph, but requires adding one, two, three or more child nodes in order to form an optimized sub-graph, and in the process of addition, it is necessary to determine whether the connectivity of the child nodes in the optimized sub-graph formed after each addition of one child node is not greater than the connectivity threshold. The optimized sub-graph, finally obtained by incrementing one child node in sequence, that meets the connectivity threshold requirement may ensure that the quantity of child nodes N is both compliant and minimal. Wherein, for the second quantum topology graph or the third quantum topology graph, each additional child node increases the quantity of swap gates applied between the non-optimized nodes, and the more the child nodes are added, the more the quantity of swap gates is increased. By determining the quantity N of the child nodes in the optimized sub-graph in an incremental manner, it is possible to ensure that the quantity N of the child nodes is both compliant and minimal, and to avoid the prolongation of the running time of the quantum algorithm caused by the large quantity of increased swap gates.

Moreover, in another possible implementation, it provides another method of determining the quantity N of child nodes in the optimized sub-graph. The quantity N of the child nodes corresponding to the nodes to be optimized is calculated based on a predetermined formula. The formula is as follows.

$$X = \frac{d}{N} + k,$$

wherein X represents the connectivity threshold, which is a known parameter, d represents the connectivity of the node to be optimized, N is the quantity of child nodes, and k is a constant.

Taking FIG. 10 as an example, the node to be optimized is graph node 8, and N=2.33 can be calculated by using the above formula with k as a constant 1. In the specific implementation, N is a positive integer and takes the value of 3, so that the quantity of child nodes corresponding to node 8 to be optimized is three. The resulting optimized sub-graph composed of three child nodes is shown in FIG. 11.

Based on the above example, after determining the quantity N of child nodes in the optimized sub-graph, it is necessary to further determine the connection relationship between the N child nodes, and the connectivity of the N child nodes will vary depending on the connection relationship.

Specifically, a method for determining connection relationships between N child nodes connected by connecting lines, including the steps of:

Traversing all the connection relationships between the N child nodes.

As shown in FIG. 13, taking the optimized sub-graph in FIG. 11 as an example, the optimized sub-graph includes three child nodes, and the connection relationships between the corresponding three child nodes are shown in FIG. 13a, FIG. 13b, FIG. 13c, and FIG. 13d. For different connection relationships, after each child node in the optimized sub-graph is connected to the non-optimized node, the connectivity of each child node is different, and therefore after determining the quantity N of a specific child node, it is necessary to traverse the connection relationships of the N child nodes and enumerate all the connection relationships.

Screening an optimized sub-graph consisting of N child nodes connected by connecting lines.

After determining the connection relationships between the N child nodes by traversal, it is necessary to select the connection method that satisfies the requirements, i.e., the connectivity of all child nodes is not greater than the connectivity threshold while avoiding the existence of crossed connecting lines in the optimized sub-graph.

After determining the connection relationships of the N child nodes in the optimized sub-graph, the connection relationship between the N child nodes and the non-optimized node is not determined at this point, and it is necessary to distribute the connecting lines between the non-optimized node and each child node in the optimized sub-graph. The specific steps are as follows.

obtaining a coupling intensity matrix and a distance matrix of each non-optimized node; wherein the coupling intensity matrix characterizes a sum of a number of qubit logic gates applied between any two non-optimized nodes in the first quantum topology graph and a quantity of swap gates added after the non-optimized nodes are connected to the child nodes, and may be used to characterize the value of the non-optimized node in the first quantum topology graph; the distance matrix characterizes distances between the non-optimized nodes and each child node.

For example, in one possible embodiment, in the first quantum topology graph, the non-optimized node is directly connected to the node to be optimized (i.e., the intermediate node), and when optimizing the non-optimized node to the optimized sub-graph containing the child nodes, which is equivalent to when the two non-optimized nodes originally connected to the same graph node (the node to be optimized) are connected to different child nodes in the optimized sub-graph, it is necessary to apply a swap gate. Thus, obtaining the coupling intensity matrix $I_{ml}$ of the two non-optimized nodes is necessary not only to obtain the quantity $W_{ml}$ of the qubit logic gates applied in the first quantum topology graph by the two non-optimized nodes, but also to obtain the quantity $S_{ml}$ of increased swap gates after the two non-optimized nodes are connected to the child nodes in the optimized sub-graph. The details are as follows:

$$Iml = \alpha Wm1 + (1-\alpha)Sm$$

Wherein, a is the combination weight and takes a constant value, e.g., 0.5.

Taking the second quantum topology graph shown in FIG. 11 as an example, in addition to calculating the coupling intensity matrix $I_{ml}$ of the non-optimized node, it is also necessary to calculate the distance matrix $D_{mi}$ of the non-optimized node. Specifically, the distance between non-optimized node 1 and child node 9, child node 10, and child node 11 is calculated respectively, and a distance matrix containing three distance values is generated. Wherein, m and l represent non-optimized nodes, which can be positive integers from 1 to 7; i represents the child node, which can be a positive integer from 9 to 11.

obtaining a weighted distance of the non-optimized nodes and each child node based on the coupling intensity matrix and the distance matrix.

For any non-optimized node, the corresponding coupling intensity matrix $I_{ml}$ and distance matrix $D_{mi}$ can be calculated, and the weighted distance between any non-optimized node and each child node can be obtained.

Taking FIG. 11 as an example, when it is necessary to calculate the weighted distance of non-optimized node 1, first calculating the coupling intensity matrices $I_{12}$, $I_{13}$, $I_{14}$, $I_{15}$, $I_{16}$, $I_{17}$ of the non-optimized node 1 with the non-optimized node 2, the non-optimized node 3, the non-optimized node 4, the non-optimized node 5, the non-optimized node 6, and the non-optimized node 7 respectively, and then calculating the distance matrices $D_{19}$, $D_{1\ 10}$, $D_{1\ 11}$ of the non-optimized node 1 with the child node 9, the child node 10, and the child node 11 respectively.

When it is necessary to calculate the weighted distance of non-optimized node 2, first calculating the coupling intensity matrices $I_{21}$, $I_{23}$, $I_{24}$, $I_{25}$, $I_{26}$, $I_{27}$ of the non-optimized node 2 with the non-optimized node 1, the non-optimized node 3, the non-optimized node 4, the non-optimized node 5, the non-optimized node 6, and the non-optimized node 7 respectively, and then calculating the distance matrices $D_{29}$, $D_{2\ 10}$, $D_{2\ 11}$ of the non-optimized node 2 with the child node 9, the child node 10, and the child node 11 respectively. The method for calculating the weighted distance L of other non-optimized nodes is the same and will not be repeated.

Assigning each non-optimized node with a corresponding child node with the smallest weighted distance in a descending order of the coupling intensity matrices of the non-optimized nodes and the connecting the non-optimized node to the corresponding child node.

Taking the second quantum topology graph shown in FIG. 11 as an example, the connection relationship shown in FIG. 13a is used by traversing the connection relationships between the three selected child nodes. The coupling intensity matrices $I_{m1}$, $I_{m2}$, $I_{m3}$, $I_{m4}$, $I_{m5}$, $I_{m6}$, and $I_{m7}$ of the seven non-optimized nodes are obtained, and the descending order is obtained: $I_{m1} > I_{m6} > I_{m3} > I_{m2} > I_{m7} > I_{m5} > I_{m4}$.

According to the ordering of the coupling intensity matrices, the non-optimized node 1 is assigned first, and the weighted distance $L_{19}$, $L_{10}$, and $L_{111}$ of the non-optimized node 1 with the child node 9, the child node 10 and the child node 11 are calculated by the weighted distance formula to determine that the child node with the smallest weighted distance value is connected to the non-optimized node 1; similarly, calculating the weighted distances of other non-optimized nodes with the child node 9, the child node 10, and the child node 11 in a descending order of the coupling intensity matrices, and connecting it to the child node with the smallest weighted distance.

It should be added that when one child node is connected to one non-optimized node, the current connectivity of the child node will increase by 1, and when the connectivity of the child node reaches the connectivity threshold, there is no need to calculate the weighted distance of other nodes to be optimized with the child node when calculating the weighted distance of other nodes to be optimized but only needs to calculate the weighted distance of other nodes to be optimized with other child nodes other than the child node, and then screen the minimum value. FIG. 15 shows the effect view of the assigned nodes to be optimized in the second quantum topology graph or the third quantum topology graph in FIG. 11.

Based on the same inventive concept, a quantum topology graph optimization apparatus is provided by embodiments of the present disclosure. This embodiment may divide the functional modules of the quantum topology graph optimization apparatus according to the method implementation performed by the computer terminal described above. For example, it is possible to divide individual functional modules corresponding to individual functions, or it is possible to integrate two or more functions in a single processing module. The integrated module may be implemented either in the form of hardware or in the faun of a software function module. It should be noted that the division of modules in the embodiments of the present disclosure is schematic and is only a logical functional division, and that another division may be used in practical implementation. For example, in the case of dividing individual functional modules corresponding to individual functions, the quantum topology graph optimization apparatus shown in the present disclosure is only a schematic diagram of an apparatus. Wherein, the quantum topology graph optimization apparatus may include an obtaining module, a judging module, a cross processing module, a determining module, an assigning module, and a restoring module. The functions of individual functional modules of the quantum topology graph optimization apparatus are described in detail below.

An obtaining module is configured to obtain a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits. It can be understood that, the obtaining module may be used to execute the step S7110 above.

A judging module is configured to judge whether there are crossed connecting lines and/or a node to be optimized in the first quantum topology graph, wherein the node to be optimized is a graph node in the first quantum topology graph with connectivity greater than a connectivity threshold of a quantum chip to be applied. It can be understood that, the judging module may be used to execute the step S7120 above, and the details of the implementation of the judging module may be referred to above in relation to the step S7120.

A cross processing module is configured that if there are crossed connecting lines in the first quantum topology graph, determining an intermediate node in the first quantum topology graph, retaining connecting lines between the intermediate node and other graph nodes, obtaining a connecting line weight of each of connecting lines between other graph nodes and removing connecting lines according to the connecting line weight of each of connecting lines between other graph nodes so as to obtain a second quantum topology graph without the crossed connecting lines; if not, updating the first quantum topology graph to a third quantum topology graph. It can be understood that, the cross processing module may be used to execute the step S7130 above, and the details of the implementation of the cross processing module may be referred to above in relation to the step S7130.

A determining module is configured that when there is a node to be optimized in the second quantum topology graph or the third quantum topology graph, determining an optimized sub-graph corresponding to one node to be optimized and composed of N child nodes connected by connecting lines according to a preset way, wherein the connectivity of all the child nodes in the optimized sub-graph is no greater than the connectivity threshold. It can be understood that, the determining module may be used to execute the step S7140 above, and the details of the implementation of the determining module may be referred to above in relation to the step S7140.

A generating module is configured to assign connecting lines between non-optimized nodes and each child node so as to generate an optimized quantum topology graph, wherein the non-optimized nodes are graph nodes other than the node to be optimized in the second quantum topology graph or the third quantum topology graph. It can be understood that, the assigning module may be used to execute the step S7150 above, and the details of the implementation of the assigning module may be referred to above in relation to the step S7150.

Based on the same inventive concept, a computer terminal for executing the quantum topology graph optimization method is provided by embodiments of the present disclosure. As shown in FIG. 19, The computer terminal may include a quantum topology graph optimization apparatus 310, a machine-readable storage medium 320 and a processor 330.

In the present embodiment, the machine-readable storage medium 320 and the processor 330 are located in the computer terminal and are provided separately. However, it should be understood that the machine-readable storage medium may also be independent of the computer terminal and may be accessed by the processor through a bus interface. Alternatively, the machine-readable storage medium may also be integrated into the processor, for example, may be a cache and/or a general-purpose register.

The quantum topology graph optimization apparatus 310 may include software functional modules stored in the machine-readable storage medium 120 (such as the obtaining module, the judging module, the cross processing module, the determining module, the restoring module), and when the processor executes the software functional modules in the quantum topology graph optimization apparatus, it is possible to implement the quantum topology graph optimization method provided by the aforementioned method embodiment.

Since the computer terminal provided by the embodiment of the present disclosure is another embodiment of the quantum topology graph optimization method embodiment executed by the computer terminal, and the computer terminal may be used to execute the quantum topology graph optimization method provided by the above method embodiment, the technical effect it can obtain may refer to the above method embodiment, which will not be repeated herein.

Compared with the prior art, in the present application, obtaining a first quantum topology graph of a target quantum algorithm, the first quantum topology graph includes a plurality of graph nodes and connecting lines between two graph nodes, wherein the graph nodes are used to represent logic bits in the target quantum algorithm, and the connecting lines are used to represent qubit logic gates between two logic bits; judging whether there are crossed connecting lines and/or a node to be optimized in the first quantum topology graph, wherein the node to be optimized is a graph node in the first quantum topology graph with a connectivity greater than a connectivity threshold of a quantum chip to be applied; if there are crossed connecting lines in the first quantum topology graph, determining an intermediate node in the first quantum topology graph, retaining connecting lines between the intermediate node and other graph nodes so as to obtain a second quantum topology graph without the crossed connecting lines; if not, updating the first quantum topology graph to a third quantum topology graph; when there is a node to be optimized in the second quantum topology graph or the third quantum topology graph, determining an optimized sub-graph corresponding to one node to be optimized and composed of N child nodes connected by connecting lines according to a preset way, wherein the connectivity of all the child nodes in the optimized sub-graph is no greater than the connectivity threshold; assigning the connecting line between the non-optimized nodes and the child nodes to obtain a fourth quantum topology graph; wherein the non-optimized node is the graph nodes other than the node to be optimized in the second quantum topology graph or the third quantum topology graph; restoring connecting lines between non-optimized nodes in the fourth quantum topology graph so as to obtain an optimized quantum topology graph and optimizing the target quantum algorithm according to the optimized quantum topology graph. The crossed connecting lines in the optimized quantum topology graph corresponds to the cross-coupling structure (capacitance, inductance, resonator, etc.) between multiple qubits of a quantum chip, which is impossible to be achieved in a quantum chip with a two-dimensional quantum chip. By optimizing to eliminate the crossed connecting lines, it is possible to implement an optimized quantum topology graph without the crossed connecting lines in a quantum chip in a two-dimensional structure; and in the implementation process, it is possible to reduce the quantity of applied swap gates, and then improve the execution effect of the quantum algorithm; by optimizing the node to be optimized that exceeds the connectivity threshold of the quantum chip to be applied, when the logic bits in the optimized quantum topology graph are mapped to the qubits of the quantum chip, it is possible to reduce the effect of neighboring qubits on the qubit to be regulated through the coupling structure and greatly improve the fidelity of the quantum algorithm.

Based on the above technical problems found by the inventors, embodiments of the present disclosure provide an improved method, apparatus for processing crossed connecting lines of a quantum connectivity graph, a terminal, and a storage medium, aiming at further improving the crossed connecting lines existing in the quantum connectivity graph of the conventional quantum algorithm. When there are crossed connecting lines in the quantum connectivity graph, determining the intermediate node in the quantum connectivity graph, and retaining the connecting lines between the intermediate node and other graph nodes so as to obtain the target quantum connectivity graph without the crossed connecting lines. In this way, by optimizing to remove crossed connecting lines, when the target quantum connectivity graph without crossed connecting lines is implemented on a quantum chip in a two-dimensional structure, it is possible to effectively shorten the depth of the quantum algorithm, reduce the number of swap gates applied during the implementation process, and improve the execution effect of the quantum algorithm.

The following details some exemplary implementations of the crossed connecting lines processing method of a quantum connectivity graph described above in conjunction with accompanying diagrams in the specification.

Figure 22:
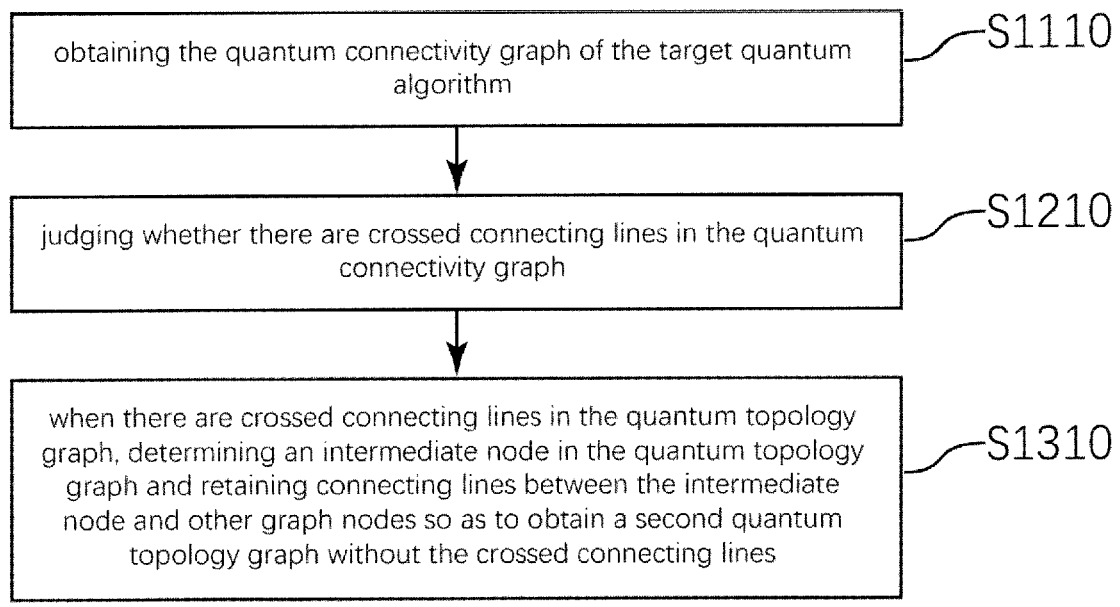
FIG. 22 illustrates an interaction flow diagram of a crossed connecting lines processing method of a quantum connectivity graph provided by an embodiment of the present disclosure.

Referring to FIG. 22, it shows an interaction flow diagram of the crossed connecting lines processing method of the quantum connectivity graph provided by embodiments of the present disclosure. It should be understood that in other embodiments, the order of some steps of the crossed connecting lines processing method of the quantum connectivity graph of the present embodiment may be exchanged according to actual needs, or some steps may also be omitted or deleted. The detailed steps of the crossed connecting lines processing method of the quantum connectivity graph are described below.

Step S1110, obtaining the quantum connectivity graph of the target quantum algorithm.

In the present embodiment, the quantum connectivity graph may include multiple graph nodes and connecting lines between two graph nodes, the graph nodes may be used to represent logic bits in the target quantum algorithm, and the connecting lines are used to represent qubit logic gates between two logic bits.

Wherein, the quantum connectivity graph can be obtained based on the logic bits in the target quantum algorithm and the number of qubit logic gates applied on any two qubits. Wherein, the qubits may refer to a physical system that can be in a ground state $|0\rangle$, an excited state $|1\rangle$ and a superposition state $(\alpha|0\rangle+\beta|1\rangle)$ at the same time. Mathematically, the qubits can be represented by vectors of states on Hilbert space. Quantum circuits are implemented by manipulating several qubits at the same time.

A quantum circuit is a representation of a quantum program that can be consisted of a sequence of qubits initially located in the $|0\rangle$ state and a quantity of subsequent quantum logic gates, and terminated by a measurement operation (not necessarily every bit needs to be measured). Typically, each quantum program can eventually be decomposed into a quantum program consisting only of a sequence of elementary quantum logic gates. In addition, the qubit logic gates may refer to some reversible unitary transformations, and may be used to manipulate several qubits to make these qubits evolve towards a target state in order to evolve into a final state, that is, the result of quantum computation.

Step S1120, judging whether there are crossed connecting lines in the quantum connectivity graph.

For example, in some possible examples, it is possible to detect whether the quantum topology graph is a plane graph, that is, to detect whether there is an intersection between the various connecting lines in the quantum topology graph. That is, when there is an intersection between any two connecting lines, it can be determined that there are crossed connecting lines in the quantum topology graph; when there are no intersections between all connecting lines, it can be determined that there are no crossed connecting lines in the quantum connectivity graph.

Step S1130, when there are crossed connecting lines in the quantum topology graph, determining an intermediate node in the quantum topology graph and retaining connecting lines between the intermediate node and other graph nodes so as to obtain a second quantum topology graph without the crossed connecting lines.

When the quantum topology graph is not a planar graph, it means that there are crossed connecting lines in the quantum connectivity graph, that is, it is necessary to achieve the cross-coupling in the corresponding quantum chip structure; however, the structure of the actual quantum chip is a two-dimensional lattice structure, and therefore cannot achieve a specific structure corresponding to the cross-coupling between qubits. The crossed connecting lines is not optimized in related technologies, that is, the two-dimensional lattice structure of the quantum chip is not changed in the subsequent process of running the quantum algorithm through the quantum chip, but the mapping relationship between the qubits is changed by applying the swap gate. In this way, when too many swap gates are applied, it is possible to increase the depth of the algorithm as well as the algorithm running time In the present embodiment, however, when there are crossed connecting lines in the quantum topology graph, the second quantum topology without crossed connecting lines is obtained by determining the intermediate node in the quantum topology graph and retaining the connecting lines between the intermediate node and other graph nodes.

For example, in some possible examples, in the process of determining the intermediate node in the quantum topology graph, the intermediate node may represent the highest priority graph node in the quantum topology graph, and thus the graph node with the highest priority in this first quantum topology graph can be selected as the intermediate node. This priority can be calculated in conjunction with the node value of the graph node in the quantum topology graph.

For another example, in the process of retaining the connecting lines between the intermediate node and other graph nodes, it is possible to choose to remove the connecting lines between other graph nodes other than the intermediate point, specifically removing all connecting lines between other graph nodes, or only removing crossed connecting lines between other graph nodes.

In this way, by optimizing to remove crossed connecting lines, when the target quantum connectivity graph without crossed connecting lines is implemented on a quantum chip in a two-dimensional structure, it is possible to effectively shorten the depth of the quantum algorithm, reduce the number of swap gates applied during the implementation process, and improve the execution effect of the quantum algorithm.

In one possible implementation, in the process of obtaining the quantum connectivity graph of the target quantum algorithm, it is possible to obtain the logic bits in the quantum algorithm and the number of qubit logic gates applied on any two qubits; then, based on the number of qubit logic gates applied on any two qubits, it is possible to obtain an adjacency matrix reflecting the interaction relationship of the logic bits, which may represent the number of the qubit logic gates applied on any two qubits, therefore converting the adjacency matrix to a quantum connectivity graph.

It is to be understood that in other possible embodiments, the quantum connectivity graph of the target quantum algorithm may also be obtained in any other feasible manner. For example, the adjacency matrix reflecting the interaction relationship of the logic bits may be directly obtained to determine the quantum connectivity graph.

In one possible implementation, the inventors found in the course of their research that since each graph node in the first quantum topology graph has a different value, it is necessary to avoid changing the graph node with a high value in the first quantum topology graph as much as possible in the process of optimizing the crossed connecting lines; otherwise, too many swap operations may be introduced. Based on this, for the step S1130, it can be implemented by the following exemplary sub-steps, which are described in detail as follows.

Sub-step S1131, calculating a node value parameter of individual graph nodes in the quantum connectivity graph and determining the intermediate node from individual graph nodes according to the node value parameters of individual graph nodes in the quantum connectivity graph.

Sub-step S1132, retaining connecting lines between the intermediate node and other graph nodes so as to obtain a target quantum connectivity graph without the crossed connecting lines.

In the present embodiment, the node value parameters may be specifically used to characterize a value degree of the graph node participating in the quantum algorithm in the quantum connectivity graph, and the greater the node value parameters are, the higher the priority of the corresponding graph node in the quantum algorithm is. In a specific implementation process, any parameters of individual graph nodes in the quantum connectivity graph that may characterize the value degree of the graph node may be selected and calculated as the node value parameters. For example, the node value parameters may include, but are not limited to, connectivity, total weight, weight dispersion, and the like.

In this way, by selecting the intermediate node based on the node value parameters of individual graph nodes in the quantum connectivity graph, it is possible to enable the selected intermediate node to be a graph node with a high degree of relative value in the quantum connectivity graph, and thus choose to retain the connecting lines between the intermediate node and other graph nodes, therefore avoiding a subsequent situation where too many swap operations may be introduced.

It is worth noting that for those skilled in the art, it can be understood that the above node value parameters are not specifically limited, and can be flexibly selected based on actual design needs.

For example, the embodiment of the present disclosure will give some possible examples to exemplify how to determine the intermediate node based on the node value parameters in the sub-step S1131. It should be understood that the following description is only an example and should not be understood as a restrictive description of the above node value parameter. Those skilled in the art may select a node value parameter other than the following examples on this basis and in combination with actual needs, which are within the scope of protection of the present application.

For example, for sub-step S1131, at least one of the connectivity, the total weight, and the weight dispersion of individual graph nodes in the quantum connectivity graph may be calculated as a node value parameter.

Wherein, it is worth noting that the connectivity may be used to represent the quantity of connecting lines connected to the graph nodes, the total weight may be used to represent a sum of connecting line quantized values of the connecting lines of all the connecting lines connected to the graph nodes, and the weight dispersion may be used to represent a variance of the connecting line quantized values of all connecting lines connected to the graph nodes.

For example, as shown in FIG. 1, taking the graph node 6 as an example, the connecting lines connected to the graph node 6 include five connecting lines connected between the graph node 6 and the graph node 1, the graph node 2, the graph node 3, the graph node 4, the graph node 5 respectively, that is, the connectivity of graph node 6 is 5.

In the present embodiment, the connecting line quantized values of the connecting lines may be used to represent the number of applied qubit logic gates between two qubits, and it can be understood as the coarseness of the connecting lines between two graph nodes in the quantum connectivity graph shown in FIG. 1. Then, still taking the graph node 6 as an example, the total weight of the graph node 6 may be used to represent a sum of connecting line quantized values between the graph node 6 and the graph node 1, the graph node 2, the graph node 3, the graph node 4, the graph node 5, and the weight dispersion of the graph node 6 may be used to represent a variance of the connecting line quantized values between graph node 6 and the graph node 1, the graph node 2, the graph node 3, the graph node 4, the graph node 5.

Based on this description, the connectivity, total weight, and weight dispersion of other graph node 2, graph node 3, graph node 4, and graph node 5 may be calculated by referring to the above description of the graph node 6, and will not be repeated here.

After selecting at least one of connectivity, total weight, and weight dispersion determined as the value parameter, it is to determine the intermediate node from the individual graph nodes according to the node value parameter.

For example, in one possible embodiment, the node value parameter may include only the first parameter, then in the process of determining the intermediate node from the individual graph nodes according to the node value parameter, one of the connectivity, total weight, and weight dispersion may be used as the first parameter, and the graph node with the largest first parameter may be selected as the intermediate node.

For example, if the connectivity is selected as the first parameter, then the graph node with the largest connectivity may be selected as the intermediate node. For example, if the total weight is selected as the first parameter, then the graph node with the largest total weight may be selected as the intermediate node. For example, if the weight dispersion is selected as the first parameter, the graph node with the largest weight dispersion is selected as the intermediate node.

On the basis of the above description, the inventors have found in the process of research that in some specific situations where there are multiple first target graph nodes with the same and the largest first parameter, and it is necessary to further combine a second parameter to screen the intermediate node on this basis.

For example, in one possible embodiment, the node value parameter may include the second parameter. When there are multiple first target graph nodes with the same and the largest first parameter, when there are multiple first target graph nodes with the same and the largest first parameter, calculating another parameter other than the first parameter among the connectivity, the total weight, and the weight dispersion degree of each first target graph node, as the second parameter, so that among individual first target graph nodes, the graph node with the largest second parameter may be selected as the intermediate node.

For example, assuming that the connectivity is selected as the first parameter in the preceding embodiment, one parameter of the total weight and the weight dispersion of each first target graph node may be calculated as the second parameter, and then among the individual first target graph nodes, the graph node with the largest second parameter is selected as the intermediate node. For example, if the total weight of each first target graph node is selected as the second parameter, then among the individual first target graph nodes, the graph node with the largest total weight is selected as the intermediate node, or if the weight dispersion of each first target graph node is selected as the second parameter, then among the individual first target graph nodes, the graph node with the largest weight dispersion is selected as the intermediate node.

For example, assuming that the total weight is selected as the first parameter, one parameter of the connectivity and the weight dispersion of each first target graph node may be calculated as the second parameter, and then among the individual first target graph nodes, the graph node with the largest second parameter is selected as the intermediate node. For example, if the connectivity of each first target graph node is selected as the second parameter, then among the individual first target graph nodes, the graph node with the largest connectivity is selected as the intermediate node, or if the weight dispersion of each first target graph node is selected as the second parameter, then among the individual first target graph nodes, the graph node with the largest weight dispersion is selected as the intermediate node.

For example, assuming that the weight dispersion is selected as the first parameter, one parameter of the total weight and the connectivity of each first target graph node may be calculated as the second parameter, and then among the individual first target graph nodes, the graph node with the largest second parameter is selected as the intermediate node. For example, if the connectivity of each first target graph node is selected as the second parameter, then among the individual first target graph nodes, the graph node with the largest connectivity is selected as the intermediate node, or if the total weight of each first target graph node is selected as the second parameter, then among the individual first target graph nodes, the graph node with the largest total weight is selected as the intermediate node.

Further, the inventors have found in the process of research that in some other specific situations where there are multiple first target graph nodes with the same and the largest first parameter and there are multiple second target graph nodes with the same and the largest first parameter as well as the same and the largest second parameter, and it is necessary to further combine a third parameter to screen the intermediate node on this basis.

For example, in one possible embodiment, the node value parameter may include the third parameter. When there are multiple second target graph nodes with the same and the largest first parameter as well as the same and the largest second parameter, the remaining parameter other than the first parameter and the second parameter among the connectivity, the total weight, and the weight dispersion degree of each second target graph node may be calculated as the third parameter, so that among individual second target graph nodes, the graph node with the largest third parameter may be selected as the intermediate node.

For example, assuming that the connectivity is selected as the first parameter and the total weight is selected as the second parameter in the preceding embodiment, then the weight dispersion of each second target graph node may be calculated as the third parameter, and then among the individual second target graph nodes, the graph node with the largest weight dispersion is selected as the intermediate node. Or, the connectivity is selected as the first parameter and the weight dispersion is selected as the second parameter, then the total weight of each second target graph node may be calculated as the third parameter, and then among the individual second target graph nodes, the graph node with the largest total weight is selected as the intermediate node.

For example, assuming that the total weight is selected as the first parameter and the connectivity is selected as the second parameter, then the weight dispersion of each second target graph node may be calculated as the third parameter, and then among the individual second target graph nodes, the graph node with the largest weight dispersion is selected as the intermediate node. Or, the total weight is selected as the first parameter and the weight dispersion is selected as the second parameter, then the connectivity of each second target graph node may be calculated as the third parameter, and then among the individual second target graph nodes, the graph node with the largest connectivity is selected as the intermediate node.

For example, assuming that the weight dispersion is selected as the first parameter and the total weight is selected as the second parameter, then the connectivity of each second target graph node may be calculated as the third parameter, and then among the individual second target graph nodes, the graph node with the largest connectivity is selected as the intermediate node. Or, the weight dispersion is selected as the first parameter and the connectivity is selected as the second parameter, then the total weight of each second target graph node may be calculated as the third parameter, and then among the individual second target graph nodes, the graph node with the largest total weight is selected as the intermediate node.

Based on the above example, the priority of the graph node in the quantum algorithm is measured by selecting connectivity, total weight and dispersion as node value parameters, so that when selecting the intermediate node, a graph node with the highest priority may be selected as the intermediate node, therefore avoiding a change of the intermediate node during subsequent optimizations, and avoiding an increase in quantum circuit depth and an extension of quantum algorithm runtime due to too many applied swap gates.

Further, in another possible embodiment, another example is given to determine the intermediate node in the quantum connectivity graph.

First, calculating a remaining parameter other than the first parameter and the second parameter among the connectivity, the total weight, and the weight dispersion degree of each second target graph node, as the third parameter.

Then, obtaining a value weight of each member node value parameter in a pre-configured combined node value parameters.

Based on this, calculating the weighted value of each member node value parameter of the individual graph nodes with the value weight of the member node value separately, so that the total weighted values of the individual graph nodes can be calculated based on the weighted value corresponding to each member node value parameter.

Finally, the graph node with the largest total weighted value may be selected as the intermediate node based on the total weighted values of the individual graph nodes.

For example, assuming that the combined node value parameter of the individual graph nodes in the quantum connectivity graph is the connectivity and the total weight, then the connectivity and the total weight can be interpreted as the member node value parameter in the combined node value parameter. Wherein, the value weights of the connectivity and the total weight may be pre-configured, so that it is possible to calculate the weighted value of the connectivity of the individual graph nodes and the value weight thereof as well as the weighted value of the total weight and the value weight thereof, and thus the total weighted values of the individual graph nodes may be calculated based on the weighted value of the connectivity and the value weight thereof as well as the weighted value of the total weight and the value weight thereof.

For example, assuming that the combined node value parameter of the individual graph nodes in the quantum connectivity graph is the connectivity and the weight dispersion, then the connectivity and the weight dispersion can be interpreted as the member node value parameter in the combined node value parameter. Wherein, the value weights of the connectivity and the weight dispersion may be pre-configured, so that it is possible to calculate the weighted value of the connectivity of the individual graph nodes and the value weight thereof as well as the weighted value of the weight dispersion and the value weight thereof, and thus the total weighted values of the individual graph nodes may be calculated based on the weighted value of the connectivity and the value weight thereof as well as the weighted value of the weight dispersion and the value weight thereof.

For example, assuming that the combined node value parameter of the individual graph nodes in the quantum connectivity graph is the total weight and the weight dispersion, then the total weight and the weight dispersion can be interpreted as the member node value parameter in the combined node value parameter. Wherein, the value weights of the total weight and the weight dispersion may be pre-configured, so that it is possible to calculate the weighted value of the total weighted values of the individual graph nodes and the value weight thereof as well as the weighted value of the weight dispersion and the value weight thereof, and thus the total weighted values of the individual graph nodes may be calculated based on the weighted value of the total weight and the value weight thereof as well as the weighted value of the weight dispersion and the value weight thereof.

For example, assuming that the combined node value parameter of the individual graph nodes in the quantum connectivity graph is the connectivity, the total weight and the weight dispersion, then the connectivity, the total weight and the weight dispersion can be interpreted as the member node value parameter in the combined node value parameter. Wherein, the value weights of the connectivity, the total weight and the weight dispersion may be pre-configured, so that it is possible to calculate the weighted value of the connectivity of the individual graph nodes and the value weight thereof, the weighted value of the total weight and the value weight thereof, as well as the weighted value of the weight dispersion and the value weight thereof, and thus the total weighted values of the individual graph nodes may be calculated based on the weighted value of the connectivity and the value weight thereof, the weighted value of the total weight and the value weight thereof, as well as the weighted value of the weight dispersion and the value weight thereof.

In this way, when the value weights of the connectivity, the total weight and the weight dispersion are pre-configured, they can be applied to different quantum algorithms; when optimizing the quantum connectivity graph corresponding to a quantum algorithm, the total weighted values of the individual graph nodes in the quantum algorithm may be obtained by reading the connectivity, the total weight and the weight dispersion of the individual graph nodes, and then the graph node with the largest total weighted value is selected as the intermediate node by sorting the total weighted value.

In one possible implementation, after determining the intermediate node, an optimization operation can next be performed on the crossed connecting lines in the target quantum connectivity graph. For example, the connecting lines between the intermediate node and other graph nodes may be retained, and the target connecting lines between other graph nodes other than the intermediate node may be removed to obtain a target quantum connectivity graph without the crossed connecting lines.

Wherein, in one possible example, the target connecting lines may be all connecting lines between other graph nodes.

For example, as shown in FIG. 8, it is assumed that the finally determined intermediate node is the graph node 6 shown in FIG. 1, then the connecting lines between the graph node 6 and the graph node 1, the graph node 2, the graph node 3, the graph node 4, the graph node 5 can be retained, and all connecting lines between the graph node 1, the graph node 2, the graph node 3, the graph node 4, the graph node 5 may be removed, so as to obtain the target quantum connectivity graph without the crossed connecting lines, that is, the quantum connectivity graph shown in FIG. 8.

Or, in another possible example, the inventors have considered that in a situation where there are no crossed connecting lines between some peripheral connecting lines, in order to retain more connecting lines so as to reduce subsequent swap gate operations, the target connecting lines may be remaining connecting lines between other graph nodes other than the peripheral connecting lines of the quantum connectivity graph.

For example, as shown in FIG. 21, still taking the graph node 6 shown in FIG. 1 as the final determined intermediate node as an example, then the connecting lines between the graph node 6 and the graph node 1, the graph node 2, the graph node 3, the graph node 4, the graph node still can be retained, and the connecting lines between the graph node 1, the graph node 2, the graph node 3, the graph node 4, the graph node 5 other than the peripheral connecting lines may be removed, so as to obtain the target quantum connectivity graph without the crossed connecting lines, that is, the quantum connectivity graph shown in FIG. 21.

Figure 23:
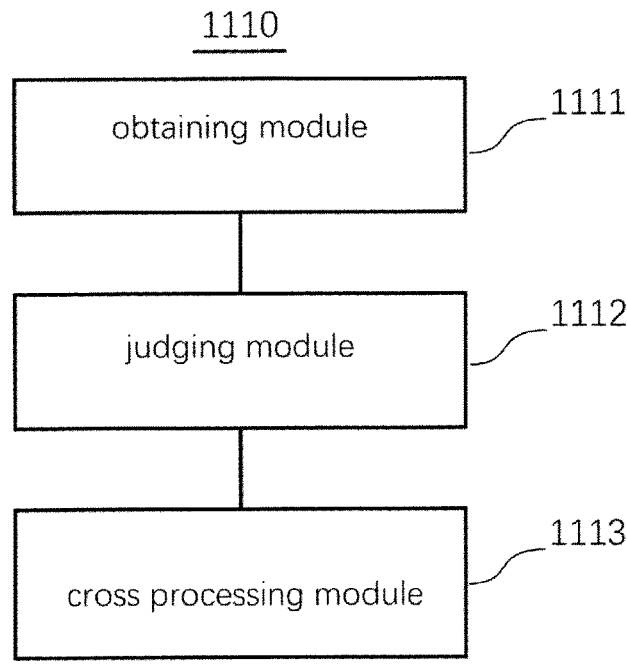
FIG. 23 illustrates a schematic diagram of functional modules of a crossed connecting lines processing apparatus of a quantum topology graph provided by an embodiment of the present disclosure.

Based on the same inventive concept, see FIG. 23, it shows a schematic diagram of functional modules of a crossed connecting lines processing apparatus 110 of a quantum connectivity graph provided by embodiments of the present disclosure. This embodiment may divide the functional modules of the crossed connecting lines processing apparatus 110 of the quantum connectivity graph according to the method implementation performed by the computer terminal 100 described above. For example, it is possible to divide individual functional modules corresponding to individual functions, or it is possible to integrate two or more functions in a single processing module. The integrated module may be implemented either in the form of hardware or in the form of a software function module. It should be noted that the division of modules in the embodiments of the present disclosure is schematic and is only a logical functional division, and that another division may be used in practical implementation. For example, in the case of dividing individual functional modules corresponding to individual functions, the crossed connecting lines processing apparatus 1110 of the quantum connectivity graph shown in FIG. 23 is only a schematic diagram of an apparatus. Wherein, the crossed connecting lines processing apparatus 1110 of the quantum connectivity graph may include an obtaining module 1111, a judging module 1112 and a cross processing module 1113. The functions of individual functional modules of the crossed connecting lines processing apparatus 1110 of the quantum connectivity graph are described in detail below.

The obtaining module 1111 is configured to obtain a quantum connectivity graph of a target quantum algorithm, and the quantum connectivity graph includes a plurality of graph nodes and connecting lines between any two graph nodes, wherein the graph nodes are used to represent logic bits in the target quantum algorithm, and the connecting lines are used to represent qubit logic gates between any two logic bits. It is to be understood that the obtaining module 1111 may be used to perform the step S1110 described above, and the details of the implementation of the obtaining module 1111 may be found above in relation to step S1110.

The judging module 1112 is configured to judge whether there are crossed connecting lines in the quantum connectivity graph. It is to be understood that the judging module 1112 may be used to perform the step S1120 described above, and the details of the implementation of the judging module 1112 may be found above in relation to step S1120.

The cross processing module 1113 is configured that when there are crossed connecting lines in the quantum connectivity graph, determining an intermediate node in the quantum connectivity graph, and retaining connecting lines between the intermediate node and other graph nodes so as to obtain a target quantum topology graph without the crossed connecting lines. It is to be understoodtum topology graph without the crossed connecting lines. It is to be understood that the cross processing module 1113 may be used to perform the above step S1130, and the details of the implementation of the cross processing module 1113 may be found above in relation to step S1130.

In one possible embodiment, the cross processing module 1113 may be specifically configured that:
calculating a node value parameter of individual graph nodes in the quantum connectivity graph and determining the intermediate node from individual graph nodes according to the node value parameters of individual graph nodes in the quantum connectivity graph, wherein the node value parameters is used to characterize a value degree of the graph node participating in the quantum algorithm in the quantum connectivity graph;
retaining connecting lines between the intermediate node and other graph nodes so as to obtain a target quantum connectivity graph without the crossed connecting lines.

In one possible embodiment, the cross processing module 1113 may be specifically configured that:
calculating at least one of the connectivity, the total weight, and the weight dispersion of individual graph nodes in the quantum connectivity graph as a node value parameter; wherein, the connectivity is used to represent the quantity of connecting lines connected to the graph nodes, the total weight is used to represent a sum of connecting line quantized values of the connecting lines of all the connecting lines connected to the graph nodes, the weight dispersion is used to represent a variance of the connecting line quantized values of all connecting lines connected to the graph nodes, and the connecting line quantized values of the connecting lines is used to represent the number of applied qubit logic gates between two qubits;
determining the intermediate node from the individual graph nodes according to the node value parameter.

In one possible embodiment, the node value parameter includes a first parameter, and according to the first parameter, the cross processing module 1113 may be specifically configured that:
selecting one of the connectivity, total weight, and weight dispersion as the first parameter, and selecting the graph node with the largest first parameter as the intermediate node.

In one possible embodiment, the node value parameter further includes a second parameter, and the cross processing module 1113 may be specifically configured that:
when there are multiple first target graph nodes with the same and the largest first parameter, when there are multiple first target graph nodes with the same and the largest first parameter, calculating another parameter other than the first parameter among the connectivity, the total weight, and the weight dispersion degree of each first target graph node, as the second parameter;
selecting the graph node with the largest second parameter among individual first target graph nodes, as the intermediate node In one possible embodiment, the node value parameter further includes a third parameter, and the cross processing module 1113 may be specifically configured that:
when there are multiple second target graph nodes with the same and the largest first parameter as well as the same and the largest second parameter, calculating a remaining parameter other than the first parameter and the second parameter among the connectivity, the total weight, and the weight dispersion degree of each second target graph node, as the third parameter;
the graph node with the largest third parameter is selected as the intermediate node among individual second target graph nodes.

In one possible embodiment, the cross-processing module 1113 may be specifically configured that:
calculating a remaining parameter other than the first parameter and the second parameter among the connectivity, the total weight, and the weight dispersion degree of each second target graph node, as the third parameter; wherein, the connectivity is used to represent the quantity of connecting lines connected to the graph nodes, the total weight is used to represent a sum of connecting line quantized values of the connecting lines of all the connecting lines connected to the graph nodes, the weight dispersion is used to represent a variance of the connecting line quantized values of all connecting lines connected to the graph nodes, and the connecting line quantized values of the connecting lines is used to represent the number of applied qubit logic gates between two qubits;

obtaining a value weight of each member node value parameter in a pre-configured combined node value parameters;

calculating the weighted value of each member node value parameter of the individual graph nodes with the value weight of the member node value separately;

calculating the total weighted values of the individual graph nodes based on the weighted value corresponding to each member node value parameter;

selecting the graph node with the largest total weighted value as the intermediate node based on the total weighted values of the individual graph nodes.

In one possible embodiment, the cross processing module 1113 may be specifically configured that:

retaining the connecting lines between the intermediate node and other graph nodes, and removing the target connecting lines between other graph nodes other than the intermediate node to obtain a target quantum connectivity graph without the crossed connecting linesonnecting lines;

wherein, the target connecting lines are all connecting lines between other graph nodes; or, the target connecting lines are remaining connecting lines between other graph nodes other than the peripheral connecting lines of the quantum connectivity graph.

Based on the same inventive concept, see FIG. 19, it shows a schematic block diagram of the structure of the computer terminal 300 for executing the crossed connecting lines processing method of the quantum connectivity graph provided by embodiments of the present disclosure. The computer terminal 300 may include a crossed connecting lines processing apparatus 310 of the quantum connectivity graph, a machine-readable storage medium 320 and a processor 330.

In the present embodiment, the machine-readable storage medium 320 and the processor 330 are located in the computer terminal 300 and are provided separately. However, it should be understood that the machine-readable storage medium 320 may also be independent of the computer terminal 300, and may be accessed by the processor 330 through a bus interface. Alternatively, the machine-readable storage medium 320 may also be integrated into the processor 330, for example, may be a cache and/or a general-purpose register.

The crossed connecting lines processing apparatus 310 of the quantum connectivity graph may include software functional modules stored in the machine-readable storage medium 320 (such as the obtaining module 1111, the judging module 1112 and the cross processing module 1113 as shown in FIG. 23), and when the processor 330 executes the software functional modules in the crossed connecting lines processing apparatus 310 of the quantum connectivity graph, it is possible to implement the crossed connecting lines processing method of the quantum connectivity graph provided by the aforementioned method embodiment.

Since the computer terminal 300 provided by the embodiment of the present disclosure is another embodiment of the crossed connecting lines processing method of the quantum connectivity graph embodiment executed by the computer terminal 300, and the computer terminal 300 may be used to execute the crossed connecting lines processing method of the quantum connectivity graph provided by the above method embodiment, the technical effect it can obtain may refer to the above method embodiment, which will not be repeated herein.

Based on the shortcomings of prior arts, it is necessary to further improve quantum connectivity graph of the existing quantum algorithm, such as the crossed connecting lines in the quantum connectivity graph. The present disclosure provide a crossed connecting lines processing method, apparatus of a quantum connectivity graph, a terminal, and a storage medium, which by optimizing to remove the crossed connecting lines, can effectively shorten the depth of the quantum algorithm and thus improve the execution effect of the quantum algorithm when the target quantum connectivity graph without the crossed connecting lines is implemented on a quantum chip in a two-dimensional structure.

The embodiments here can be summarized as follows.

E1. A crossed connecting lines processing method of a quantum connectivity graph, characterized by being applied to a computer terminal, the method includes:

obtaining a quantum connectivity graph of a target quantum algorithm, and the quantum connectivity graph includes a plurality of graph nodes and connecting lines between two graph nodes, wherein the graph nodes are used to represent logic bits in the target quantum algorithm, and the connecting lines are used to represent qubit logic gates between two logic bits;

judging whether there are crossed connecting lines in the quantum connectivity graph;

when there are crossed connecting lines in the quantum connectivity graph, determining an intermediate node in the quantum connectivity graph, and retaining connecting lines between the intermediate node and other graph nodes so as to obtain a target quantum topology graph without the crossed connecting lines.

E2. The crossed connecting lines processing method of a quantum connectivity graph of E1, characterized in that the step of determining an intermediate node in the quantum connectivity graph, and retaining connecting lines between the intermediate node and other graph nodes so as to obtain a target quantum topology graph without the crossed connecting lines, includes:

calculating a node value parameter of individual graph nodes in the quantum connectivity graph and determining the intermediate node from individual graph nodes according to the node value parameters of individual graph nodes in the quantum connectivity graph, wherein the node value parameters is used to characterize a value degree of the graph node participating in the quantum algorithm in the quantum connectivity graph;

retaining connecting lines between the intermediate node and other graph nodes so as to obtain a target quantum connectivity graph without the crossed connecting lines.

E3. The crossed connecting lines processing method of a quantum connectivity graph of E1 or E2, characterized in that the step of calculating a node value parameter of individual graph nodes in the quantum connectivity graph and determining the intermediate node from individual graph nodes according to the node value parameters of individual graph nodes in the quantum connectivity graph, includes:

calculating at least one of the connectivity, the total weight, and the weight dispersion of individual graph nodes in the quantum connectivity graph as a node value parameter; wherein, the connectivity is used to represent the quantity of connecting lines connected to the graph nodes, the total weight is used to represent a sum of connecting line quantized values of the connecting lines of all the connecting lines connected to the graph nodes, the weight dispersion is used to represent a variance of the connecting line quantized values of all connecting lines connected to the graph nodes, and the connecting line quantized values of the connecting lines is used to represent the number of applied qubit logic gates between two qubits;

determining the intermediate node from the individual graph nodes according to the node value parameter.

E4. The crossed connecting lines processing method of a quantum connectivity graph of any one of E1 to E3, characterized in that the node value parameter includes a first parameter, and the step of determining the intermediate node from the individual graph nodes according to the node value parameter, includes:

selecting one of the connectivity, total weight, and weight dispersion as the first parameter, and selecting the graph node with the largest first parameter as the intermediate node.

E5. The crossed connecting lines processing method of a quantum connectivity graph of any one of E1 to E4, characterized in that the node value parameter includes a second parameter, and the step of determining the intermediate node from the individual graph nodes according to the node value parameter, includes:

when there are multiple first target graph nodes with the same and the largest first parameter, calculating another parameter other than the first parameter among the connectivity, the total weight, and the weight dispersion degree of each first target graph node, as the second parameter;

selecting the graph node with the largest second parameter among individual first target graph nodes, as the intermediate node.

E6. The crossed connecting lines processing method of a quantum connectivity graph of any one of E1 to E5, characterized in that the node value parameter includes a third parameter, and the step of determining the intermediate node from the individual graph nodes according to the node value parameter, includes:

when there are multiple second target graph nodes with the same and the largest first parameter as well as the same and the largest second parameter, calculating a remaining parameter other than the first parameter and the second parameter among the connectivity, the total weight, and the weight dispersion degree of each second target graph node, as the third parameter;

selecting the graph node with the largest third parameter among individual second target graph nodes, as the intermediate node.

E7. The crossed connecting lines processing method of a quantum connectivity graph of any one of E1 to E6, characterized in that the step of determining an intermediate node in the quantum connectivity graph, includes:

calculating at least two parameters among connectivity, total weight, and weight dispersion of individual graph nodes in the quantum connectivity graph, as combined node value parameters; wherein, the connectivity is used to represent the quantity of connecting lines connected to the graph nodes, the total weight is used to represent a sum of connecting line quantized values of the connecting lines of all the connecting lines connected to the graph nodes, the weight dispersion is used to represent a variance of the connecting line quantized values of all connecting lines connected to the graph nodes, and the connecting line quantized values of the connecting lines is used to represent the number of applied qubit logic gates between two qubits;

obtaining a value weight of each member node value parameter in a pre-configured combined node value parameters;

calculating the weighted value of each member node value parameter of the individual graph nodes with the value weight of the member node value separately;

calculating the total weighted values of the individual graph nodes based on the weighted value corresponding to each member node value parameter;

selecting the graph node with the largest total weighted value as the intermediate node based on the total weighted values of the individual graph nodes.

E8. The crossed connecting lines processing method of a quantum connectivity graph of any one of E1 to E7, characterized in that the step of retaining connecting lines between the intermediate node and other graph nodes so as to obtain a target quantum connectivity graph without the crossed connecting lines, includes:

retaining the connecting lines between the intermediate node and other graph nodes, and removing the target connecting lines between other graph nodes other than the intermediate node to obtain a target quantum connectivity graph without the crossed connecting lines;

wherein, the target connecting lines are all connecting lines between other graph nodes; or, the target connecting lines are remaining connecting lines between other graph nodes other than the peripheral connecting lines of the quantum connectivity graph.

E9. A crossed connecting lines processing apparatus of a quantum connectivity graph, characterized by being applied to a computer terminal, the apparatus includes:

an obtaining module configured to obtain a quantum connectivity graph of a target quantum algorithm, and the quantum connectivity graph includes a plurality of graph nodes and connecting lines between any two graph nodes, wherein the graph nodes are used to represent logic bits in the target quantum algorithm, and the connecting lines are used to represent qubit logic gates between any two logic bits;

a judging module configured to judge whether there are crossed connecting lines in the quantum connectivity graph;

a cross processing module configured that when there are crossed connecting lines in the quantum connectivity graph, determining an intermediate node in the quantum connectivity graph, and retaining connecting lines between the intermediate node and other graph nodes so as to obtain a target quantum topology graph without the crossed connecting lines.

E10. A computer terminal, characterized by including a machine-readable storage medium and a processor, the machine-readable storage medium stores a computer program therein, and the processor is configured to run the computer program to execute the crossed connecting lines processing method of a quantum connectivity graph of any one of E1 to E8.

E11. A computer readable storage medium, characterized in that the computer readable storage medium stores a computer program therein, and the computer program is configured, when executed by a computer, to implement the crossed connecting lines processing method of a quantum connectivity graph of any one of E1 to E8.

Based on any of the above, by optimizing to remove crossed connecting lines, when the target quantum connectivity graph without crossed connecting lines is implemented on a quantum chip in a two-dimensional structure, the present disclosure can effectively shorten the depth of the quantum algorithm, reduce the number of swap gates applied during the implementation process, and improve the execution effect of the quantum algorithm.

Figure 24:
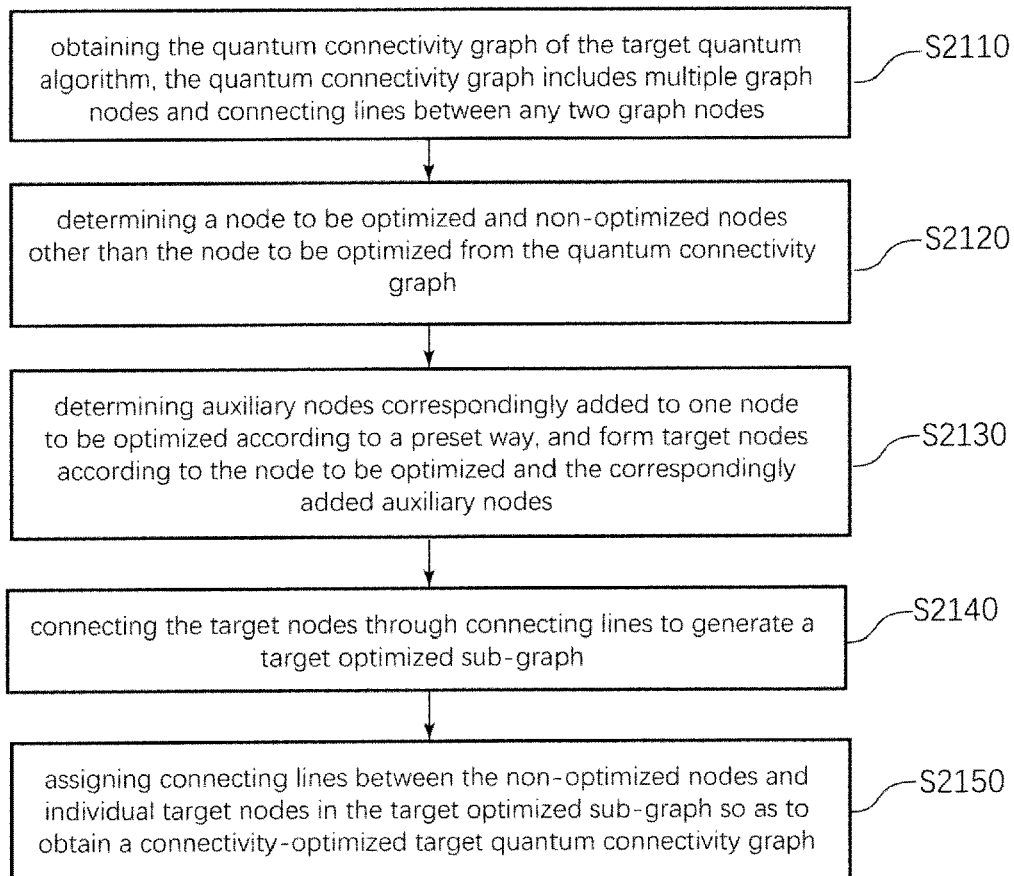
FIG. 24 illustrates a flow diagram of a connectivity optimization method of a quantum connectivity graph provided by an embodiment of the present disclosure.

Referring to FIG. 24, it shows an interaction flow diagram of a connectivity optimization method of the quantum connectivity graph provided by embodiments of the present disclosure. It should be understood that in other embodiments, the order of some steps of the crossed connecting lines processing method of the quantum connectivity graph of the present embodiment may be exchanged according to actual needs, or some steps may also be omitted or deleted. The detailed steps of the crossed connecting lines processing method of the quantum connectivity graph are described below.

Step S2110, obtaining the quantum connectivity graph of the target quantum algorithm.

In the present embodiment, the quantum connectivity graph may include multiple graph nodes and connecting lines between two graph nodes, the graph nodes may be used to represent logic bits in the target quantum algorithm, and the connecting lines are used to represent qubit logic gates between two logic bits.

Wherein, the quantum connectivity graph can be obtained based on the logic bits in the target quantum algorithm and the number of qubit logic gates applied on any two qubits. Wherein, the qubits may refer to a physical system that can be in a ground state $|0\rangle$, an excited state $|1\rangle$ and a superposition state $(\alpha|0\rangle+\beta|1\rangle)$ at the same time. Mathematically, the qubits can be represented by vectors of states on Hilbert space. Quantum circuits are implemented by manipulating several qubits at the same time.

A quantum circuit is a representation of a quantum program that can be consisted of a sequence of qubits initially located in the $|0\rangle$ state and a quantity of subsequent quantum logic gates, and terminated by a measurement operation (not necessarily every bit needs to be measured). Typically, each quantum program can eventually be decomposed into a quantum program consisting only of a sequence of elementary quantum logic gates. In addition, the qubit logic gates may refer to some reversible unitary transformations, and may be used to manipulate several qubits to make these qubits evolve towards a target state in order to evolve into a final state, that is, the result of quantum computation.

Step S2120, determining a node to be optimized and non-optimized nodes other than the node to be optimized from the quantum connectivity graph.

In the present embodiment, the node to be optimized may refer to the graph node in the quantum connectivity graph whose connectivity greater than the connectivity threshold of the quantum chip to be applied. Wherein, the connectivity may be used to represent the quantity of couplings between qubits and neighboring qubits, and considering the fact that quantum chips in related technologies are usually in a two-dimensional structure, and coupling between qubits is usually achieved through specific coupling structures (e.g., capacitors, inductors, resonant cavities, etc.), it is possible to significantly reduce the ability to modulate the qubits corresponding to that logic bit and thus significantly reduce the accuracy of performing the quantum computation when the connectivity of a graph node in the quantum connectivity graph is greater than the connectivity threshold of the quantum chip to be applied, that is, the limit on the quantity of couplings of the quantum chip to be applied is exceeded. Therefore, it is necessary to optimize the graph node in the quantum connectivity graph whose connectivity is greater than the connectivity threshold of the quantum chip to be applied, that is, it is necessary to determine the graph node in the quantum connectivity graph whose connectivity is greater than the connectivity threshold of the quantum chip to be applied as the node to be optimized.

Step S2130, determining auxiliary nodes correspondingly added to one node to be optimized according to a preset way, and form target nodes according to the node to be optimized and the correspondingly added auxiliary nodes.

In the present embodiment, the quantity of added auxiliary nodes may be determined by the preset way, so that a corresponding quantity of auxiliary nodes may be added to form the target nodes with the node to be optimized. Alternatively, the preset way may be a way of incrementally increasing from a predetermined positive integer value, or may be a way determined based on a predetermined formula, which is not limited.

Step S2140, connecting the target nodes through connecting lines to generate a target optimized sub-graph.

In the present embodiment, by connecting the target nodes through connecting lines to generate the target optimized sub-graph, it is necessary to make the connectivity of all target nodes in the target optimized sub-graph not greater than the connectivity threshold.

Step S2150, assigning connecting lines between the non-optimized nodes and individual target nodes in the target optimized sub-graph so as to obtain a connectivity-optimized target quantum connectivity graph.

In the present embodiment, the way of assigning the connecting lines between the non-optimized nodes and the individual target nodes in the target optimized sub-graph is not specified in detail, and only need to ensure that in the connectivity-optimized target quantum connectivity graph, the connectivity of each graph node does not exceed the aforementioned connectivity threshold, and there are no crossed connecting lines between the individual graph nodes.

Based on the above steps, in the present embodiment, by optimizing the graph node in the quantum connectivity graph with a connectivity greater than the connectivity threshold of the quantum chip to be applied, one qubit executes qubit logic gates with as few neighboring qubits as possible to reduce the effect of the qubit logic gates applied on a plurality of qubits on the qubits, thereby improving the regulation precision of the qubits, such that the effect of qubit logic gates applied on a single qubit in the target quantum algorithm can be more accurately operated on the quantum chip to be applied.

In one possible implementation, in the process of obtaining the quantum connectivity graph of the target quantum algorithm, it is possible to obtain the logic bits in the quantum algorithm and the number of qubit logic gates applied on any two qubits; then, based on the number of qubit logic gates applied on any two qubits, it is possible to obtain an adjacency matrix reflecting the interaction relationship of the logic bits, which may represent the number of the qubit logic gates applied on any two qubits, therefore converting the adjacency matrix to a quantum connectivity graph.

It is to be understood that in other possible embodiments, the quantum connectivity graph of the target quantum algorithm may also be obtained in any other feasible manner. For example, the adjacency matrix reflecting the interaction relationship of the logic bits may be directly obtained to determine the quantum connectivity graph.

In one possible embodiment, for the step S2120, the process of determining a node to be optimized and non-optimized nodes other than the node to be optimized from the quantum connectivity graph, may be achieved by the following exemplary sub-steps, and is described in detail below.

Sub-step S2121, calculating the quantity of connecting lines connected to each graph node in the quantum connectivity graph, as the connectivity.

Sub-step S2122, determining a graph node in the quantum connectivity graph with the connectivity greater than the connectivity threshold as a node to be optimized, and determining remaining graph nodes other than the node to be optimized as non-optimized nodes.

Figure 25:
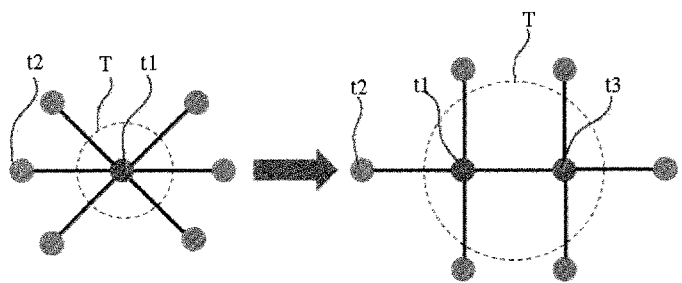
FIG. 25 illustrates a diagram of a connectivity optimization method of a quantum connectivity graph provided by an embodiment of the present disclosure.

For example, referring to FIG. 25, in the left figure, the graph node t1 is connected to six graph nodes t2, that is, the quantity of the connecting lines connected to the graph node t1 is 6, and assuming that the connectivity threshold is 5, since the connectivity of the graph node t1 is greater than 5, the graph node t1 may be determined as the node to be optimized, and determines all the remaining graph nodes t2 except the graph node t1 as the non-optimized nodes.

Through the sub-steps, after the node to be optimized is determined, the subsequent connectivity optimization can be performed on the node to be optimized, so that in the subsequent target quantum connectivity graph with optimized connectivity, the connectivity of the node to be optimized is lower than the connectivity threshold, that is, the coupling quantity of the qubit corresponding to the node to be optimized does not exceed the limit of the coupling quantity of the quantum chip, and thus such that when the target quantum connectivity graph is applied to the quantum chip, one qubit executes qubit logic gates with as few neighboring qubits as possible to reduce the effect of the qubit logic gates applied on a plurality of qubits on the qubits, thereby improving the regulation precision of the qubits, such that the effect of qubit logic gates applied on a single qubit in the target quantum algorithm can be more accurately operated on the quantum chip to be applied.

In one possible embodiment, for the step S2130, two possible exemplary ways will be given in the following embodiments. Those skilled in the art should understand that the equivalent replacement way that can be contemplated on the basis of the following exemplary ways, or other embodiments obtained in combination with the revelation of the following exemplary ways, should be within the scope of protection of the present application.

First, in order to determine a target quantity of auxiliary nodes to be added more efficiently, an exemplary way 1 is proposed: calculating a target quantity of auxiliary nodes to be added corresponding to the node to be optimized based on a preset formula, and composing a target node according to a quantity of the node to be optimized and the auxiliary nodes corresponding to the target quantity.

As an example, the preset formula could be:

$$N = \frac{d}{w-k}$$

wherein, N is the quantity of the target node, d is the current connectivity of the node to be optimized, w is the connectivity threshold of the quantum chip to be applied, and k is the connectivity of the target node to be applied.

Referring to the above preset formula and still taking FIG. 25 as an example, it can be seen that the current connectivity d of the node to be optimized (that is, the graph node t1) is 6, the connectivity threshold w of the quantum chip to be applied is 5, and assuming that k is 2, then the quantity N of the target node is 2, and thus the target quantity of the auxiliary nodes to be added is 1. Therefore, by referring to the right figure, it can be seen that one auxiliary node t3 may be added to compose two target nodes together with the node t1 to be optimized.

Figure 26:
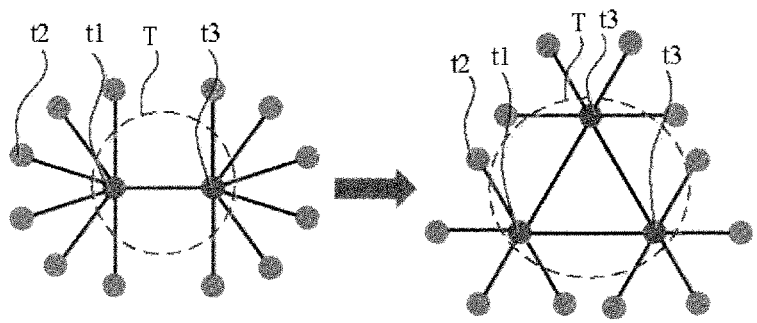
FIG. 26 illustrates a diagram of another connectivity optimization method of a quantum connectivity graph provided by an embodiment of the present disclosure.

For example, taking FIG. 26 as an example, it can be seen that the current connectivity d of the node to be optimized (that is, the graph node t1) is 7, the connectivity threshold w of the quantum chip to be applied is 6, and assuming that k is 2, then the quantity N of the target node is 2.5 and will be 3 after rounding 2.5, and thus the target quantity of the auxiliary nodes to be added is 2. Therefore, by referring to the right figure of FIG. 25, it can be seen that two auxiliary nodes t3 may be added to compose two target nodes together with the node t1 to be optimized.

In addition, in order to determine the minimum value of the target quantity of auxiliary nodes to be added to avoid reducing the fidelity of the quantum algorithm due to too many swap gates operations introduced subsequently, an exemplary way 2 is propose: incrementally adding N−1 auxiliary nodes from N=M, making them compose N target nodes with the node to be optimized, stopping increment until the connectivity of all target nodes is not greater than the connectivity threshold, and taking a N as a final N value when the increment is stopped, wherein M is an integer greater than or equal to 2.

For example, when M equals to 2, then one auxiliary node may be added at the first increment to compose two target nodes with the node to be optimized, and then continuing with the step S2140. If in the connectivity-optimized target quantum connectivity graph finally generated in the step S2150, the connectivity of any one of the two target nodes is greater than the connectivity threshold, then continuing to add one auxiliary node, that is, adding two auxiliary nodes, to compose three target nodes with the node to be optimized, and then continuing with the step S2140 and so on.

Based on the above exemplary way, in one possible embodiment, for the step S2140, the process of connecting the target nodes through connecting lines to generate a target optimized sub-graph, may be achieved by the following exemplary sub-steps, and is described in detail below.

Sub-step S2141, traversing all connection relationships between N target nodes and screening a candidate optimized sub-graph composed of target nodes.

In the present embodiment, when the quantum algorithm is compiled onto a quantum chip, there may be a situation where the couplings between multiple qubits (i.e., qubit logic gates) may cross, resulting in a high depth of the quantum algorithm and poor performance on a quantum chip in a two-dimensional structure. Therefore, in the present embodiment, there are no crossed lines in the candidate optimized sub-graph, such that when the target quantum connectivity graph without crossed connecting lines is implemented on the quantum chip in a two-dimensional structure, it is possible to effectively shorten the depth of the quantum algorithm, reduce the number of swap gates applied during the implementation process, and improve the execution effect of the quantum algorithm.

In the process of traversing all connection relationships between N target nodes, it is necessary to eliminate the disconnected graph structure and screen the candidate optimized sub-graph composed of target nodes. Wherein, for the candidate optimized sub-graph with N nodes, the quantity of its internal connecting lines e satisfies e≥N−1.

It is to be understood that for external non-optimized nodes, the candidate optimized sub-graph can be equivalent to a graph node, so free connections left by the candidate optimized sub-graph to the external non-optimized nodes must be able to connect to connecting lines of all the external non-optimized nodes, and thus the quantity of the internal connecting lines of the candidate optimized sub-graph should also satisfy e≤dN−K. Wherein, d is the connectivity threshold of the quantum chip to be applied, and K is the quantity of connecting lines between all the external non-optimized nodes and the candidate optimized sub-graph.

In this way, after determining the N nodes, there will be $2^{N(N-1)/2}$ connection relationship. In order to eliminate the disconnected graph structure so as to obtain the candidate optimized sub-graph, the N target nodes can be first connected into a line by N−1 connecting lines. On this basis, for $1 \leq i \leq (d-1)N-K+1$, i sides are sequentially connected to the two target nodes that are not directly connected, so as to obtain the candidate optimized sub-graph.

For example, referring to FIG. 25, when N=2, the resulting candidate optimized sub-graph T may include the graph node t1 and the graph node t3.

For example, referring to FIG. 26, when N=2, the resulting candidate optimized sub-graph T may include the graph node t1 and the graph node t3 connected in pairs, and when N=3, the resulting candidate optimized sub-graph T may include the graph node t1 and two graph nodes t3 connected in pairs.

Sub-step S2142, judging whether the current connectivity of any target node in the candidate optimized sub-graph is greater than the connectivity threshold.

Sub-step S2143, determining the candidate optimized sub-graph as the target optimized sub-graph if the current connectivity of any target node in the candidate optimized sub-graph is not greater than the connectivity threshold.

Sub-step S2144, updating N+1 as an updated N if the current connectivity of any target node in all the candidate optimized sub-graphs is greater than the connectivity threshold.

Sub-step S2145, returning to perform the operation of adding N−1 auxiliary nodes to compose N target nodes with the node to be optimized based on the updated N.

Sub-step S2146, determining the reacquired candidate optimized sub-graph as the target optimized sub-graph when the current connectivity of any target node in the reacquired candidate optimized sub-graph composed of N target nodes is not greater than the connectivity threshold.

For example, taking FIG. 25 as an example, when N=2, assuming that the connectivity threshold w of the quantum chip to be applied is 5, then the connectivity of t1 and t3 in the quantum connectivity graph is 4, which does not exceed the connectivity threshold, and there are no crossed connecting lines. Therefore, the candidate optimized sub-graph T in the right figure of FIG. 25 may be determined as the target optimized sub-graph. At this point, the increment may be stopped, and the final N value is 2.

In addition, taking FIG. 26 as an example, when N=2, assuming that the connectivity threshold w of the quantum chip to be applied is 6, then the connectivity of t1 and t3 in the quantum connectivity graph is 7, which is greater than the connectivity threshold, and then N+1=3 is used as the updated N, that is, as shown in the right figure, two auxiliary nodes are added to compose three target nodes with the node to be optimized, and then the candidate optimized sub-graph T in the right figure is reacquired after continuing with the above operations. Referring to the right figure of FIG. 26, the connectivity of any target node in the candidate optimized sub-graph T is 6, which does not exceed the connectivity threshold, and there are no crossed connecting lines. Therefore, the candidate optimized sub-graph T in the right figure of FIG. 26 may be determined as the target optimized sub-graph. At this point, the increment may be stopped, and the final N value is 3.

In this way, in the above exemplary way, after adding one or more auxiliary nodes t3 to the node t1 to be optimized, making the node t1 to be optimized and the added auxiliary nodes t3 compose a target optimized sub-graph, and assigning connecting lines between the node t1 to be optimized and the added auxiliary nodes t3 in the target optimized sub-graph and the non-optimized nodes, so as to obtain connectivity-optimized target quantum connectivity graph. When the target quantum connectivity graph is run on the quantum chip, the connectivity of the node t1 to be optimized in the target quantum connectivity graph is lower than the connectivity threshold of the quantum chip compared to the original quantum connectivity graph, such that a qubit corresponding to the node ti to be optimized executes qubit logic gates with as few neighboring qubits as possible to reduce the effect of the qubit logic gates applied on a plurality of qubits on the node t1 to be optimized, thereby improving the regulation precision of the node t1 to be optimized, such that the effect of qubit logic gates applied on a single node t1 to be optimized in the target quantum algorithm can be more accurately operated on the quantum chip to be applied.

Figure 27:
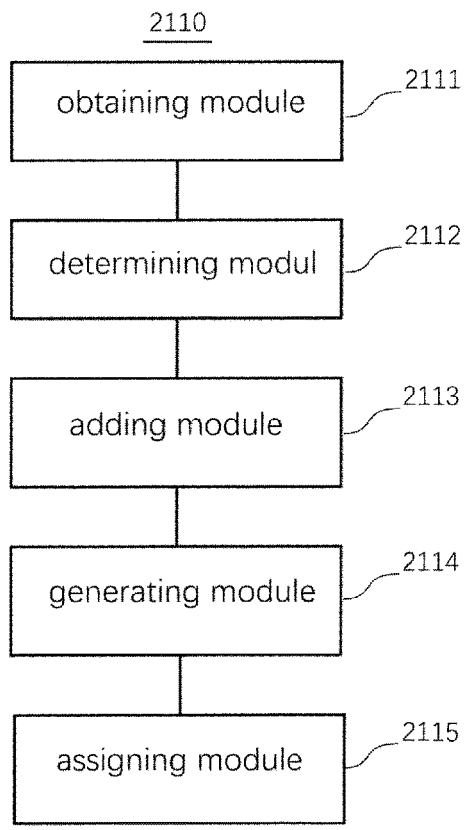
FIG. 27 illustrates a schematic diagram of functional modules of a connectivity optimization apparatus of a quantum connectivity graph provided by an embodiment of the present disclosure.

Based on the same inventive concept, see FIG. 27, it shows a schematic diagram of functional modules of a connectivity optimization apparatus 2110 of a quantum connectivity graph provided by embodiments of the present disclosure. This embodiment may divide the functional modules of the connectivity optimization apparatus 2110 of the quantum connectivity graph according to the method implementation described above. For example, it is possible to divide individual functional modules corresponding to individual functions, or it is possible to integrate two or more functions in a single processing module. The integrated module may be implemented either in the form of hardware or in the form of a software function module. It should be noted that the division of modules in the embodiments of the present disclosure is schematic and is only a logical functional division, and that another division may be used in practical implementation. For example, in the case of dividing individual functional modules corresponding to individual functions, the connectivity optimization apparatus 2110 of the quantum connectivity graph shown in FIG. 27 is only a schematic diagram of an apparatus. Wherein, the connectivity optimization apparatus 2110 of the quantum connectivity graph may include an obtaining module 2111, a determining module 2112, an adding module 2113, a generating module 2114 and an assigning module 2115. The functions of individual functional modules of the connectivity optimization apparatus 2110 of the quantum connectivity graph are described in detail below.

The obtaining module 2111 is configured to obtain a quantum connectivity graph of a target quantum algorithm, and the quantum connectivity graph includes a plurality of graph nodes and connecting lines between two graph nodes, wherein the graph nodes are used to represent logic bits in the target quantum algorithm, and the connecting lines are used to represent qubit logic gates between two logic bits. It is to be understood that the obtaining module 2111 may be used to perform the step S2110 described above, and the details of the implementation of the obtaining module 2111 may be found above in relation to step S2110.

The determining module 2112 is configured to determine a node to be optimized and non-optimized nodes other than the node to be optimized from the quantum connectivity graph, wherein the node to be optimized is the graph node in the quantum connectivity graph whose connectivity greater than the connectivity threshold of the quantum chip to be applied. It is to be understood that the determining module 2112 may be used to perform the step S2120 described above, and the details of the implementation of the determining module 2112 may be found above in relation to step S2120.

The adding module 2113 is configured to determine auxiliary nodes correspondingly added to one node to be optimized according to a preset way, and form target nodes according to the node to be optimized and the correspondingly added auxiliary nodes. It is to be understood that the adding module 2113 may be used to perform the step S2130 described above, and the details of the implementation of the adding module 2113 may be found above in relation to step S2130.

The generating module 2114 is configured to connect the target nodes through connecting lines to generate a target optimized sub-graph, wherein The connectivity of all target nodes in the target optimized sub-graph is not greater than the connectivity threshold. It is to be understood that the generating module 2114 may be used to perform the step S2140 described above, and the details of the implementation of the generating module 2114 may be found above in relation to step S2140.

The assigning module 2115 is configured to assign connecting lines between the non-optimized nodes and individual target nodes in the target optimized sub-graph so as to obtain a connectivity-optimized target quantum connectivity graph. It is to be understood that the assigning module 2115 may be used to perform the step S2150 described above, and the details of the implementation of the assigning module 2115 may be found above in relation to step S2150.

In one possible embodiment, the obtaining module 2111 is specifically configured that:
  obtaining a number of qubit logic gates applied on any two logic bits in the target quantum algorithm;
  obtaining an adjacency matrix based on the number of the qubit logic gates applied on any two logic bits, and converting the adjacency matrix into the quantum connectivity graph, wherein the adjacency matrix represents the number of qubit logic gates applied to any two logic bits.

In one possible embodiment, the determining module 2112 is specifically configured that:
  calculating the quantity of connecting lines connected to each graph node in the quantum connectivity graph, as the connectivity;
  determining a graph node in the quantum connectivity graph, and determining remaining graph nodes other than the node to be optimized as non-optimized nodes, wherein the node to be optimized is a graph node whose connectivity is greater than the connectivity threshold.

In one possible embodiment, the adding module 2113 is specifically configured that:
  calculating a target quantity of auxiliary nodes to be added corresponding to the node to be optimized based on a preset formula, and composing a target node according to a quantity of the node to be optimized and the auxiliary nodes corresponding to the target quantity.

In one possible embodiment, the adding module 2113 is specifically configured that:
  incrementally adding N−1 auxiliary nodes from N=M, making them compose N target nodes with the node to be optimized, stopping increment until the connectivity of all target nodes is not greater than the connectivity threshold, and taking a N as a final N value when the increment is stopped, wherein M is an integer greater than or equal to 2.

In one possible embodiment, the generating module 2114 is specifically configured that:
  traversing all connection relationships between N target nodes and screening a candidate optimized sub-graph composed of target nodes, wherein there are no crossed connecting lines in the candidate optimized sub-graph;
  judging whether the current connectivity of any target node in the candidate optimized sub-graph is greater than the connectivity threshold;
  determining the candidate optimized sub-graph as the target optimized sub-graph if the current connectivity of any target node in the candidate optimized sub-graph is not greater than the connectivity threshold.

In one possible embodiment, the generating module 2114 is specifically configured that:
  updating N+1 as an updated N if the current connectivity of any target node in all the candidate optimized sub-graphs is greater than the connectivity threshold;
  returning to perform the operation of adding N−1 auxiliary nodes to compose N target nodes with the node to be optimized based on the updated N;
  determining the reacquired candidate optimized sub-graph as the target optimized sub-graph when the current connectivity of any target node in the reacquired candidate optimized sub-graph composed of N target nodes is not greater than the connectivity threshold.

Based on the same inventive concept, see FIG. 19, it shows a schematic block diagram of the structure of the computer terminal 300 for executing the above connectivity optimization method of the quantum connectivity graph provided by embodiments of the present disclosure. The computer terminal 300 may include a connectivity optimization apparatus 310 of the quantum connectivity graph, a machine-readable storage medium 320 and a processor 330.

In the present embodiment, the machine-readable storage medium 320 and the processor 330 are located in the computer terminal 300 and are provided separately. However, it should be understood that the machine-readable storage medium 320 may also be independent of the computer terminal 300, and may be accessed by the processor 330 through a bus interface. Alternatively, the machine-readable storage medium 320 may also be integrated into the processor 330, for example, may be a cache and/or a general-purpose register.

The connectivity optimization apparatus 310 of the quantum connectivity graph may include software functional modules stored in the machine-readable storage medium 320 (such as the obtaining module 2111, the determining module 2112, the adding module 2113, the generating module 2114 and the assigning module 2115 as shown in FIG. 27), and when the processor 330 executes the software functional modules in the connectivity optimization apparatus 310 of the quantum connectivity graph, it is possible to implement the connectivity optimization method of the quantum connectivity graph provided by the aforementioned method embodiment.

Since the computer terminal 300 provided by the embodiment of the present disclosure is another embodiment of the connectivity optimization method of the quantum connectivity graph embodiment executed by the computer terminal 300, and the computer terminal 300 may be used to execute the connectivity optimization method of the quantum connectivity graph provided by the above method embodiment, the technical effect it can obtain may refer to the above method embodiment, which will not be repeated herein.

Based on the shortcomings of prior arts, it is necessary to further improve quantum connectivity graph of the existing quantum algorithm, such as the graph node in the connectivity graph whose connectivity is greater than the connectivity threshold of the quantum chip to be applied. The present disclosure provide a connectivity optimization method, apparatus of a quantum connectivity graph, a terminal, and a storage medium, which by optimizing the graph node in the connectivity graph whose connectivity is greater than the connectivity threshold of the quantum chip to be applied, one qubit executes qubit logic gates with as few neighboring qubits as possible to reduce the effect of the qubit logic gates applied on a plurality of qubits on the qubits, thereby improving the regulation precision of the qubits, such that the effect of qubit logic gates applied on a single qubit in the target quantum algorithm can be more accurately operated on the quantum chip to be applied.

F1. A connectivity optimization method of a quantum connectivity graph, characterized by including:
  obtaining a quantum connectivity graph of a target quantum algorithm, and the quantum connectivity graph includes a plurality of graph nodes and connecting lines between two graph nodes, wherein the graph nodes are used to represent logic bits in the target quantum algorithm, and the connecting lines are used to represent qubit logic gates between two logic bits;
  determining a node to be optimized and non-optimized nodes other than the node to be optimized from the quantum connectivity graph, wherein the node to be optimized is the graph node in the quantum connectivity;
  determining auxiliary nodes correspondingly added to one node to be optimized according to a preset way, and form target nodes according to the node to be optimized and the correspondingly added auxiliary nodes;
  connecting the target nodes through connecting lines to generate a target optimized sub-graph, wherein The connectivity of all target nodes in the target optimized sub-graph is not greater than the connectivity threshold;
  assigning connecting lines between the non-optimized nodes and individual target nodes in the target optimized sub-graph so as to obtain a connectivity-optimized target quantum connectivity graph.

F2. The connectivity optimization method of a quantum connectivity graph of F1, characterized in that the step of obtaining a quantum connectivity graph of a target quantum algorithm, includes:
  obtaining a number of qubit logic gates applied on any two logic bits in the target quantum algorithm;
  obtaining an adjacency matrix based on the number of the qubit logic gates applied on any two logic bits, and converting the adjacency matrix into the quantum connectivity graph, wherein the adjacency matrix represents the number of qubit logic gates applied to any two logic bits.

F3. The connectivity optimization method of a quantum connectivity graph of F1 or F2, characterized in that the step of determining a node to be optimized and non-optimized nodes other than the node to be optimized from the quantum connectivity graph, includes:
  calculating the quantity of connecting lines connected to each graph node in the quantum connectivity graph, as the connectivity;
  determining a graph node in the quantum connectivity graph, and determining remaining graph nodes other than the node to be optimized as non-optimized nodes, wherein the node to be optimized is a graph node whose connectivity is greater than the connectivity threshold.

F4. The connectivity optimization method of a quantum connectivity graph of any one of F1 to F3, characterized in that the step of determining auxiliary nodes correspondingly added to one node to be optimized according to a preset way, and form target nodes according to the node to be optimized and the correspondingly added auxiliary nodes, includes:
  calculating a target quantity of auxiliary nodes to be added corresponding to the node to be optimized based on a preset formula, and composing a target node according to a quantity of the node to be optimized and the auxiliary nodes corresponding to the target quantity.

F5. The connectivity optimization method of a quantum connectivity graph of any one of F1 to F3, characterized in that the step of determining auxiliary nodes correspondingly added to one node to be optimized according to a preset way, and form target nodes according to the node to be optimized and the correspondingly added auxiliary nodes, includes:
  incrementally adding $N-1$ auxiliary nodes from $N=M$, making them compose N target nodes with the node to be optimized, stopping increment until the connectivity of all target nodes is not greater than the connectivity threshold, and taking a N as a final N value when the increment is stopped, wherein M is an integer greater than or equal to 2.

F6. The connectivity optimization method of a quantum connectivity graph of any one of F1 to F5, characterized in that the step of connecting the target nodes through connecting lines to generate a target optimized sub-graph, includes:
  traversing all connection relationships between N target nodes and screening a candidate optimized sub-graph composed of target nodes, wherein there are no crossed connecting lines in the candidate optimized sub-graph;
  judging whether the current connectivity of any target node in the candidate optimized sub-graph is greater than the connectivity threshold;
  determining the candidate optimized sub-graph as the target optimized sub-graph if the current connectivity of any target node in the candidate optimized sub-graph is not greater than the connectivity threshold.

F7. The connectivity optimization method of a quantum connectivity graph of any one of F1 to F6, characterized in that after the step of judging whether the current connectivity of any target node in the candidate optimized sub-graph is greater than the connectivity threshold, further includes:
  updating $N+1$ as an updated N if the current connectivity of any target node in all the candidate optimized sub-graphs is greater than the connectivity threshold;
  returning to perform the operation of adding $N-1$ auxiliary nodes to compose N target nodes with the node to be optimized based on the updated N;
  determining the reacquired candidate optimized sub-graph as the target optimized sub-graph when the current connectivity of any target node in the reacquired candidate optimized sub-graph composed of N target nodes is not greater than the connectivity threshold.

F8. A connectivity optimization apparatus of a quantum connectivity graph, characterized in that the apparatus includes:
an obtaining module configured to obtain a quantum connectivity graph of a target quantum algorithm, and the quantum connectivity graph includes a plurality of graph nodes and connecting lines between two graph nodes, wherein the graph nodes are used to represent logic bits in the target quantum algorithm, and the connecting lines are used to represent qubit logic gates between two logic bits;
a determining module configured to determine a node to be optimized and non-optimized nodes other than the node to be optimized from the quantum connectivity graph, wherein the node to be optimized is the graph node in the quantum connectivity graph whose connectivity greater than the connectivity threshold of the quantum chip to be applied;
an adding module configured to determine auxiliary nodes correspondingly added to one node to be optimized according to a preset way, and form target nodes according to the node to be optimized and the correspondingly added auxiliary nodes;
a generating module configured to connect the target nodes through connecting lines to generate a target optimized sub-graph, wherein The connectivity of all target nodes in the target optimized sub-graph is not greater than the connectivity threshold;
an assigning module configured to assign connecting lines between the non-optimized nodes and individual target nodes in the target optimized sub-graph so as to obtain a connectivity-optimized target quantum connectivity graph.

F9. A computer terminal, characterized by including a machine-readable storage medium and a processor, the machine-readable storage medium stores a computer program therein, and the processor is configured to run the computer program to execute the connectivity optimization method of a quantum connectivity graph of any one of F1 to F7.

F10. A computer readable storage medium, characterized in that the computer readable storage medium stores a computer program therein, and the computer program is configured, when executed by a computer, to implement the connectivity optimization method of a quantum connectivity graph of any one of F1 to F7.

Based on the above aspects, in the present disclosure, by optimizing the graph node in the quantum connectivity graph with a connectivity greater than the connectivity threshold of the quantum chip to be applied, one qubit executes qubit logic gates with as few neighboring qubits as possible to reduce the effect of the qubit logic gates applied on a plurality of qubits on the qubits, thereby improving the regulation precision of the qubits, such that the effect of qubit logic gates applied on a single qubit in the target quantum algorithm can be more accurately operated on the quantum chip to be applied.

Figure 28:
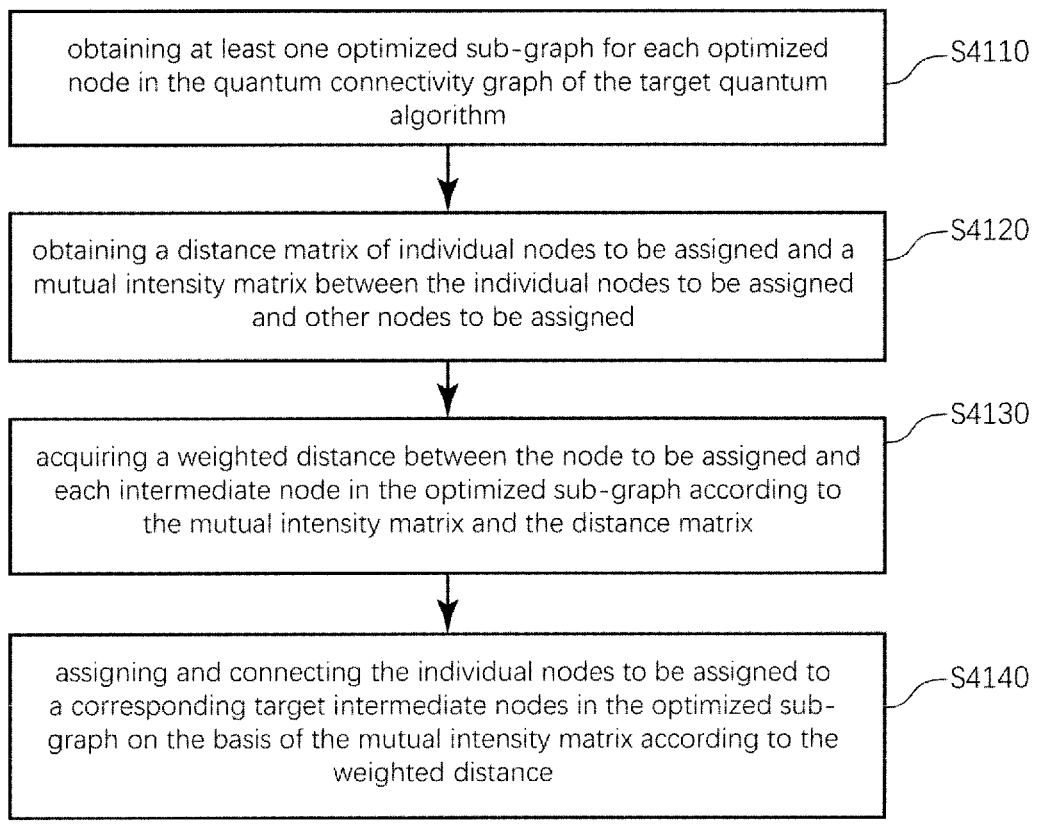
FIG. 28 illustrates a first flow diagram of a quantum connectivity graph optimization method provided by an embodiment of the present disclosure.

Referring to FIG. 28, it shows an interaction flow diagram of a quantum connectivity graph optimization method provided by embodiments of the present disclosure. It should be understood that in other embodiments, the order of some steps of the quantum connectivity graph optimization method of the present embodiment may be exchanged according to actual needs, or some steps may also be omitted or deleted. The detailed steps of the quantum connectivity graph optimization method are described below.

Step S4110, obtaining at least one optimized sub-graph for each optimized node in the quantum connectivity graph of the target quantum algorithm.

In the present embodiment, the quantum connectivity graph may include a plurality of graph nodes and connecting lines between two graph nodes, wherein the graph nodes may be used to represent logic bits in the target quantum algorithm, and the connecting lines may be used to represent qubit logic gates between two logic bits.

Wherein, the quantum connectivity graph can be obtained based on the logic bits in the target quantum algorithm and the number of qubit logic gates applied on any two qubits. Wherein, the qubits may refer to a physical system that can be in a ground state $|0>$, an excited state $|1>$ and a superposition state $(\alpha|0>+\beta|1>)$ at the same time. Mathematically, the qubits can be represented by vectors of states on Hilbert space. Quantum circuits are implemented by manipulating several qubits at the same time.

A quantum circuit is a representation of a quantum program that can be consisted of a sequence of qubits initially located in the $|0>$ state and a quantity of subsequent quantum logic gates, and terminated by a measurement operation (not necessarily every bit needs to be measured). Typically, each quantum program can eventually be decomposed into a quantum program consisting only of a sequence of elementary quantum logic gates. In addition, the qubit logic gates may refer to some reversible unitary transformations, and may be used to manipulate several qubits to make these qubits evolve towards a target state in order to evolve into a final state, that is, the result of quantum computation.

In the present embodiment, the optimized node may refer to the graph node in the quantum connectivity graph whose connectivity greater than the connectivity threshold of the quantum chip to be applied. Wherein, the connectivity may be used to represent the quantity of couplings between qubits and neighboring qubits, and considering the fact that quantum chips in related technologies are usually in a two-dimensional structure, and coupling between qubits is usually achieved through specific coupling structures (e.g., capacitors, inductors, resonant cavities, etc.), it is possible to significantly reduce the ability to modulate the qubits corresponding to that logic bit and thus significantly reduce the accuracy of performing the quantum computation when the connectivity of a graph node in the quantum connectivity graph is greater than the connectivity threshold of the quantum chip to be applied, that is, the limit on the quantity of couplings of the quantum chip to be applied is exceeded. Therefore, it is necessary to optimize the graph node in the quantum connectivity graph whose connectivity is greater than the connectivity threshold of the quantum chip to be applied, that is, it is necessary to determine the graph node in the quantum connectivity graph whose connectivity is greater than the connectivity threshold of the quantum chip to be applied as the optimized node.

In this way, by optimizing the graph node in the quantum connectivity graph with a connectivity greater than the connectivity threshold of the quantum chip to be applied, one qubit executes qubit logic gates with as few neighboring qubits as possible to reduce the effect of the qubit logic gates applied on a plurality of qubits on the qubits, thereby improving the regulation precision of the qubits, such that the effect of qubit logic gates applied on a single qubit in the target quantum algorithm can be more accurately operated on the quantum chip to be applied.

On this basis, in the quantum connectivity graph, it is necessary to optimize the connectivity of the optimized node, that is, by adding auxiliary nodes, some other graph nodes are connected to the auxiliary nodes, wherein the optimized node and the auxiliary nodes are connected through connecting lines. The optimized sub-graph is composed of the structure of the optimized node and the auxiliary nodes connected through connecting lines, and the optimized node and the auxiliary nodes in the optimized sub-graph are collectively referred to as intermediate nodes, and graph nodes out of the optimized sub-graph nodes may be understood as nodes to be assigned. It can be imagined that since the optimized node is replaced with the optimized sub-graph composed of intermediate nodes, the node to be assigned is connected to the optimized node before the replacement, and after the replacement, it is necessary to assign the connecting lines such that the node to be assigned is connected to each intermediate node in the optimized sub-graph.

Step S4120, obtaining a distance matrix of individual nodes to be assigned and a mutual intensity matrix between the individual nodes to be assigned and other nodes to be assigned.

Wherein, the mutual intensity matrix may be used to characterize a node value of a node to be assigned, that is, the importance of the node to be assigned in the overall quantum connectivity graph. It can be understood that, in general, the greater the node value, the higher the priority of the node to be assigned in the quantum algorithm. In addition, the distance matrix may be used to characterize a distance between the node to be assigned and each intermediate node in the optimized sub-graph.

Step S4130: acquiring a weighted distance between the node to be assigned and each intermediate node in the optimized sub-graph according to the mutual intensity matrix and the distance matrix.

Step S4140, assigning and connecting the individual nodes to be assigned to a corresponding target intermediate nodes in the optimized sub-graph on the basis of the mutual intensity matrix according to the weighted distance.

Based on the above steps, in the present embodiment, by obtaining the distance matrix of the individual nodes to be assigned and the mutual intensity matrix between the individual nodes to be assigned and other nodes to be assigned, and then obtaining the weighted distance between the node to be assigned and each intermediate node in the optimized sub-graph according to the mutual intensity matrix and the distance matrix, therefore, assigning and connecting the individual nodes to be assigned to a corresponding target intermediate nodes in the optimized sub-graph on the basis of the mutual intensity matrix according to the weighted distance. In the above assigning way, it is possible to effectively reduce the number of swap gate operations performed when the node to be assigned, which has been assigned, executes the qubit logic gates and thus shorten the running time of the quantum algorithm, therefore improving the execution effect of the algorithm.

Figure 29:
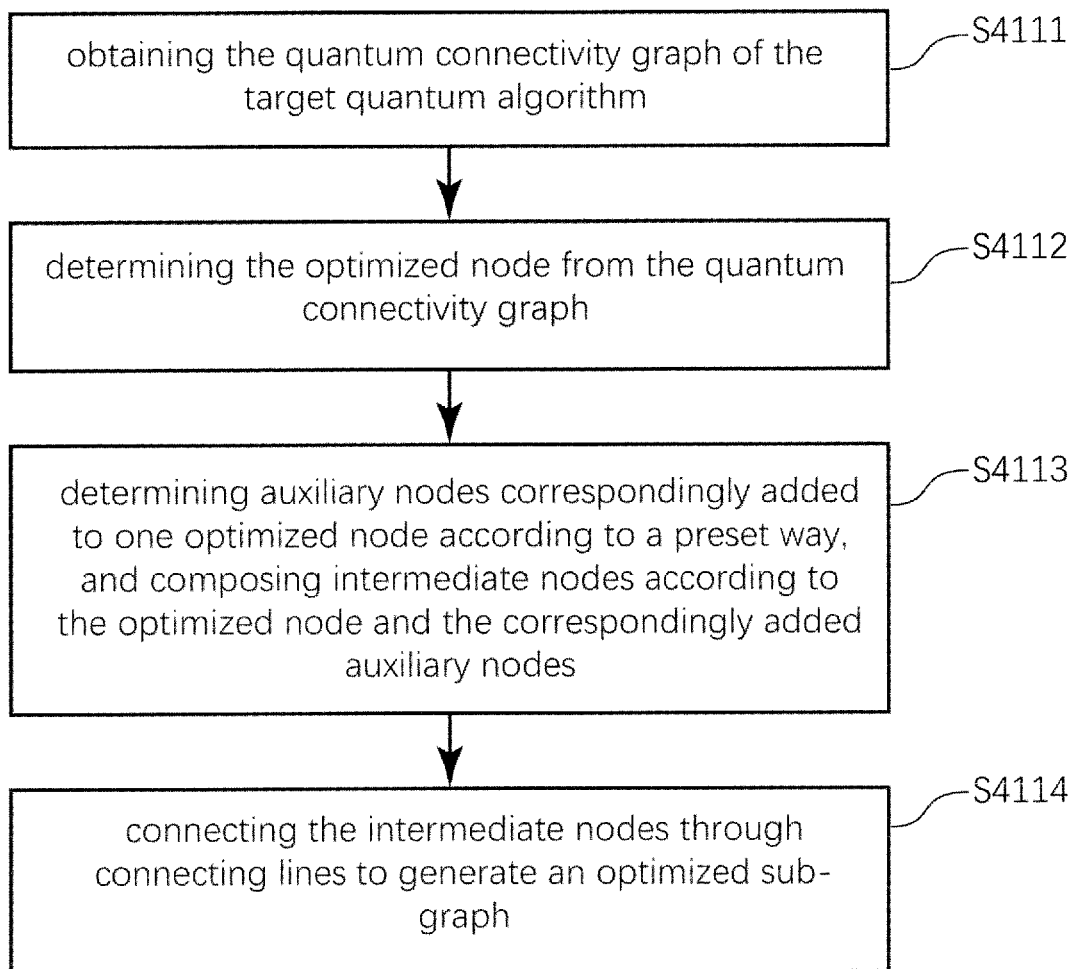
FIG. 29 illustrates a flow diagram of a sub-step of the step S110 in FIG. 1.

In one possible embodiment, for the step S4110, referring to FIG. 29, it may be implemented by the following exemplary embodiment and described in detail below.

Sub-step S4111: obtaining the quantum connectivity graph of the target quantum algorithm.

For example, in one possible embodiment, in the process of obtaining the quantum connectivity graph of the target quantum algorithm, it is possible to acquire the logic bits in the quantum algorithm and the number of qubit logic gates applied on any two quantum bits; then, based on the number of qubit logic gates applied on any two qubits, it is possible to acquire an adjacency matrix reflecting the interaction relationship of the logic bits, which may represent the number of the qubit logic gates applied on any two quantum bits, therefore converting the adjacency matrix to a quantum connectivity graph.

It is to be understood that in other possible embodiments, the quantum connectivity graph of the target quantum algorithm may also be acquired in any other feasible manner. For example, the adjacency matrix reflecting the interaction relationship of the logic bits may be directly acquired to determine the quantum connectivity graph.

Sub-step S4112, determining the optimized node from the quantum connectivity graph.

For example, it is possible to calculate the quantity of connecting lines connected to each graph node in the quantum connectivity graph as the connectivity, and then the graph node whose connectivity is greater than the connectivity threshold in the quantum connectivity graph is determined as the optimized node.

Sub-step S4113, determining auxiliary nodes correspondingly added to one optimized node according to a preset way, and composing intermediate nodes according to the optimized node and the correspondingly added auxiliary nodes.

In the present embodiment, the quantity of added auxiliary nodes may be determined by the preset way, so that a corresponding quantity of auxiliary nodes may be added to form the intermediate nodes with the optimized node. Alternatively, the preset way may be a way of incrementally increasing from a predetermined positive integer value, or may be a way determined based on a predetermined formula, which is not limited.

Step S4140, connecting the intermediate nodes through connecting lines to generate an optimized sub-graph.

In the present embodiment, by connecting the target nodes through connecting lines to generate the target optimized sub-graph, it is necessary to make the connectivity of all target nodes in the target optimized sub-graph not greater than the connectivity threshold.

In this way, it is possible to replace original connection between the optimized node and external nodes to be assigned with each generated optimized sub-graph, and thus effectively reduce the connectivity of the original optimized node, thereby being convenient for improving the execution effect of the algorithm when being applied to the quantum chip subsequently.

In one possible embodiment, for the step S4120, in the process of obtaining a distance matrix of individual nodes to be assigned, for each node to be assigned, it is possible to calculate the distance between the nodes to be assigned and each intermediate node in the optimized sub-graph, and then to arrange each calculated distance as the distance matrix $D_{ml}$ of the nodes to be assigned.

In one possible embodiment, for the step S4120, in the process of obtaining a mutual intensity matrix between the individual nodes to be assigned and other nodes to be assigned, it is possible to obtain an adjacency matrix $w_{ml}$ between the individual nodes to be assigned and other nodes to be assigned. Wherein, the adjacency matrix $w_{ml}$ may be used to represent the number of qubits logic gates applied between the individual nodes to be assigned and other nodes to be assigned.

Secondly, it is possible to obtain a swap frequency matrix $s_{ml}$ between the individual nodes to be assigned and other nodes to be assigned. Wherein, the swap frequency matrix $s_{ml}$ may be used to represent the number of swap gate operations introduced after the nodes to be assigned and each of other nodes to be assigned are respectively connected to the two intermediate nodes directly connected in the optimized sub-graph. For example, assuming that the node A1 to be assigned is connected to the intermediate node A1 in the optimized sub-graph, the node A2 to be assigned is connected to the intermediate node A2 in the optimized sub-graph, and the intermediate node A1 and the intermediate node A2 are directly connected, then the swap frequency matrix $s_{ml}$ may include the quantity of swap gate operations that need to be performed on qubit logic gates for the node A1 to be assigned and the node A2 to be assigned.

On this basis, it is possible to calculate a first weight matrix between a first preset weight and the adjacency matrix $w_{ml}$, and to calculate a second weight matrix between a second preset weight and the swap frequency matrix $s_{ml}$. Wherein, the sum of the first preset weight and the second preset weight is 1. Then, a sum matrix of the first weight matrix and the second weight matrix is determined as the mutual intensity matrix between the node to be assigned and the other nodes to be assigned.

For example, assuming the first preset weight is a and the second preset weight is 1-a, then the mutual intensity matrix $I_{ml} = aw_{ml} + (1-a)s_{ml}$. Wherein, it is worth noting that the first preset weight can be determined by a large quantity of experimental data statistics, for example, in an alternative example, the value of the first preset weight a can be 0.5.

In one possible embodiment, for the step S4130, in the process of acquiring a weighted distance between the node to be assigned and each intermediate node in the optimized sub-graph according to the mutual intensity matrix and the distance matrix, it is possible to determine a matrix product $\Sigma I_{ml} D_{ml}$ of the mutual intensity matrix $\Sigma I_{ml}$ of the node to be assigned, and the distance matrix $D_{ml}$ between the node to be assigned and each intermediate node in the optimized sub-graph, as the weighted distance between the node to be assigned and each intermediate node in the optimized sub-graph.

Figure 30:
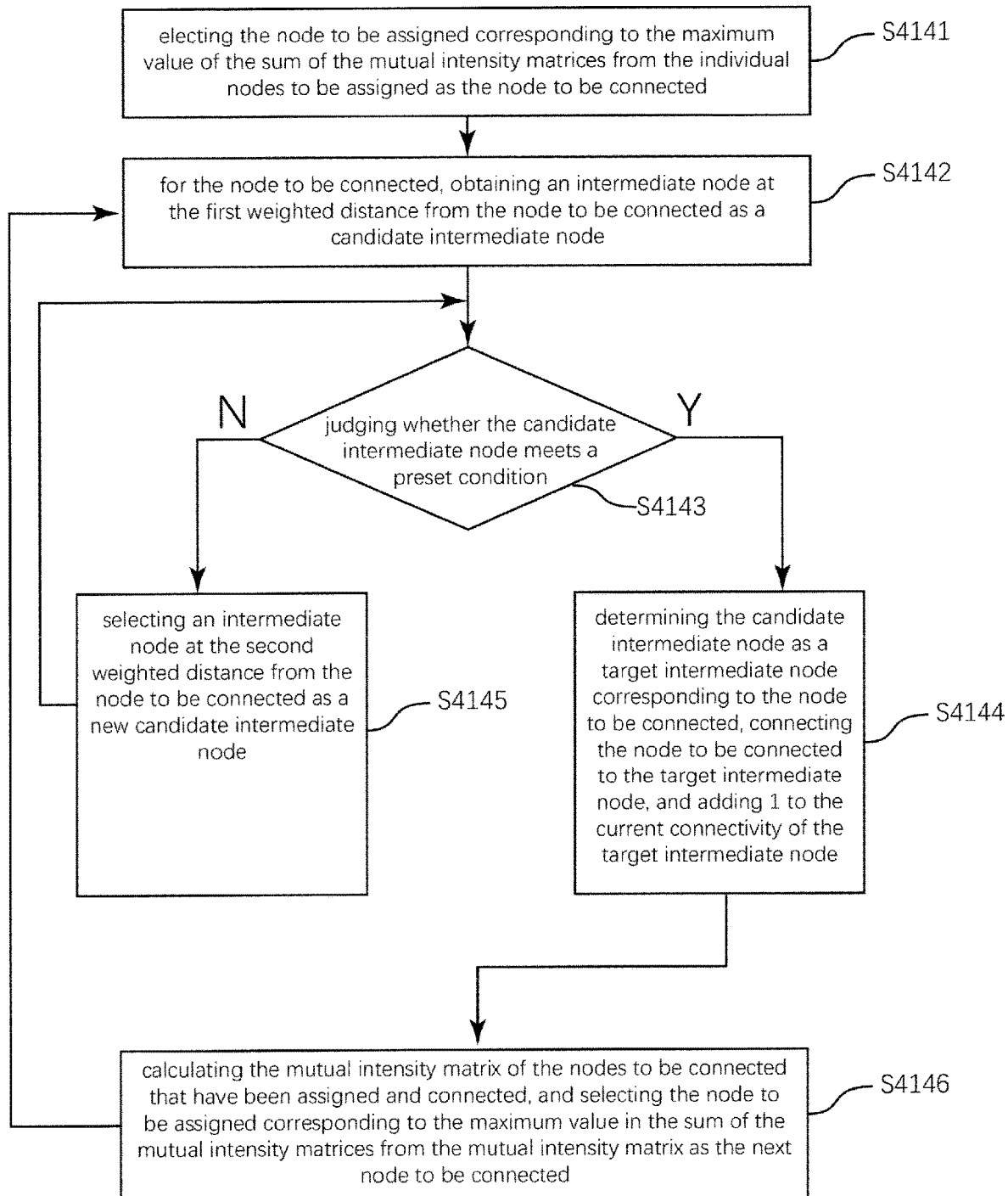
FIG. 30 illustrates a flow diagram of a sub-step of the step S140 in FIG. 1.

Based on the above description, in one possible embodiment, for step S4140, it can be achieved by the following exemplary sub-steps and is described in detail as follows, see FIG. 30.

Sub-step S4141, selecting the node to be assigned corresponding to the maximum value of the sum of the mutual intensity matrices from the individual nodes to be assigned as the node to be connected.

Figure 31:
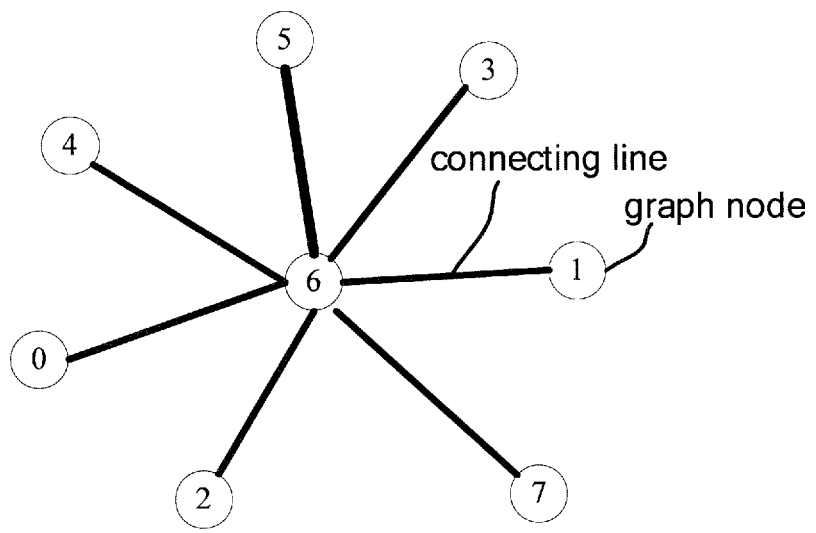
FIG. 31 illustrates a schematic diagram of a quantum connectivity graph to be optimized of an alternative embodiment.

As a possible embodiment of the quantum connectivity graph shown in FIG. 31, the graph node 6 is the optimized node, and needs to be converted to a corresponding optimized sub-graph by adding an auxiliary bit. For example, as shown in FIG. 5, wherein the graph node 8 represents an auxiliary node, and the graph node 6 and the graph node 8 constitute the optimized sub-graph for the optimized node 6.

As shown in FIG. 33, the mutual intensity matrix of the node to be assigned out of the optimized sub-graph is calculated for the quantum connectivity graph of FIG. 5. Wherein, the first column and the first row of the graph both denote individual nodes to be assigned, the second row and the second column both represent the mutual intensity matrix $\Sigma I_{01}$ of the node 0 to be assigned, the third row and the third column both represent the mutual intensity matrix $\Sigma I_{11}$ of the node 1 to be assigned ... and so on. It should be noted that the mutual intensity matrix in the row and the column of the same quantity may be identical and are for the same the node to be assigned.

Based on the mutual intensity matrix of individual nodes to be assigned as shown in FIG. 33, the node to be connected can be determined. For example, the following can be obtained by calculation: the mutual intensity matrix $\Sigma I_{01}=42$ of the node 0 to be assigned, the mutual intensity matrix $\Sigma I_{11}=10$ of the node 1 to be assigned, the mutual intensity matrix $\Sigma I_{21}=45$ of the node 2 to be assigned, the mutual intensity matrix $\Sigma I_{31}=104$ of the node 3 to be assigned, the mutual intensity matrix $\Sigma I_{41}=36$ of the node 4 to be assigned, the mutual intensity matrix $\Sigma I_{51}=93$ of the node 5 to be assigned, and the mutual intensity matrix $\Sigma I_{71}=82$ of the node 7 to be assigned. Therefore, the node 3 to be assigned is first determined as the node to be connected.

Sub-step S4142, for the node to be connected, obtaining an intermediate node at the first weighted distance from the node to be connected as a candidate intermediate node.

As shown in FIG. 5, for the node 3 to be assigned being as the node to be connected obtained in the sub-step S4141, it needs to be assigned and connected to one of the intermediate node 6 and the intermediate node 8. Specifically, calculating the first weighted distance $\Sigma(I_{36}D_{36}, I_{38}D_{38})$ between the node to be connected, and the intermediate node 6 and the intermediate node 8, respectively, and selecting the intermediate node that meets the first weighted distance requirements as the candidate intermediate node. For example, in this calculation, the intermediate node 6 may be selected.

Sub-step S4143, judging whether the candidate intermediate node meets a preset condition.

Wherein, the preset condition may be: the current connectivity of the candidate intermediate node is no larger than the connectivity threshold, and there are no crossed connecting lines in the quantum connectivity graph.

Wherein, it is possible to detect whether the quantum topology graph is a plane graph, that is, to detect whether there is an intersection between the various connecting lines in the quantum topology graph. That is, when there is an intersection between any two connecting lines, it can be determined that there are crossed connecting lines in the quantum topology graph; when there are no intersections between all connecting lines, it can be determined that there are no crossed connecting lines in the quantum connectivity graph.

When the quantum topology graph is not a planar graph, it means that there are crossed connecting lines in the quantum connectivity graph, that is, it is necessary to achieve the cross-coupling in the corresponding quantum chip structure; however, the structure of the actual quantum chip is a two-dimensional lattice structure, and therefore cannot achieve a specific structure corresponding to the cross-coupling between qubits, such that crossed connecting lines need to be absent in the quantum connectivity graph.

When the candidate intermediate node meets the preset condition, the sub-step S4144 is executed, which is specifically described as follows.

Sub-step S4144, determining the candidate intermediate node as a target intermediate node corresponding to the node to be connected, connecting the node to be connected to the target intermediate node, and adding 1 to the current connectivity of the target intermediate node.

As shown in FIG. 3, for the node 3 to be assigned being as the node to be connected obtained in the sub-step S4141, and the intermediate node 6 being as candidate intermediate node 6 obtained in the sub-step S4142, judging that the intermediate node 6 meets the preset condition in the sub-step S4143, and defining the intermediate node 6 as the target intermediate node; then it is possible to connect the node 3 to be assigned to the target intermediate node 6, and after that, it is necessary to add 1 to the current connectivity of the target intermediate node 6. For example, before the node 3 to be assigned is not connected to the target intermediate node 6, the connectivity of the target intermediate node 6 is 1, and then after the connection, the current connectivity of the target intermediate node 6 is 2. After the node 3 to be assigned is connected to the target intermediate node 6, it also needs to continue with the connection fort other nodes to be assigned and the target intermediate node.

When the candidate intermediate node does not meet the preset condition, the sub-step S4145 is executed, which is specifically described as follows.

Sub-step 4145, selecting an intermediate node at the second weighted distance from the node to be connected as a new candidate intermediate node, and returning to the sub-step S4143. In this process, continuing to repeat the above steps until a candidate intermediate node with the Nth weighted distance from the node to be connected satisfying the preset condition is obtained, then determining the candidate intermediate node as the target intermediate node corresponding to the node to be connected, connecting the node to be connected to the target intermediate node, and adding 1 to the current connectivity of the target intermediate node.

It should be noted that whenever the target intermediate node is connected with one node to be assigned, the current connectivity of the target intermediate node is incremented by 1, and when the current connectivity of the target intermediate node reaches the requirement of the connectivity threshold, other nodes to be assigned cannot be assigned and connected to the target intermediate node, but need to be assigned and connected to other target intermediate nodes. The next target intermediate node is determined by the set second weighted distance.

Figure 32:
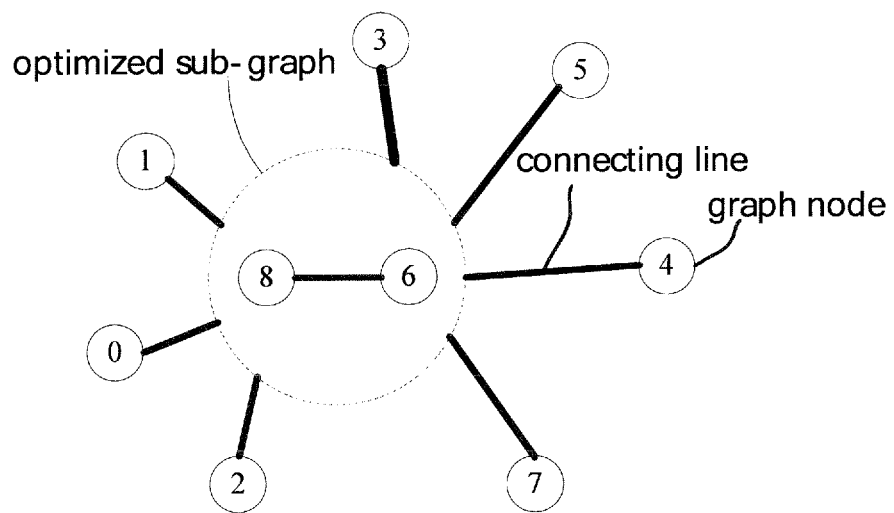
FIG. 32 illustrates a schematic diagram of a quantum connectivity graph including an optimized sub-graph corresponding to optimized nodes of an alternative embodiment.

Taking FIG. 32 as an example, after a quantity of the nodes to be assigned are assigned and connected to the target intermediate node 6, other nodes to be assigned need to be assigned and connected to the target intermediate node 8 when the current connectivity reaches the requirement of the connectivity threshold.

Sub-step S146, calculating the mutual intensity matrix of the nodes to be connected that have been assigned and connected, and selecting the node to be assigned corresponding to the maximum value in the sum of the mutual intensity matrices from the mutual intensity matrix as the next node to be connected, and returning to execute the sub-step S142.

With the step S144, after the node to be assigned is connected to the target intermediate node, it is necessary to assign and connect other nodes to be assigned. When selecting the next node to be assigned, it is necessary to preferentially consider the mutual intensity matrix of the nodes to be connected that have been assigned and connected, and select the node to be assigned corresponding to the maximum value in the sum of the mutual intensity matrices as the next node to be connected, that is, the interaction intensity between the next the node to be assigned and the nodes to be connected which have been assigned and connected is high (the quantity of applied quantum logic gates is large). In this way, it is possible to avoid two nodes to be assigned with high interaction intensity being connected to different target intermediate nodes, and when performing quantum logic gate operations for the logic bits corresponding to the two nodes to be assigned, it can be done directly without adding a large quantity of swap gates, which reduces the running time of the quantum algorithm and improves the accuracy of the quantum algorithm.

As shown in FIGS. 33 and 34, for example, after the node 3 to be assigned is connected to the target intermediate node 6, calculating the sum of the mutual intensity matrices of the node 3. It should be noted that there is only one node 3 at this point. The mutual intensity matrix of the node 3 is only column 5 or row 5 in FIG. 33, and it can be intuitively seen that the maximum value in the matrix in this column is 35, corresponding to the node 5 to be assigned, that is, determining the node 5 to be assigned as the next node to be assigned, returning to the sub-step S4142, and in turn executing the next steps to also assign and connect the node 5 to be assigned to the target node 6.

As shown in FIG. 35, when there are two assigned nodes to be connected, namely the node 3 and the node 5, it is necessary to sum the mutual intensity matrix of the node 3 and the node 5 when selecting the next node to be assigned. For example, the mutual intensity matrix in the fifth row corresponding to the node 3 is summed with the mutual intensity matrix in the seventh row corresponding to the node 5, or the mutual intensity matrix in the fifth column corresponding to the node 3 is summed with the mutual intensity matrix in the seventh column corresponding to the node 5, so as to obtain the sum of the mutual intensity matrices of the node 3 and the node 5, and in turn selecting the node corresponding to the maximum value in the sum of the mutual intensity matrices as the next node to be assigned, that is, the node 7 to be assigned.

By that analogy, when there are assigned N nodes to be connected, it is necessary to sum the mutual intensity matrix of the assigned N nodes to be connected, and to select the node corresponding to the maximum value in mutual intensity matrices obtained by summing as the next node to be assigned.

Figure 36:
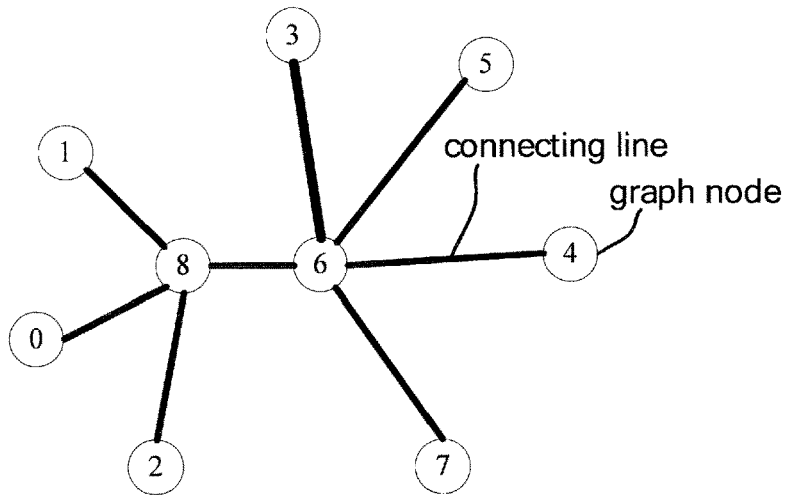
FIG. 36 illustrates a schematic diagram of an optimized quantum connectivity graph of an alternative embodiment.

As shown in FIG. 36, according to the above determining method of the node to be assigned and the connecting method of the node to be assigned and the target intermediate node, the quantum connectivity graph shown in FIG. 31 is optimized to obtain the result shown in FIG. 36.

Wherein, the first weighted distance, the second weighted distance, . . . , the Nth weighted distance increase in order, that is, the first weighted distance, the second weighted distance, . . . , the Nth weighted distance are traversed in order from smallest to largest. In this way, according to the above assigning method, it is possible to assign the nodes to be connected with higher importance to the intermediate nodes with shorter weighted distances for connecting lines connections as much as possible, and to calculate the sum of the mutual intensity matrices for the nodes to be connected that have been assigned and connected and select the next node to be connected, which may minimize the application of swap gates so as to effectively reduce the number of swap gate operations of the assigned node to be assigned when performing the qubit logic gates, therefore shortening the running time of the quantum algorithm and improving the execution effect of the algorithm. In addition, in some other possible embodiments, for the sub-step S141, it is also possible to select one node to be assigned from individual nodes to be assigned as the node to be connected in the order of the size of the mutual intensity matrices.

Figure 37:
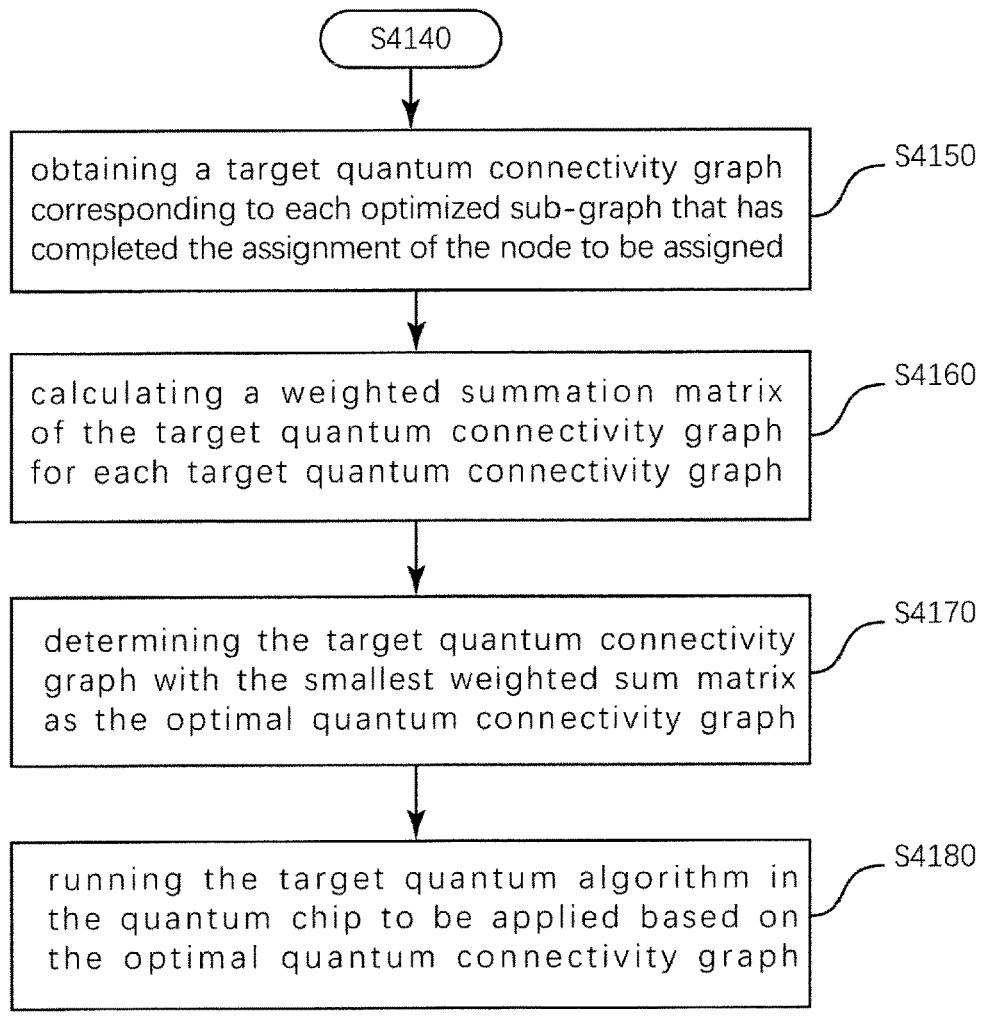
FIG. 37 illustrates a second flow diagram of a quantum connectivity graph optimization method provided by an embodiment of the present disclosure.

As shown in FIG. 37, in one possible embodiment, after the above step S4140, considering that the optimized subgraph is generally not limited to one, the finally generated target quantum connectivity graph is not limited to one. In order to screen the optimal target quantum connectivity graph to achieve the best algorithm execution effect, the quantum connectivity graph optimization method provided by the embodiments of the present disclosure may further include the following steps, which are described in detail as follows.

Step S4150, obtaining a target quantum connectivity graph corresponding to each optimized sub-graph that has completed the assignment of the node to be assigned.

In the present embodiment, after completing the assignment of each node to be assigned and the intermediate nodes in the optimized sub-graph, the corresponding target quantum connectivity graph may be generated, that is, the target quantum connectivity graph is composed of each node to be assigned, the intermediate nodes in the optimized sub-graph as well as a connecting line between each node to be assigned and a corresponding intermediate node.

Step S4160, calculating a weighted summation matrix of the target quantum connectivity graph for each target quantum connectivity graph.

In the present embodiment, the weighted sum matrix of the target quantum connectivity graph may be a weighted sum value $\Sigma_{ml} D_{ml} I_{ml}$ of the distance matrix $D_{ml}$ and mutual intensity matrix $I_{ml}$ between individual nodes to be assigned and other nodes to be assigned in the target quantum connectivity graph.

Step S4170, determining the target quantum connectivity graph with the smallest weighted sum matrix as the optimal quantum connectivity graph.

Step S4180, running the target quantum algorithm in the quantum chip to be applied based on the optimal quantum connectivity graph.

Figure 38:
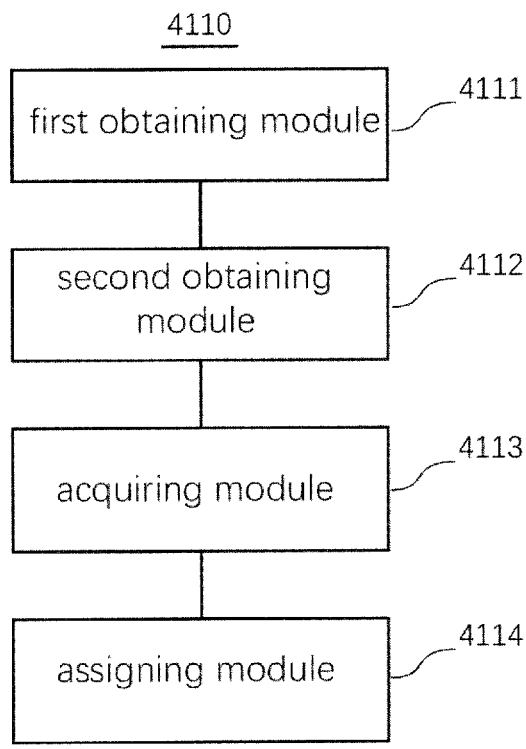
FIG. 38 illustrates a schematic diagram of functional modules of a quantum connectivity graph optimization apparatus provided by an embodiment of the present disclosure.

Based on the same inventive concept, see FIG. 38, it shows a schematic diagram of functional modules of a quantum connectivity graph optimization apparatus 4110 provided by embodiments of the present disclosure. This embodiment may divide the functional modules of the quantum connectivity graph optimization apparatus 4110 according to the method implementation described above. For example, it is possible to divide individual functional modules corresponding to individual functions, or it is possible to integrate two or more functions in a single processing module. The integrated module may be implemented either in the form of hardware or in the form of a software function module. It should be noted that the division of modules in the embodiments of the present disclosure is schematic and is only a logical functional division, and that another division may be used in practical implementation. For example, in the case of dividing individual functional modules corresponding to individual functions, the quantum connectivity graph optimization apparatus 4110 shown in FIG. 38 is only a schematic diagram of an apparatus. Wherein, the quantum connectivity graph optimization apparatus 4110 may include a first obtaining module 4111, a second obtaining module 4112, an acquiring module 4113 and an assigning module 4114. The functions of individual functional modules of the quantum connectivity graph optimization apparatus 4110 are described in detail below.

The first obtaining module 4111 is configured to obtain at least one optimized sub-graph for each optimized node in the quantum connectivity graph of the target quantum algorithm, wherein the optimized node refers to the graph node in the quantum connectivity graph whose connectivity greater than the connectivity threshold of the quantum chip to be applied, and in the quantum connectivity graph, the intermediate nodes are graph nodes in the optimized sub-graph, and the nodes to be assigned are graph nodes out of the optimized sub-graph. It is to be understood that the first obtaining module 4111 may be used to perform the above step S4110 and the details of the implementation of the first obtaining module 4111 may be found above in relation to step S4110.

The second obtaining module 4112 is configured to obtain a distance matrix of individual nodes to be assigned and a mutual intensity matrix between the individual nodes to be assigned and other nodes to be assigned. Wherein, the mutual intensity matrix is used to characterize a node value of a node to be assigned, and the distance matrix is used to characterize a distance between the node to be assigned and each intermediate node in the optimized sub-graph. It is to be understood that the second obtaining module 4112 may be used to perform the above step S4110 and the details of the implementation of the second obtaining module 4112 may be found above in relation to step S4120.

The acquiring module 4113 is configured to acquire a weighted distance between the node to be assigned and each intermediate node in the optimized sub-graph according to the mutual intensity matrix and the distance matrix. It is to be understood that the acquiring module 4113 may be used to perform the above step S4130 and the details of the implementation of the second acquiring module 4113 may be found above in relation to step S4130.

The assigning module 4114 is configured to assign and connect the individual nodes to be assigned to a corresponding target intermediate nodes in the optimized sub-graph on the basis of the mutual intensity matrix according to the weighted distance. It is to be understood that the acquiring module 4114 may be used to perform the above step S41340 and the details of the implementation of the second acquiring module 4113 may be found above in relation to step S4130.

In one possible embodiment, the first obtaining module 4111 is specifically configured that:
  obtaining a quantum connectivity graph of a target quantum algorithm which includes a plurality of graph nodes and connecting lines between two graph nodes, wherein the graph nodes are used to represent logic bits in the target quantum algorithm, and the connecting lines are used to represent qubit logic gates between two logic bits;
  determining the optimized node from the quantum connectivity graph, wherein the optimized node refers to the graph node in the quantum connectivity graph whose connectivity greater than the connectivity threshold of the quantum chip to be applied;
  determining auxiliary nodes correspondingly added to one optimized node according to a preset way, and composing intermediate nodes according to the optimized node and the correspondingly added auxiliary nodes;
  connecting the intermediate nodes through connecting lines to generate an optimized sub-graph, wherein the connectivity of all target nodes in the target optimized sub-graph is not greater than the connectivity threshold.

In one possible embodiment, the second obtaining module 112 is specifically configured that:
  calculating the distance between the nodes to be assigned and each intermediate node in the optimized sub-graph for each node to be assigned;
  arranging each calculated distance as the distance matrix of the nodes to be assigned.

In one possible embodiment, the second obtaining module 112 is specifically configured that:

obtaining an adjacency matrix between the individual nodes to be assigned and other nodes to be assigned, the adjacency matrix is used to represent the number of qubits logic gates applied between the individual nodes to be assigned and other nodes to be assigned;

obtaining a swap frequency matrix between the individual nodes to be assigned and other nodes to be assigned, the swap frequency matrix is used to represent the number of swap gate operations introduced after the nodes to be assigned and each of other nodes to be assigned are respectively connected to the two intermediate nodes directly connected in the optimized sub-graph;

calculating a first weight matrix between a first preset weight and the adjacency matrix, and calculating a second weight matrix between a second preset weight and the swap frequency matrix, wherein, the sum of the first preset weight and the second preset weight is 1;

determining a sum matrix of the first weight matrix and the second weight matrix as the mutual intensity matrix between the node to be assigned and the other nodes to be assigned.

In one possible embodiment, the acquiring module 113 is specifically configured that:

determining a matrix product of the mutual intensity matrix of the node to be assigned, and the distance matrix between the node to be assigned and each intermediate node in the optimized sub-graph, as the weighted distance between the node to be assigned and each intermediate node in the optimized sub-graph.

In one possible embodiment, the assigning module 114 is specifically configured that:

selecting the node to be assigned corresponding to the maximum value of the sum of the mutual intensity matrix from the individual nodes to be assigned as the node to be connected;

for the node to be connected, obtaining an intermediate node at the first weighted distance from the node to be connected as a candidate intermediate node;

judging whether the candidate intermediate node meets a preset condition, wherein the preset condition is that the current connectivity of the candidate intermediate node is no larger than the connectivity threshold, and there are no crossed connecting lines in the quantum connectivity graph.

when the candidate intermediate node meets the preset condition, determining the candidate intermediate node as a target intermediate node corresponding to the node to be connected, connecting the node to be connected to the target intermediate node, and adding 1 to the current connectivity of the target intermediate node;

when the candidate intermediate node does not meet the preset condition, selecting an intermediate node at the second weighted distance from the node to be connected as a new candidate intermediate node, and returning to the step of judging whether the candidate intermediate node meets a preset condition until a candidate intermediate node with the Nth weighted distance from the node to be connected satisfying the preset condition is obtained, determining the candidate intermediate node as the target intermediate node corresponding to the node to be connected, connecting the node to be connected to the target intermediate node, and adding 1 to the current connectivity of the target intermediate node wherein, the first weighted distance, . . . , the Nth weighted distance increase in order;

calculating the mutual intensity matrix of the nodes to be connected that have been assigned and connected, and selecting the node to be assigned corresponding to the maximum value in the sum of the mutual intensity matrices from the mutual intensity matrix as the next node to be connected, and returning to the step of for the node to be connected, obtaining an intermediate node at the first weighted distance from the node to be connected as a candidate intermediate node.

In one possible embodiment, the quantum connectivity graph optimization apparatus 4110 further includes an algorithm running module, which is specifically configured that:

obtaining a target quantum connectivity graph corresponding to each optimized sub-graph that has completed the assignment of the node to be assigned;

calculating a weighted summation matrix of the target quantum connectivity graph for each target quantum connectivity graph, the weighted sum matrix is a weighted sum value of the distance matrix and mutual intensity matrix between individual nodes to be assigned and other nodes to be assigned in the target quantum connectivity graph;

determining the target quantum connectivity graph with the smallest weighted sum matrix as the optimal quantum connectivity graph;

running the target quantum algorithm in the quantum chip to be applied based on the optimal quantum connectivity graph.

Based on the same inventive concept, see FIG. 19, it shows a schematic block diagram of the structure of the computer terminal 300 for executing the above quantum connectivity graph optimization method provided by embodiments of the present disclosure. The computer terminal 300 may include a quantum connectivity graph optimization apparatus 310, a machine-readable storage medium 320 and a processor 330.

In the present embodiment, the machine-readable storage medium 320 and the processor 330 are located in the computer terminal 300 and are provided separately. However, it should be understood that the machine-readable storage medium 320 may also be independent of the computer terminal 300, and may be accessed by the processor 330 through a bus interface. Alternatively, the machine-readable storage medium 320 may also be integrated into the processor 330, for example, may be a cache and/or a general-purpose register.

The quantum connectivity graph optimization apparatus 310 may include software functional modules stored in the machine-readable storage medium 320 (such as the first obtaining module 4111, the second obtaining module 4112, the acquiring module 4113 and the assigning module 1113 as shown in FIG. 38), and when the processor 330 executes the software functional modules in the quantum connectivity graph optimization apparatus 310, it is possible to implement the quantum connectivity graph optimization method provided by the aforementioned method embodiment.

Since the computer terminal 300 provided by the embodiment of the present disclosure is another embodiment of the quantum connectivity graph optimization method executed by the above computer terminal 300, and the computer terminal 300 may be used to execute the quantum connectivity graph optimization method provided by the above method embodiment, the technical effect it can obtain may refer to the above method embodiment, which will not be repeated herein.

Based on the shortcomings of prior arts, the present disclosure provide a quantum connectivity graph optimization method, an apparatus, a terminal, and a storage medium, which can effectively reduce the number of swap gate operations of the assigned node to be assigned when performing the qubit logic gates, therefore shortening the running time of the quantum algorithm and improving the execution effect of the algorithm.

G1. A quantum connectivity graph optimization method, characterized by including:
  obtaining at least one optimized sub-graph for each optimized node in the quantum connectivity graph of the target quantum algorithm, wherein the optimized node refers to the graph node in the quantum connectivity graph whose connectivity greater than the connectivity threshold of the quantum chip to be applied, and in the quantum connectivity graph, the intermediate nodes are graph nodes in the optimized sub-graph, and the nodes to be assigned are graph nodes out of the optimized sub-graph;
  obtaining a distance matrix of individual nodes to be assigned and a mutual intensity matrix between the individual nodes to be assigned and other nodes to be assigned, wherein, the mutual intensity matrix is used to characterize a node value of a node to be assigned, and the distance matrix is used to characterize a distance between the node to be assigned and each intermediate node in the optimized sub-graph;
  acquiring a weighted distance between the node to be assigned and each intermediate node in the optimized sub-graph according to the mutual intensity matrix and the distance matrix;
  assigning and connecting the individual nodes to be assigned to a corresponding target intermediate nodes in the optimized sub-graph on the basis of the mutual intensity matrix according to the weighted distance.

G2. The quantum connectivity graph optimization method of G1, characterized in that the step of obtaining at least one optimized sub-graph for each optimized node in the quantum connectivity graph of the target quantum algorithm, includes:
  obtaining a quantum connectivity graph of a target quantum algorithm which includes a plurality of graph nodes and connecting lines between two graph nodes, wherein the graph nodes are used to represent logic bits in the target quantum algorithm, and the connecting lines are used to represent qubit logic gates between two logic bits;
  determining the optimized node from the quantum connectivity graph, wherein the optimized node refers to the graph node in the quantum connectivity graph whose connectivity greater than the connectivity threshold of the quantum chip to be applied;
  determining auxiliary nodes correspondingly added to one optimized node according to a preset way, and composing intermediate nodes according to the optimized node and the correspondingly added auxiliary nodes;
  connecting the intermediate nodes through connecting lines to generate an optimized sub-graph, wherein the connectivity of all target nodes in the target optimized sub-graph is not greater than the connectivity threshold.

G3. The quantum connectivity graph optimization method of G1 or G2, characterized in that the step of obtaining a distance matrix of individual nodes to be assigned, includes:
  calculating the distance between the nodes to be assigned and each intermediate node in the optimized sub-graph for each node to be assigned;
  arranging each calculated distance as the distance matrix of the nodes to be assigned.

G4. The quantum connectivity graph optimization method of G1 to G3, characterized in that the step of obtaining a mutual intensity matrix between the individual nodes to be assigned and other nodes to be assigned, includes:
  obtaining an adjacency matrix between the individual nodes to be assigned and other nodes to be assigned, the adjacency matrix is used to represent the number of qubits logic gates applied between the individual nodes to be assigned and other nodes to be assigned;
  obtaining a swap frequency matrix between the individual nodes to be assigned and other nodes to be assigned, the swap frequency matrix is used to represent the number of swap gate operations introduced after the nodes to be assigned and each of other nodes to be assigned are respectively connected to the two intermediate nodes directly connected in the optimized sub-graph;
  calculating a first weight matrix between a first preset weight and the adjacency matrix, and calculating a second weight matrix between a second preset weight and the swap frequency matrix, wherein, the sum of the first preset weight and the second preset weight is 1;
  determining a sum matrix of the first weight matrix and the second weight matrix as the mutual intensity matrix between the node to be assigned and the other nodes to be assigned.

G5. The quantum connectivity graph optimization method of G1 to G4, characterized in that the step of acquiring a weighted distance between the node to be assigned and each intermediate node in the optimized sub-graph according to the mutual intensity matrix and the distance matrix, includes:
  determining a matrix product of the mutual intensity matrix of the node to be assigned, and the distance matrix between the node to be assigned and each intermediate node in the optimized sub-graph, as the weighted distance between the node to be assigned and each intermediate node in the optimized sub-graph.

G6. The quantum connectivity graph optimization method of G1 to G5, characterized in that the step of assigning and connecting the individual nodes to be assigned to a corresponding target intermediate nodes in the optimized sub-graph on the basis of the mutual intensity matrix according to the weighted distance, includes:
  selecting the node to be assigned corresponding to the maximum value of the sum of the mutual intensity matrix from the individual nodes to be assigned as the node to be connected;
  for the node to be connected, obtaining an intermediate node at the first weighted distance from the node to be connected as a candidate intermediate node;
  judging whether the candidate intermediate node meets a preset condition, wherein the preset condition is that the current connectivity of the candidate intermediate node is no larger than the connectivity threshold, and there are no crossed connecting lines in the quantum connectivity graph.
  when the candidate intermediate node meets the preset condition, determining the candidate intermediate node as a target intermediate node corresponding to the node to be connected, connecting the node to be connected to the target intermediate node, and adding 1 to the current connectivity of the target intermediate node;
  when the candidate intermediate node does not meet the preset condition, selecting an intermediate node at the second weighted distance from the node to be connected as a new candidate intermediate node, and returning to the step of judging whether the candidate intermediate node meets a preset condition until a candidate intermediate node with the Nth weighted distance from the node to be connected satisfying the preset condition is obtained, determining the candidate intermediate node as the target intermediate node corresponding to the node to be connected, connecting the node to be connected to the target intermediate node, and adding 1 to the current connectivity of the target intermediate node wherein, the first weighted distance, . . . , the Nth weighted distance increase in order;

calculating the mutual intensity matrix of the nodes to be connected that have been assigned and connected, and selecting the node to be assigned corresponding to the maximum value in the sum of the mutual intensity matrices from the mutual intensity matrix as the next node to be connected, and returning to the step of for the node to be connected, obtaining an intermediate node at the first weighted distance from the node to be connected as a candidate intermediate node.

G7. The quantum connectivity graph optimization method of G1 to G6, characterized in that after the step of connecting the intermediate nodes through connecting lines to generate an optimized sub-graph, wherein the connectivity of all target nodes in the target optimized sub-graph is not greater than the connectivity threshold, the method includes:

obtaining a target quantum connectivity graph corresponding to each optimized sub-graph that has completed the assignment of the node to be assigned;

calculating a weighted summation matrix of the target quantum connectivity graph for each target quantum connectivity graph, the weighted sum matrix is a weighted sum value of the distance matrix and mutual intensity matrix between individual nodes to be assigned and other nodes to be assigned in the target quantum connectivity graph;

determining the target quantum connectivity graph with the smallest weighted sum matrix as the optimal quantum connectivity graph;

running the target quantum algorithm in the quantum chip to be applied based on the optimal quantum connectivity graph.

G8. A quantum connectivity graph optimization apparatus, characterized in that the apparatus includes:

a first obtaining module configured to obtain at least one optimized sub-graph for each optimized node in the quantum connectivity graph of the target quantum algorithm, wherein the optimized node refers to the graph node in the quantum connectivity graph whose connectivity greater than the connectivity threshold of the quantum chip to be applied, and in the quantum connectivity graph, the intermediate nodes are graph nodes in the optimized sub-graph, and the nodes to be assigned are graph nodes out of the optimized sub-graph;

a second obtaining module configured to obtain a distance matrix of individual nodes to be assigned and a mutual intensity matrix between the individual nodes to be assigned and other nodes to be assigned, wherein, the mutual intensity matrix is used to characterize a node value of a node to be assigned, and the distance matrix is used to characterize a distance between the node to be assigned and each intermediate node in the optimized sub-graph;

an acquiring module configured to acquire a weighted distance between the node to be assigned and each intermediate node in the optimized sub-graph according to the mutual intensity matrix and the distance matrix;

an assigning module configured to assign and connect the individual nodes to be assigned to a corresponding target intermediate nodes in the optimized sub-graph on the basis of the mutual intensity matrix according to the weighted distance.

G9. A computer terminal, characterized by including a machine-readable storage medium and a processor, the machine-readable storage medium stores a computer program therein, and the processor is configured to run the computer program to execute the quantum connectivity graph optimization method of any one of G1 to G7.

G10. A computer readable storage medium, characterized in that the computer readable storage medium stores a computer program therein, and the computer program is configured, when executed by a computer, to implement the quantum connectivity graph optimization method of any one of G1 to G7.

Based on any of the above, in the present disclosure, by obtaining the distance matrix of the individual nodes to be assigned and the mutual intensity matrix between the individual nodes to be assigned and other nodes to be assigned, and then obtaining the weighted distance between the node to be assigned and each intermediate node in the optimized sub-graph according to the mutual intensity matrix and the distance matrix, therefore, assigning and connecting the individual nodes to be assigned to a corresponding target intermediate nodes in the optimized sub-graph on the basis of the mutual intensity matrix according to the weighted distance. In the above assigning way, it is possible to effectively reduce the number of swap gate operations performed when the node to be assigned, which has been assigned, executes the qubit logic gates and thus shorten the running time of the quantum algorithm, therefore improving the execution effect of the algorithm.

Figure 39:
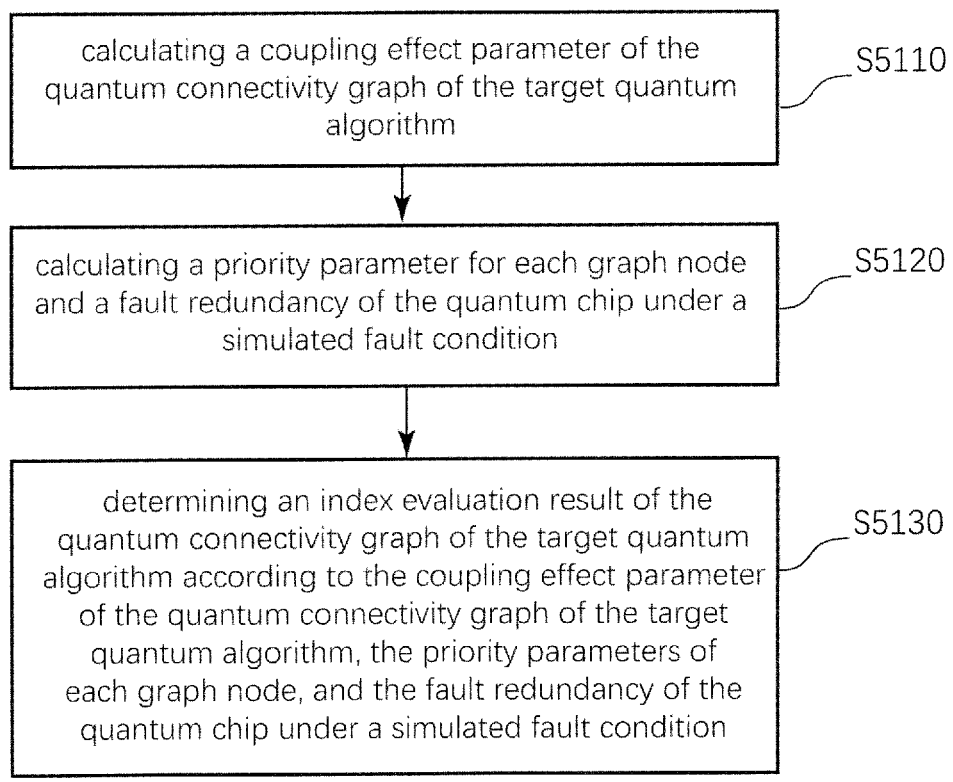
FIG. 39 illustrates a flow diagram of an index evaluation method of a quantum algorithm provided by an embodiment of the present disclosure.

Referring to FIG. 39, it shows an interaction flow diagram of an index evaluation method of a quantum algorithm provided by the embodiment of the present disclosure. It should be understood that in other embodiments, the order of some of steps in the index evaluation method of the quantum algorithm of the present embodiment can be swapped according to actual needs, or some of the steps can also be omitted or deleted. The detailed steps of the index evaluation method of the quantum algorithm are described below.

Step S5110, calculating a coupling effect parameter of the quantum connectivity graph of the target quantum algorithm.

In the present embodiment, the quantum connectivity graph may include a plurality of graph nodes and connecting lines between two graph nodes, wherein the graph nodes may be used to represent logic bits in the target quantum algorithm, and the connecting lines may be used to represent qubit logic gates between two logic bits.

Wherein, the quantum connectivity graph can be obtained based on the logic bits in the target quantum algorithm and the number of qubit logic gates applied on any two qubits. Wherein, the qubits may refer to a physical system that can be in a ground state $|0\rangle$, an excited state $|1\rangle$ and a superposition state $(\alpha|0\rangle+\beta|1\rangle)$ at the same time. Mathematically, the qubits can be represented by vectors of states on Hilbert space. Quantum circuits are implemented by manipulating several qubits at the same time.

A quantum circuit is a representation of a quantum program that can be consisted of a sequence of qubits initially located in the |0> state and a quantity of subsequent quantum logic gates, and terminated by a measurement operation (not necessarily every bit needs to be measured). Typically, each quantum program can eventually be decomposed into a quantum program consisting only of a sequence of elementary quantum logic gates. In addition, the qubit logic gates may refer to some reversible unitary transformations, and may be used to manipulate several qubits to make these qubits evolve towards a target state in order to evolve into a final state, that is, the result of quantum computation.

In the present embodiment, quantum chips in related technologies are usually in a two-dimensional structure, and coupling between qubits is usually achieved through specific coupling structures (e.g., capacitors, inductors, resonant cavities, etc.). Therefore, the coupling effect parameter of the quantum connectivity graph can be used to characterize the coupling effect of the actual coupling structure between the corresponding quantum bits in the subsequent quantum chip.

Step S5120, calculating a priority parameter for each graph node and a fault redundancy of the quantum chip under a simulated fault condition.

In the present embodiment, the priority parameter for each graph node may be used to characterize the priority value of the quantum bit corresponding to the graph node in the process of participating in the operation of the quantum algorithm. Specifically, the priority parameter for each graph node may be used to characterize the quantity of qubit logic gates applied on the graph node. For example, for one quantum chip, there may be several graph nodes that have more qubit logic gates applied on them than any other node, and the priority of these graph nodes is obviously more important than other graph nodes, that is, the priority parameters of these graph nodes are ranked higher than other graph nodes. Based on this, the priority parameter of the graph node will give a vector to describe the priority of the individual graph nodes, which can give some guidance for the subsequent processing of quantum chips. For example, if a graph node has a high priority, then when processing quantum chips, it may focus on ensuring the fidelity of the qubits corresponding to the graph node, while relatively reducing the process requirements of the parameters of the qubits corresponding to other graph nodes.

In addition, in the present embodiment, considering that a certain qubit may fail in the manufacturing process of the quantum chip, if the quantum chip may have a certain degree of fault redundancy after the failure, for example, if the faulty bits can be replaced by other quantum bits, then it indicates that the quantum chip has high fault tolerance rate and large fault redundancy.

Step S5130, determining an index evaluation result of the quantum connectivity graph of the target quantum algorithm according to the coupling effect parameter of the quantum connectivity graph of the target quantum algorithm, the priority parameters of each graph node, and the fault redundancy of the quantum chip under a simulated fault condition.

In the present embodiment, after obtaining the coupling effect parameter of the quantum connectivity graph of the target quantum algorithm, the priority parameters of each graph node, and the fault redundancy of the quantum chip under a simulated fault condition, the index evaluation result of the quantum connectivity graph of the target quantum algorithm may be generated according to a pre-designed index evaluation rule, and the specific index evaluation rule may be flexibly configured based on actual design requirements.

Based on the above steps, in the present embodiment, calculating the coupling effect parameter of the quantum connectivity graph of the target quantum algorithm, the quantum connectivity graph include a plurality of graph nodes and connecting lines between two graph nodes, the graph nodes is used to represent logic bits in the target quantum algorithm, and the connecting lines is used to represent qubit logic gates between two logic bits, and then calculating a priority parameter for each graph node and a fault redundancy of the quantum chip under a simulated fault condition, and determining an index evaluation result of the quantum connectivity graph of the target quantum algorithm according to the coupling effect parameter of the quantum connectivity graph of the target quantum algorithm, the priority parameters of each graph node, and the fault redundancy of the quantum chip under a simulated fault condition. In this way, it is possible to effectively evaluate the algorithm operation effect of the quantum chip, so as to provide data support for the subsequent design of the quantum chip.

Figure 40:
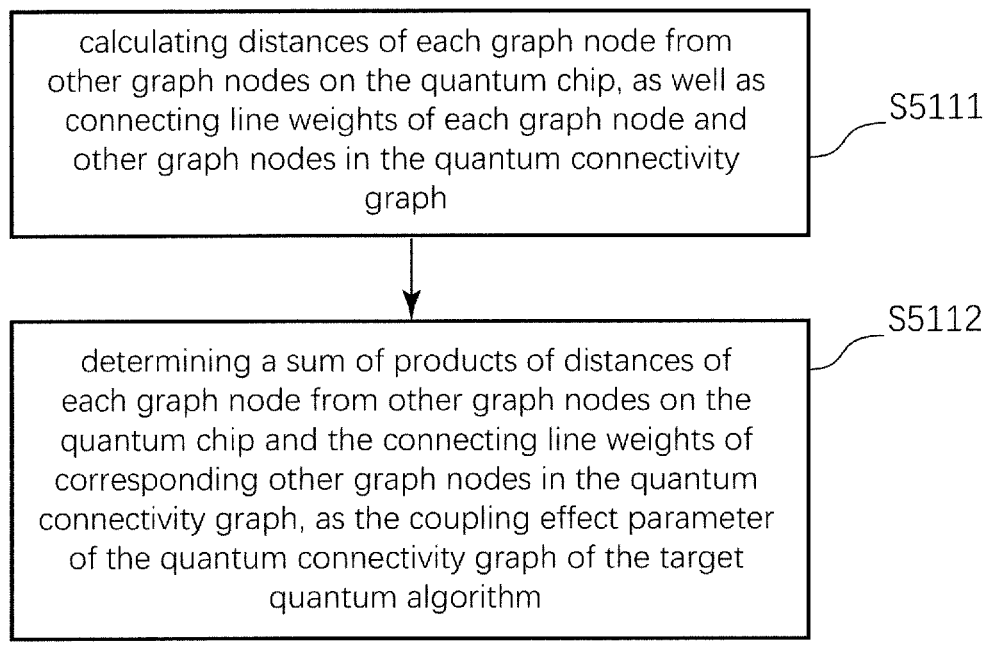
FIG. 40 illustrates a flow diagram of a sub-step of the step S110 shown in FIG. 1.

In one possible embodiment, for the step S5110, regarding a method of calculating the coupling effect parameter of the quantum connectivity graph of the target quantum algorithm, see FIG. 40, it may be implemented by the following sub-steps, and described in detail below.

Sub-step S5111, calculating distances of each graph node from other graph nodes on the quantum chip, as well as connecting line weights of each graph node and other graph nodes in the quantum connectivity graph.

For example, in the present embodiment, it is possible to calculate the quantity of qubit logic gates applied between each graph node and other graph nodes to obtain the connecting line weight in the quantum connectivity graph.

Step-step S5112, determining a sum of products of distances of each graph node from other graph nodes on the quantum chip and the connecting line weights of corresponding other graph nodes in the quantum connectivity graph, as the coupling effect parameter of the quantum connectivity graph of the target quantum algorithm.

Figure 41:
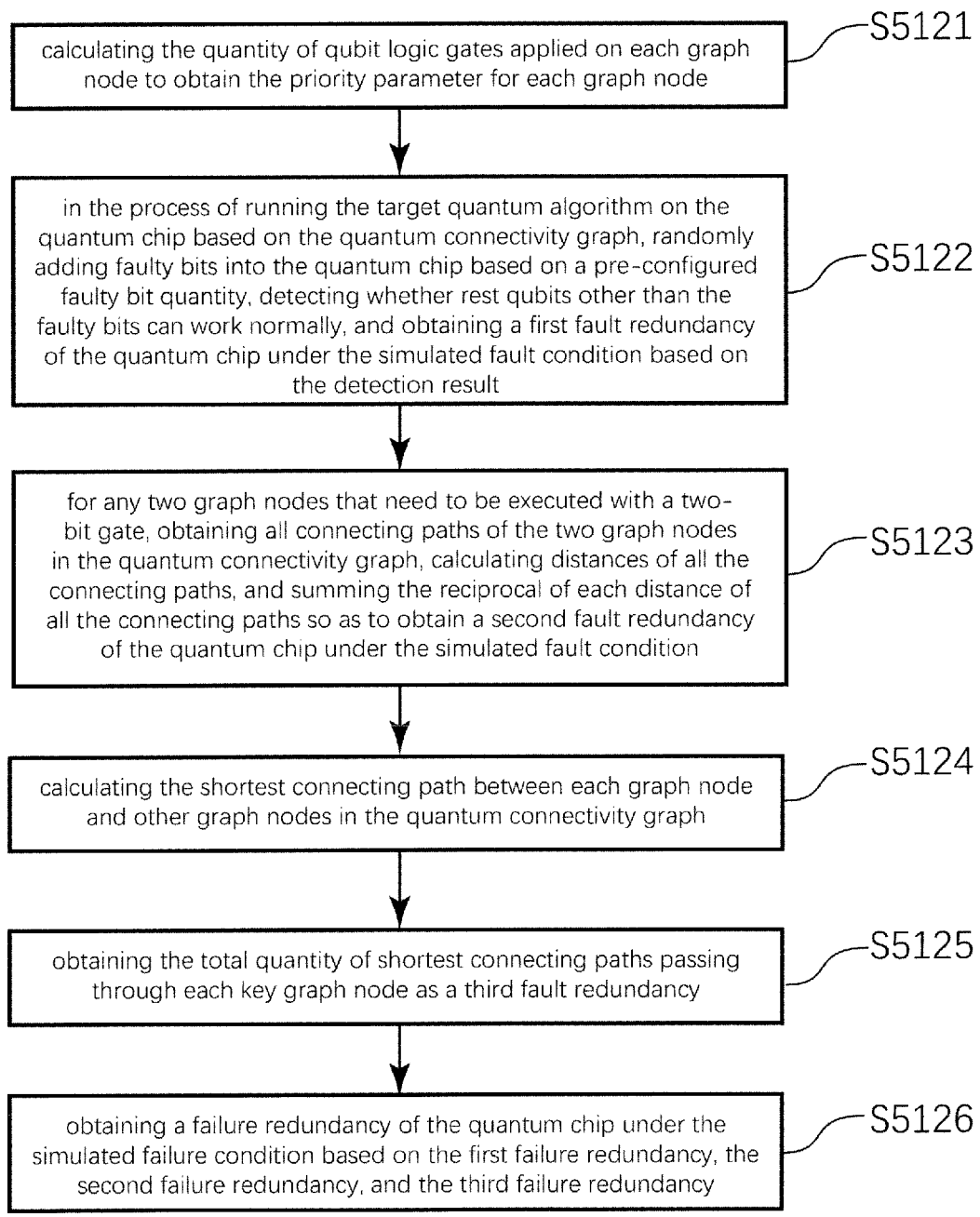
FIG. 41 illustrates a flow diagram of a sub-step of the step S120 shown in FIG. 1.

In one possible embodiment, for the step S5120, regarding the priority parameter for each graph node and the way of calculating the fault redundancy of the quantum chip under a simulated fault condition, see FIG. 41, it may be implemented by the following sub-steps, and described in detail below.

Step-step S5121, calculating the quantity of qubit logic gates applied on each graph node to obtain the priority parameter for each graph node.

In the present embodiment, the priority parameter for each graph node may be equal to the total quantity of qubit logic gates applied on each graph node, wherein, the qubit logic gate may be a single-qubit logic gate, a two-qubit logic gate, and other qubit logic gates.

Specifically, in a quantum connectivity graph, it is necessary to the calculate the quantities of qubit logic gates applied between a single graph node and each other graph node connected to it through connecting lines, and sum these quantities to serve as the priority parameter for each graph node.

In the next step, the fault redundancy of the quantum chip under the simulated fault condition will be described:

Sub-step S5122, in the process of running the target quantum algorithm on the quantum chip based on the quantum connectivity graph, randomly adding faulty bits into the quantum chip based on a pre-configured faulty bit quantity, detecting whether rest qubits other than the faulty bits can work normally, and obtaining a first fault redundancy of the quantum chip under the simulated fault condition based on the detection result.

For example, if the pre-configured faulty bit quantity is 2, two faulty bits may be randomly added to the quantum chip, that is, any two quantum bits in the quantum chip are randomly assumed to be defined as faulty bits, and the two randomly defined faulty bits cannot be in a normal working state. At this point, detecting whether the rest quantum bits other than the faulty bits can work normally, that is, detecting whether the rest quantum bits other than the faulty bits have other connecting paths that can work for coupling, so as to obtain a detection result. The detection result may include the quantity of quantum bits under normal operation, so as to obtain the first fault redundancy of the quantum chip under the simulated fault condition. It can be understood that the higher the first fault redundancy, the better the bit redundancy and the better the performance of the quantum chip.

For example, in a further possible embodiment, continuing referring to the sub-step S5123, for any two graph nodes that need to be executed with a two-bit gate, obtaining all connecting paths of the two graph nodes in the quantum connectivity graph, calculating distances of all the connecting paths, and summing the reciprocal of each distance of all the connecting paths so as to obtain a second fault redundancy of the quantum chip under the simulated fault condition.

For example, the second fault redundancy is calculated as follows:

m=Σgaten 1/Dgatei·gatei, Dgatei·gatei represents distances between the connecting paths of the graph node i and the graph node j in the quantum connectivity graph, $gate_{i,j}$ represents qubit logic gates applied between the graph node i and the graph node j. It can be understood that, the higher the value of the second fault redundancy, the greater the quantity of alternative paths for paths between the graph node i and the graph node j.

For example, in a further possible embodiment, continuing referring to the sub-step S5124, calculating the shortest connecting path between each graph node and other graph nodes in the quantum connectivity graph.

Sub-step S5125, obtaining the total quantity of shortest connecting paths passing through each key graph node as a third fault redundancy.

In the present embodiment, the key graph node may be understood as a graph node with a higher priority in the process of participating in the quantum algorithm, for example, a graph node with a priority parameter greater than the set priority parameter, and the preset priority parameter may be flexibly configured according to an actual design requirement, and is not specifically limited here.

In a possible embodiment, for the sub-step S5124, for each graph node, it is possible to perform initialization to give a first distance ds of 0 between the graph node and other graph nodes in the quantum connectivity graph, as well as a first node weight ws of 1, to the graph node.

On this basis, for each of the other first graph nodes adjacent to the graph node, it is possible to give a second distance between each first graph node and the graph node as the first distance plus 1, give a second node weight as the first node weight, and mark a path consisting of the connecting lines between the first graph node and the graph node as the shortest connecting path between the graph node and the first graph node. For example, for each of the other first graph nodes i adjacent to the graph node s, the second distance di=ds+1, the second node weight wi=ws=1, all graph nodes s>other first graph nodes i are marked as the shortest connecting path between these two graph nodes.

Further, for each of second graph nodes adjacent to the first graph nodes, giving a third distance as the second distance plus 1, a third node weight as the second node weigh, to the second graph node, and marking a path consisting of connecting lines between the second graph node and the first graph node, as well as connecting lines between the first graph node and the graph node as the shortest connecting path between the graph node and the second graph node. For example, for each of the second graph nodes j adjacent to the first graph nodes i, if the second graph nodes j are not given the third distance, then the third distance dj=di+1 and the third node weight wj=wi will be given, and s> . . . >i>j will be marked as a shortest connecting path from s to j.

Sub-step S5126, obtaining a failure redundancy of the quantum chip under the simulated failure condition based on the first failure redundancy, the second failure redundancy, and the third failure redundancy.

In the present embodiment, the failure redundancy of the quantum chip under the simulated failure condition may be selected from one of the first failure redundancy, the second failure redundancy, and the third failure redundancy, or may be obtained by performing weighted summation after the first fault redundancy, the second fault redundancy, and the third fault redundancy are combined. For example, only the first fault redundancy, the second fault redundancy or the third fault redundancy may be selected as the fault redundancy of the quantum chip under the simulated fault condition, or the failure redundancy of the quantum chip under the simulated failure condition may be obtained by performing the weighted summation on the first fault redundancy and the second fault redundancy, or on the first fault redundancy and the third fault redundancy, or on the second fault redundancy and the third fault redundancy, or on the first fault redundancy, the second fault redundancy and the third fault redundancy, which shall be within the scope of protection of the present application. Wherein, the greater the fault redundancy, the higher the fault tolerance of the quantum chip.

In one possible embodiment, for the step S5130, it is possible to match the coupling effect parameter of the quantum connectivity graph of the target quantum algorithm with preset coupling index evaluation conditions, so as to obtain a coupling index evaluation result. For example, the preset coupling index evaluation conditions may be a coupling effect parameter range of various coupling index labels, and when the coupling effect parameter of the quantum connectivity graph of the target quantum algorithm matches with any of the preset coupling metric evaluation conditions, it is possible to obtain a preset coupling index label of the quantum connectivity graph of the target quantum algorithm, thus facilitating a chip designer to refer to the coupling effect situation.

At the same time, the priority parameters of each graph node may be sorted in order of size to obtain a priority index evaluation result, thus facilitating the chip designer to pointedly design the process of each quantum bit in the quantum chip by referring to the priority index evaluation result.

In addition, it is possible to match the fault redundancy of the quantum chip with preset redundancy evaluation conditions so as to obtain the fault redundancy index evaluation result. For example, the preset redundancy evaluation conditions may be the fault redundancy range of various redundancy labels, and when the fault redundancy of the quantum chip matches any of the preset redundancy evaluation conditions, it is possible to obtain the redundancy labels of the quantum chip, thus facilitating the chip designer to refer to the fault redundancy situation.

Figure 42:
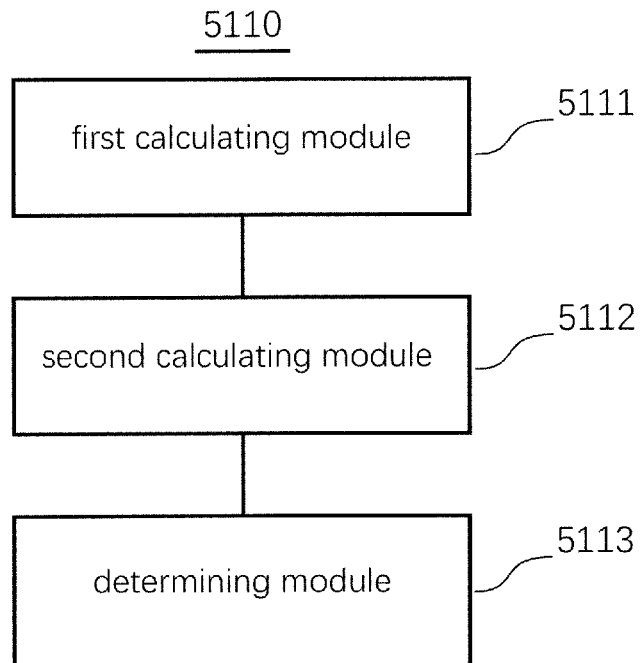
FIG. 42 illustrates a schematic diagram of functional modules of an index evaluation apparatus of a quantum algorithm provided by an embodiment of the present disclosure.

Based on the same inventive concept, see FIG. 42, it shows a schematic diagram of functional modules of a quantum algorithm index evaluation 5110 provided by embodiments of the present disclosure. This embodiment may divide the functional modules of the quantum algorithm index evaluation 5110 according to the method implementation described above. For example, it is possible to divide individual functional modules corresponding to individual functions, or it is possible to integrate two or more functions in a single processing module. The integrated module may be implemented either in the form of hardware or in the form of a software function module. It should be noted that the division of modules in the embodiments of the present disclosure is schematic and is only a logical functional division, and that another division may be used in practical implementation. For example, in the case of dividing individual functional modules corresponding to individual functions, the quantum algorithm index evaluation 5110 shown in FIG. 42 is only a schematic diagram of an apparatus. Wherein, the quantum algorithm index evaluation 5110 may include a first calculating module 5111, a second calculating module 5112 and an determining module 5113. The functions of individual functional modules of the quantum algorithm index evaluation 5110 are described in detail below.

The first calculating module 5111 is configured to calculate a coupling effect parameter of the quantum connectivity graph of the target quantum algorithm, the quantum connectivity graph includes a plurality of graph nodes and connecting lines between two graph nodes, wherein the graph nodes is used to represent logic bits in the target quantum algorithm, and the connecting lines is used to represent qubit logic gates between two logic bits. It is to be understood that the first calculating module 5111 may be used to perform the above step S5110 and the details of the implementation of the first calculating module 5111 may be found above in relation to step S5110.

The second calculating module 5112 is configured to calculate a priority parameter for each graph node and a fault redundancy of the quantum chip under a simulated fault condition. It is to be understood that the second calculating module 5112 may be used to perform the above step S5120 and the details of the implementation of the second calculating module 5112 may be found above in relation to step S5120.

The determining module 5113 is configured to determine an index evaluation result of the quantum connectivity graph of the target quantum algorithm according to the coupling effect parameter of the quantum connectivity graph of the target quantum algorithm, the priority parameters of each graph node, and the fault redundancy of the quantum chip under a simulated fault condition. It is to be understood that the determining module 5113 may be used to perform the above step S5130 and the details of the implementation of the determining module 5113 may be found above in relation to step S5130.

In one possible embodiment, the first calculating module 5111 is specifically configured that:
calculating distances of each graph node from other graph nodes on the quantum chip, as well as connecting line weights of each graph node and other graph nodes in the quantum connectivity graph;
determining a sum of products of distances of each graph node from other graph nodes on the quantum chip and the connecting line weights of corresponding other graph nodes in the quantum connectivity graph, as the coupling effect parameter of the quantum connectivity graph of the target quantum algorithm.

In one possible embodiment, the first calculating module 5111 is specifically configured that:
calculating the quantity of qubit logic gates applied between each graph node and other graph nodes to obtain the connecting line weight in the quantum connectivity graph.

In one possible embodiment, the second calculating module 5112 is specifically configured that:
calculating the quantity of qubit logic gates applied on each graph node to obtain the priority parameter for each graph node.

In one possible embodiment, the second calculating module 5112 is specifically configured that:
in the process of running the target quantum algorithm on the quantum chip based on the quantum connectivity graph, randomly adding faulty bits into the quantum chip based on a pre-configured faulty bit quantity, detecting whether rest qubits other than the faulty bits can work normally, and obtaining a first fault redundancy of the quantum chip under the simulated fault condition based on the detection result.

In one possible embodiment, the second calculating module 5112 is specifically configured that:
for any two graph nodes that need to be executed with a two-bit gate, obtaining all connecting paths of the two graph nodes in the quantum connectivity graph, calculating distances of all the connecting paths, and summing the reciprocal of each distance of all the connecting paths so as to obtain a second fault redundancy of the quantum chip under the simulated fault condition.

In one possible embodiment, the second calculating module 5112 is specifically configured that:
calculating the shortest connecting path between each graph node and other graph nodes in the quantum connectivity graph;
obtaining the total quantity of shortest connecting paths passing through each key graph node as a third fault redundancy, wherein the key graph node is a graph node with a priority parameter greater than the set priority parameter;
obtaining a failure redundancy of the quantum chip under the simulated failure condition based on the first failure redundancy, the second failure redundancy, and the third failure redundancy.

In one possible embodiment, the second calculating module 5112 is specifically configured that:
for each graph node, performing initialization to give a first distance ds of 0 between the graph node and other graph nodes in the quantum connectivity graph, as well as a first node weight ws of 1, to the graph node;
for each of the other first graph nodes adjacent to the graph node, giving a second distance between each first graph node and the graph node as the first distance plus 1, giving a second node weight as the first node weight, and marking a path consisting of the connecting lines between the first graph node and the graph node as the shortest connecting path between the graph node and the first graph node;
for each of second graph nodes adjacent to the first graph nodes, giving a third distance as the second distance plus 1, a third node weight as the second node weigh, to the second graph node, and marking a path consisting of connecting lines between the second graph node and the first graph node, as well as connecting lines between the first graph node and the graph node as the shortest connecting path between the graph node and the second graph node.

In one possible embodiment, the determining module 5113 is specifically configured that:

matching the coupling effect parameter of the quantum connectivity graph of the target quantum algorithm with preset coupling index evaluation conditions, so as to obtain a coupling index evaluation result sorting the priority parameters of each graph node in order of size to obtain a priority index evaluation result; and matching the fault redundancy of the quantum chip with preset redundancy evaluation conditions so as to obtain the fault redundancy index evaluation result.

Based on the same inventive concept, see FIG. 19, it shows a schematic block diagram of the structure of the computer terminal 300 for executing the above quantum algorithm index evaluation method provided by embodiments of the present disclosure. The computer terminal 300 may include a quantum algorithm index evaluation apparatus 310, a machine-readable storage medium 320 and a processor 330.

In the present embodiment, the machine-readable storage medium 320 and the processor 330 are located in the computer terminal 300 and are provided separately. However, it should be understood that the machine-readable storage medium 320 may also be independent of the computer terminal 300, and may be accessed by the processor 330 through a bus interface. Alternatively, the machine-readable storage medium 320 may also be integrated into the processor 330, for example, may be a cache and/or a general-purpose register.

The quantum algorithm index evaluation apparatus 310 may include software functional modules stored in the machine-readable storage medium 320 (such as the first calculating module 5111, the second calculating module 5112 and the determining module 5113 as shown in FIG. 42), and when the processor 330 executes the software functional modules in the quantum algorithm index evaluation apparatus 310, it is possible to implement the quantum algorithm index evaluation method provided by the aforementioned method embodiment.

Since the computer terminal 300 provided by the embodiment of the present disclosure is another embodiment of the quantum algorithm index evaluation method executed by the above computer terminal 300, and the computer terminal 300 may be used to execute the quantum algorithm index evaluation method provided by the above method embodiment, the technical effect it can obtain may refer to the above method embodiment, which will not be repeated herein.

Based on the shortcomings of prior arts, the present disclosure provide a quantum algorithm index evaluation method, an apparatus, a terminal, and a storage medium, which can effectively evaluate the algorithm operation effect of the quantum chip, so as to provide data support for the subsequent design of the quantum chip.

H1. A quantum algorithm index evaluation method, characterized by including:

calculating a coupling effect parameter of the quantum connectivity graph of the target quantum algorithm, the quantum connectivity graph includes a plurality of graph nodes and connecting lines between two graph nodes, wherein the graph nodes is used to represent logic bits in the target quantum algorithm, and the connecting lines is used to represent qubit logic gates between two logic bits;

calculating a priority parameter for each graph node and a fault redundancy of the quantum chip under a simulated fault condition;

determining an index evaluation result of the quantum connectivity graph of the target quantum algorithm according to the coupling effect parameter of the quantum connectivity graph of the target quantum algorithm, the priority parameters of each graph node, and the fault redundancy of the quantum chip under a simulated fault condition.

H2. The quantum algorithm index evaluation method of H1, characterized in that the step of calculating a coupling effect parameter of the quantum connectivity graph of the target quantum algorithm, includes:

calculating distances of each graph node from other graph nodes on the quantum chip, as well as connecting line weights of each graph node and other graph nodes in the quantum connectivity graph;

determining a sum of products of distances of each graph node from other graph nodes on the quantum chip and the connecting line weights of corresponding other graph nodes in the quantum connectivity graph, as the coupling effect parameter of the quantum connectivity graph of the target quantum algorithm.

H3. The quantum algorithm index evaluation method of H1 or H2, characterized in that the step of calculating a fault redundancy of the quantum chip under a simulated fault condition, includes:

in the process of running the target quantum algorithm on the quantum chip based on the quantum connectivity graph, randomly adding faulty bits into the quantum chip based on a pre-configured faulty bit quantity, detecting whether rest qubits other than the faulty bits can work normally, and obtaining a first fault redundancy of the quantum chip under the simulated fault condition based on the detection result.

H4. The quantum algorithm index evaluation method of H1 to H3, characterized in that the step of calculating a fault redundancy of the quantum chip under a simulated fault condition, further includes:

for any two graph nodes that need to be executed with a two-bit gate, obtaining all connecting paths of the two graph nodes in the quantum connectivity graph, calculating distances of all the connecting paths, and summing the reciprocal of each distance of all the connecting paths so as to obtain a second fault redundancy of the quantum chip under the simulated fault condition.

H5. The quantum algorithm index evaluation method of H1 to H4, characterized in that the step of obtaining a failure redundancy of the quantum chip under the simulated failure condition based on the first failure redundancy and the second failure redundancy, includes:

calculating the shortest connecting path between each graph node and other graph nodes in the quantum connectivity graph;

obtaining the total quantity of shortest connecting paths passing through each key graph node as a third fault redundancy, wherein the key graph node is a graph node with a priority parameter greater than the set priority parameter;

obtaining a failure redundancy of the quantum chip under the simulated failure condition based on the first failure redundancy, the second failure redundancy, and the third failure redundancy.

H6. The quantum algorithm index evaluation method of H1 to H5, characterized in that the step of calculating the shortest connecting path between each graph node and other graph nodes in the quantum connectivity graph, includes:

for each graph node, performing initialization to give a first distance of 0 between the graph node and other graph nodes in the quantum connectivity graph, as well as a first node weight of 1, to the graph node;

for each of the other first graph nodes adjacent to the graph node, giving a second distance between each first graph node and the graph node as the first distance plus 1, giving a second node weight as the first node weight, and marking a path consisting of the connecting lines between the first graph node and the graph node as the shortest connecting path between the graph node and the first graph node;

for each of second graph nodes adjacent to the first graph nodes, giving a third distance as the second distance plus 1, a third node weight as the second node weigh, to the second graph node, and marking a path consisting of connecting lines between the second graph node and the first graph node, as well as connecting lines between the first graph node and the graph node as the shortest connecting path between the graph node and the second graph node.

H7. The quantum algorithm index evaluation method of H1 to H6, characterized in that the step of determining an index evaluation result of the quantum connectivity graph of the target quantum algorithm according to the coupling effect parameter of the quantum connectivity graph of the target quantum algorithm, the priority parameters of each graph node, and the fault redundancy of the quantum chip under a simulated fault condition, includes:

matching the coupling effect parameter of the quantum connectivity graph of the target quantum algorithm with preset coupling index evaluation conditions, so as to obtain a coupling index evaluation result sorting the priority parameters of each graph node in order of size to obtain a priority index evaluation result; and matching the fault redundancy of the quantum chip with preset redundancy evaluation conditions so as to obtain the fault redundancy index evaluation result.

H8. A quantum algorithm index evaluation apparatus, characterized in that the apparatus includes:

a first calculating module configured to calculate a coupling effect parameter of the quantum connectivity graph of the target quantum algorithm, the quantum connectivity graph includes a plurality of graph nodes and connecting lines between two graph nodes, wherein the graph nodes is used to represent logic bits in the target quantum algorithm, and the connecting lines is used to represent qubit logic gates between two logic bits;

a second calculating module configured to calculate a priority parameter for each graph node and a fault redundancy of the quantum chip under a simulated fault condition;

a determining module configured to determine an index evaluation result of the quantum connectivity graph of the target quantum algorithm according to the coupling effect parameter of the quantum connectivity graph of the target quantum algorithm, the priority parameters of each graph node, and the fault redundancy of the quantum chip under a simulated fault condition.

H9. A computer terminal, characterized by including a machine-readable storage medium and a processor, the machine-readable storage medium stores a computer program therein, and the processor is configured to run the computer program to execute the quantum algorithm index evaluation method of any one of H1 to H7.

H10. A computer readable storage medium, characterized in that the computer readable storage medium stores a computer program therein, and the computer program is configured, when executed by a computer, to implement the quantum algorithm index evaluation method of any one of H1 to H7.

Based on the above aspects, in the present disclosure, calculating a coupling effect parameter of the quantum connectivity graph of the target quantum algorithm, the quantum connectivity graph includes a plurality of graph nodes and connecting lines between two graph nodes, wherein the graph nodes is used to represent logic bits in the target quantum algorithm, and the connecting lines is used to represent qubit logic gates between two logic bits; then calculating a priority parameter for each graph node and a fault redundancy of the quantum chip under a simulated fault condition; and determining an index evaluation result of the quantum connectivity graph of the target quantum algorithm according to the coupling effect parameter of the quantum connectivity graph of the target quantum algorithm, the priority parameters of each graph node, and the fault redundancy of the quantum chip under a simulated fault condition. In this way, it is possible to effectively evaluate the algorithm operation effect of the quantum chip, so as to provide data support for the subsequent design of the quantum chip.

Figure 43:
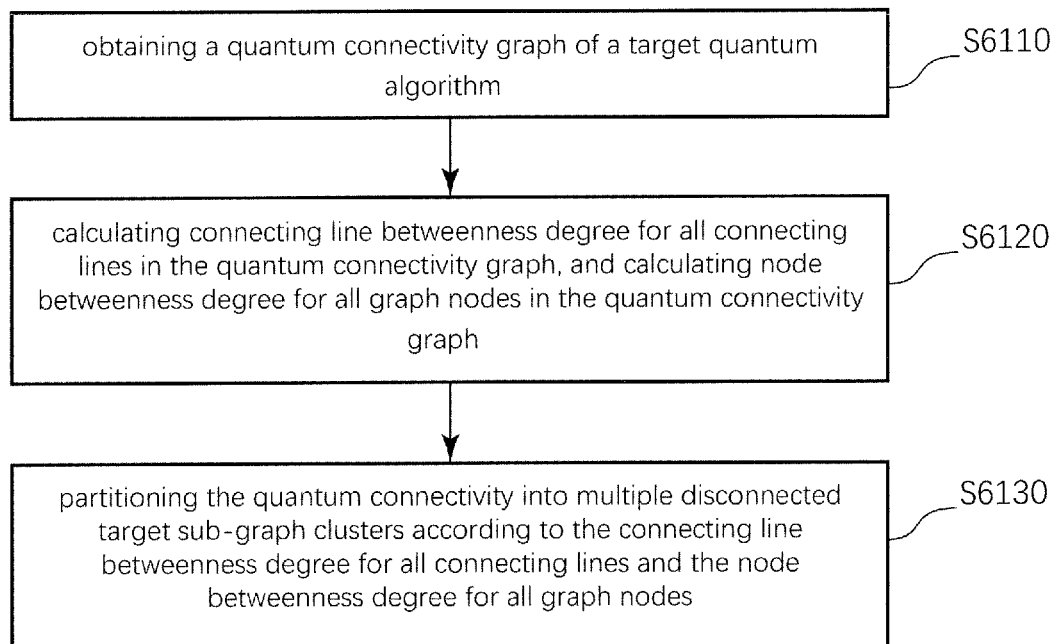
FIG. 43 illustrates a flow diagram of a cluster partitioning method of a quantum connectivity graph provided by an embodiment of the present disclosure.

Referring to FIG. 43, it shows an interaction flow diagram of a cluster partitioning method of a quantum connectivity graph provided by embodiments of the present disclosure. It should be understood that in other embodiments, the order of some steps of the cluster partitioning method of the quantum connectivity graph of the present embodiment may be exchanged according to actual needs, or some steps may also be omitted or deleted. The detailed steps of the cluster partitioning method of the quantum connectivity graph are described below.

Step S6110, obtaining a quantum connectivity graph of a target quantum algorithm.

In the present embodiment, the quantum connectivity graph may include multiple graph nodes and connecting lines between two graph nodes, the graph nodes may be used to represent logic bits in the target quantum algorithm, and connecting lines may be used to represent qubit logic gates between two logic bits.

Wherein, the quantum connectivity graph can be acquired based on the logic bits in the target quantum algorithm and the number of qubit logic gates applied on any two qubits. Wherein, the qubits may refer to a physical system that can be in a ground state $|0\rangle$, an excited state $|1\rangle$ and a superposition state $(\alpha|0\rangle+\beta|1\rangle)$ at the same time. Mathematically, the qubits can be represented by vectors of states on Hilbert space. Quantum circuits are implemented by manipulating several qubits at the same time.

A quantum circuit is a representation of a quantum program that can be consisted of a sequence of qubits initially located in the $|0\rangle$ state and a number of subsequent quantum logic gates, and terminated by a measurement operation (not necessarily every bit needs to be measured). Typically, each quantum program can eventually be decomposed into a quantum program consisting only of a sequence of elementary quantum logic gates. In addition, the qubit logic gates may refer to some reversible unitary transformations, and may be used to manipulate several qubits to make these qubits evolve towards a target state in order to evolve into a final state, that is, the result of quantum computation.

Step S6120, calculating connecting line betweenness degree for all connecting lines in the quantum connectivity graph, and calculating node betweenness degree for all graph nodes in the quantum connectivity graph.

In the present embodiment, the connecting line betweenness degree of the connecting lines may be an index to measure the likelihood that a connecting line belongs to an inter-cluster connection.

The inventor of the present application found that, in general, a clustering phenomenon that occurs in the quantum connectivity graph refers to the fact that the graph nodes within several sub-graphs within the quantum connectivity graph are connected to each other more than the quantity of connecting lines that connect the nodes between the sub-graphs. If two sub-graphs are connected by fewer inter-cluster connecting lines, then all paths from a node within a cluster to a node within another cluster must pass through a smaller quantity of these connecting lines than the quantity within the clusters. Because there are fewer connecting lines and therefore fewer paths to choose from, the number this path passes through these connecting lines is more than the number the path between nodes within the clusters passes through the connecting lines within the clusters, which number is related to the connecting line betweenness degree.

Step S6130, partitioning the quantum connectivity into multiple disconnected target sub-graph clusters according to the connecting line betweenness degree for all connecting lines and the node betweenness degree for all graph nodes.

In the present embodiment, by partitioning the quantum connectivity into multiple disconnected target sub-graph clusters, each disconnected target sub-graph cluster can be processed separately later, for example, performing a corresponding connectivity optimization, crossed connecting line optimization, etc. for each disconnected target sub-graph cluster.

Based on the above steps, in the present embodiment, calculating connecting line betweenness degree for all connecting lines in the quantum connectivity graph and calculating node betweenness degree for all graph nodes in the quantum connectivity graph, and thus partitioning the quantum connectivity into multiple disconnected target sub-graph clusters according to the connecting line betweenness degree for all connecting lines and the node betweenness degree for all graph nodes. In this way, by partitioning the quantum connectivity into multiple disconnected target sub-graph clusters, it may be convenient to carry out subsequent quantum algorithm design based on each disconnected target sub-graph cluster later, so as to improve the operation effect of the algorithm.

Figure 44:
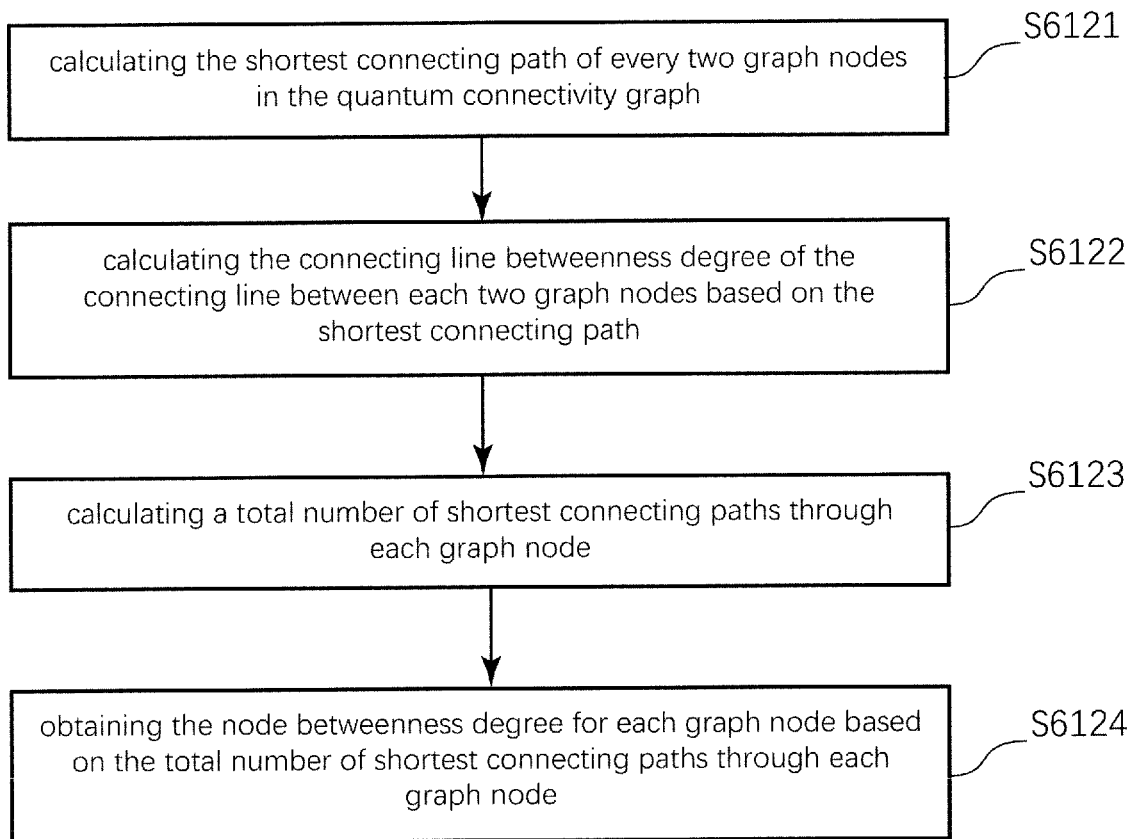
FIG. 44 illustrates a flow diagram of a sub-step of the step S120 shown in FIG. 1.

In one possible embodiment, for the step S6120, the embodiment of calculating connecting line betweenness degree for all connecting lines in the quantum connectivity graph, see FIG. 44, can be achieved by the following exemplary sub-steps and is described in detail below.

Sub-step S6121, calculating the shortest connecting path of every two graph nodes in the quantum connectivity graph.

For example, for each graph node, it is possible to perform initialization to give a first distance ds of 0 between the graph node and other graph nodes in the quantum connectivity graph, as well as a first node weight ws of 1, to the graph node.

On this basis, for each of the other first graph nodes adjacent to the graph node, it is possible to give a second distance between each first graph node and the graph node as the first distance plus 1, give a second node weight as the first node weight, and mark a path consisting of the connecting lines between the first graph node and the graph node as the shortest connecting path between the graph node and the first graph node. For example, for each of the other first graph nodes i adjacent to the graph node s, the second distance di=ds+1, the second node weight wi=ws=1, all graph nodes s>other first graph nodes i are marked as the shortest connecting path between these two graph nodes.

Further, for each of second graph nodes adjacent to the first graph nodes, giving a third distance as the second distance plus 1, a third node weight as the second node weigh, to the second graph node, and marking a path consisting of connecting lines between the second graph node and the first graph node, as well as connecting lines between the first graph node and the graph node as the shortest connecting path between the graph node and the second graph node. For example, for each of the second graph nodes j adjacent to the first graph nodes i, if the second graph nodes j are not given the third distance, then the third distance dj=di+1 and the third node weight wj=wi will be given, and s> . . . >i>j will be marked as a shortest connecting path from s to j.

Sub-step S6122, calculating the connecting line betweenness degree of the connecting line between each two graph nodes based on the shortest connecting path.

For example, first obtaining all leaf nodes t associated with a rootnode s in the shortest connecting path, and calculating a first connecting line score of all connecting lines between the leaf nodes t and neighboring nodes of the leaf nodes t. Wherein, the first connecting line score is quotient of a node weight of the neighboring nodes and a node weight of the leaf nodes.

Next, traversing from the farthest leaf node t from the rootnode s and calculating a second connecting line score of connecting lines between each two neighboring leaf nodes t respectively until reaching the rootnode s, so as to obtain the second connecting line score of all the connecting lines. For example, for the neighboring leaf node i and leaf node j, the leaf node i is closer to the rootnode s than the leaf node j, and the second connecting line score of the connecting line between the leaf node i and the leaf node is $$S_i = \frac{wi}{wj}\left(1 + \sum_j S_j\right).$$

Therefore, it is possible to sum the first connecting line score with all second connecting line scores so as to obtain the connecting line betweenness degree of each graph node and other graph nodes in the quantum connectivity graph.

In one possible embodiment, still for the step S120, the embodiment of calculating node betweenness degree for all graph nodes in the quantum connectivity graph, see FIG. 2, can be achieved by the following exemplary sub-steps and is described in detail below.

Sub-step S6123, calculating a total number of shortest connecting paths through each graph node.

In the present embodiment, regarding shortest connecting paths through each graph node, it can be determined with reference to the shortest connecting paths in the quantum connectivity graph for each two graph nodes in the sub-step S6111, which is not repeated herein.

Sub-step S6124, obtaining the node betweenness degree for each graph node based on the total number of shortest connecting paths through each graph node.

In the present embodiment, the node betweenness degree for each graph node may be equal to the total number of shortest connecting paths through each graph node, or be equal to a weighted value of the total number of shortest connecting paths through each graph node and a preset coefficient, which is not specifically defined herein.

Wherein, the node betweenness degree for each graph node may be obtained by the following calculation formula:

$$c_B(v) = \frac{1}{2} \sum_{e \in \Gamma(v)} c_B(e) - (n-1)$$

Wherein, $\Gamma(v)$ is all connecting lines with v as the endpoint, n is the number of all graph nodes in this sub-graph, and $c_B(v)$, $c_B(e)$ represent the node betweenness degree and the connecting line betweenness degree, respectively. The node betweenness degree defines when to perform a node-splitting operation, and since the total number of shortest paths from n1 to n2 must be less than the node betweenness degree for a graph node v after dividing the neighboring points of the graph node V into n1 and n2 portions, it is possible to consider performing a node-splitting operation only if the node betweenness degree for a subsequent graph node is larger than the connecting line betweenness degree.

In this way, by calculating the node betweenness degree for each graph node, it is possible to solve the problem of when and how to perform a node-splitting operation. If several connecting lines with a high betweenness degree can be located, these connecting lines are connections between clusters, and by removing these connecting lines, the quantum connectivity graph may be partitioned into several disconnected clusters, thereby completing the partition of the clusters.

Figure 45:
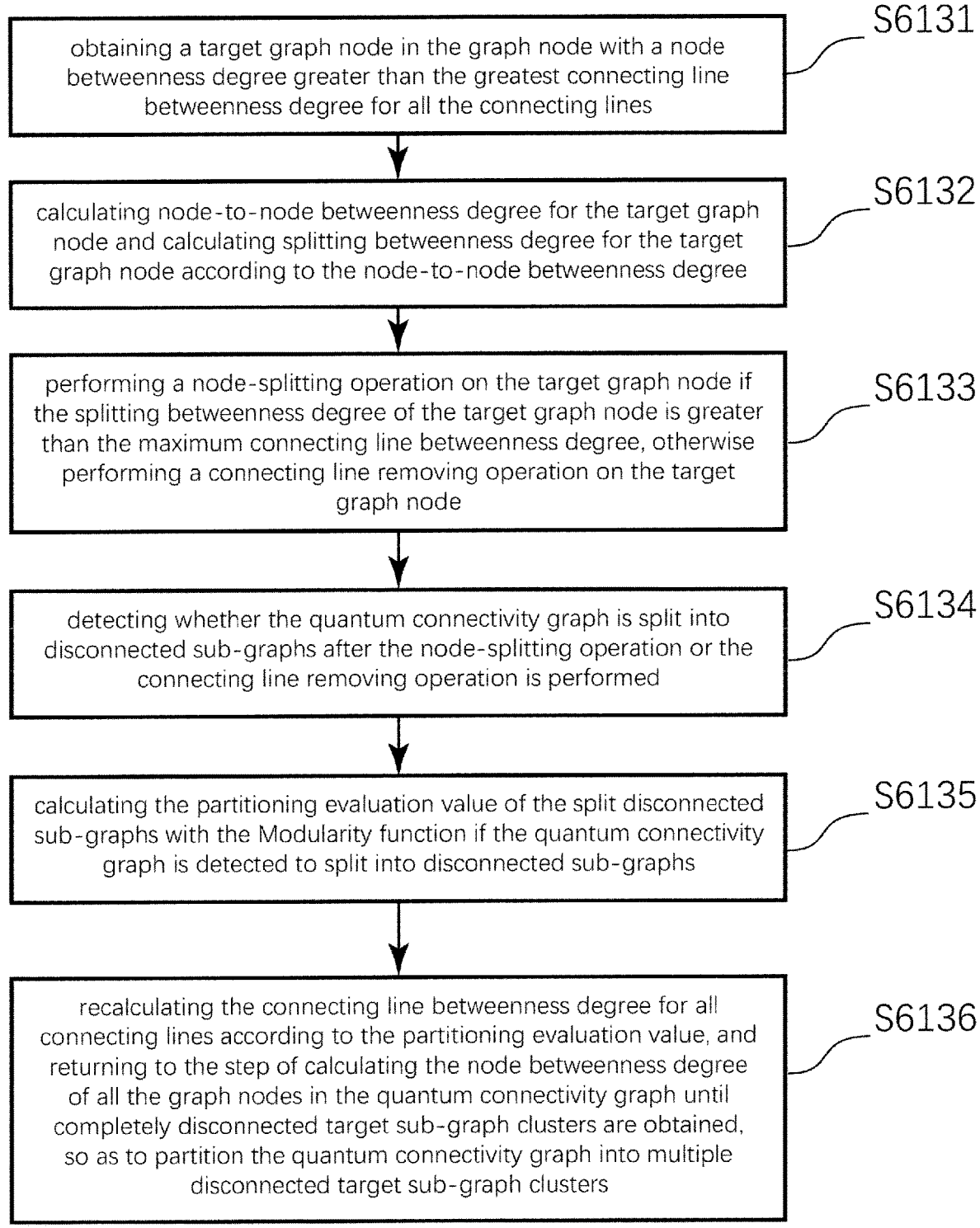
FIG. 45 illustrates a flow diagram of a sub-step of the step S130 shown in FIG. 1.

In one possible embodiment, for the step S6130, see FIG. 45, it can be achieved by the following exemplary sub-steps and is described in detail below.

Sub-step S6131, obtaining a target graph node in the graph node with a node betweenness degree greater than the greatest connecting line betweenness degree for all the connecting lines.

Sub-step S6132, calculating node-to-node betweenness degree for the target graph node and calculating splitting betweenness degree for the target graph node according to the node-to-node betweenness degree.

For example, in a possible example, the sub-step S6132 may be implemented by the following exemplary embodiments.

(1) calculating the total number of shortest paths through the connecting lines of the target graph node and each neighboring node of the target graph node, as the node-to-node betweenness degree of the target graph node.

In the present embodiment, the node-to-node betweenness degree is a local index. For one target graph node V, the node-to-node betweenness degree of its arbitrary neighboring graph node {u, w} is the total number of all the shortest paths through connecting lines {u, v} and {w, v}.

(2) determining two selected graph nodes corresponding to the lowest node-to-node betweenness degree as one attributed graph node.

In the present embodiment, the node-to-node betweenness degree of the attributed graph node may be a sum of the node-to-node betweenness degree of two selected graph nodes.

(3) for a sub-graph composed of all neighboring graph nodes of the target graph node, replacing connecting lines connection between all neighboring graph nodes and the attributed graph node by the attributed graph node and the auxiliary graph node, respectively, and taking the sum of the node-to-node betweenness degree between the auxiliary graph node and the two selected graph nodes as the node-to-node betweenness degree of the secondary graph node to the attributed graph node.

(4) repeating the step of determining two selected graph nodes corresponding to the lowest node-to-node betweenness degree as one attributed graph node for a preset number.

In the present embodiment, the preset number is the betweenness degree for the target graph node minus 2.

(5) obtaining two final graph nodes after performing the step of determining two selected graph nodes corresponding to the lowest node-to-node betweenness degree as one attributed graph node for a preset number, and determining the sum of the node-to-node betweenness degree between the two final graph nodes as the splitting betweenness degree of the target graph node.

For example, after obtaining the node-to-node betweenness degree, selecting two selected graph nodes {u, w} with the lowest node-to-node betweenness degree, and then attributing u, w as one attributed graph node uw, wherein node-to-node betweenness degree of the attributed graph node uw is the sum of node-to-node betweenness degree of the two selected graph nodes {u, w}.

For the sub-graph composed of all neighboring graph nodes of the target graph node v, {uw, x} may be used to replace connection between these neighboring graph nodes and the attributed graph node, and the node-to-node betweenness degree between all the auxiliary graph nodes X and u, w is summed to obtain the node-to-node betweenness degree from the auxiliary graph nodes x to the attributed graph node uw.

Then, repeatedly determining the two selected graph nodes corresponding to the lowest node-to-node betweenness degree as one attributed graph node k minus 2, and k is the degree of the target graph node.

In this way, finally two final graph nodes can be obtained, and the sum of the node-to-node betweenness degrees between these two final graph nodes can be determined as the splitting betweenness degree of the target graph node. The nodes contained in these two final graph nodes are how the neighboring graph nodes are connected to the two final graph nodes respectively after the nodes are split into two parts.

Sub-step S6133, performing a node-splitting operation on the target graph node if the splitting betweenness degree of the target graph node is greater than the maximum connecting line betweenness degree, otherwise performing a connecting line removing operation on the target graph node.

In the present embodiment, the node-splitting operation will be performed on the target graph node only when the splitting betweenness degree of the target graph node is greater than the maximum connecting line betweenness degree, otherwise the connecting line removing operation will be performed on the target graph node.

Sub-step S6134, detecting whether the quantum connectivity graph is split into disconnected sub-graphs after the node-splitting operation or the connecting line removing operation is performed.

For example, in the process of performing the node-splitting operation, one graph node v may be split into two parts, v1 and v2. The neighboring graph node of the original v may be somehow connected to v1, v2, respectively, and split into nodes with a high betweenness degree, thereby partitioning the quantum connectivity graph into several disconnected clusters.

Sub-step S6135, calculating the partitioning evaluation value of the split disconnected sub-graphs with the Modularity function if the quantum connectivity graph is detected to split into disconnected sub-graphs.

The cluster means that there are several sub-graphs in a quantum connectivity graph, within which the connectivity is usually greater than the connectivity between these sub-graphs. When the foregoing steps are executed, during the node-splitting operation or the connecting line removing operation, it may be necessary to remove one connecting line at each step, or it may be necessary to split one graph node, thereby gradually partitioning the quantum connectivity graph into smaller parts, which is a hierarchical process. For example, a large quantum connectivity graph is split into two, and two smaller sub-graphs are partitioned into two smaller sub-graphs, resulting in a set of all clusters with only one graph node. On this basis, in order to ensure the operation effect of the subsequent algorithm, it is also necessary to evaluate which level is better to partition into. In general, the Modularity function generally increases and then decreases and has several peaks, and the highest peak is the best position for partitioning. If the Modularity function does not have this behavior or the peak value is too low, it is considered that there is no clustering structure.

In an example, the present embodiment may obtain the number of split sub-graphs of the split disconnected sub-graph, the number of connecting lines within each disconnected sub-graph, and the sum of the connectivity of all graph nodes within each disconnected sub-graph.

On this basis, based on the number of split sub-graphs of the split disconnected sub-graph, the number of connecting lines within each disconnected sub-graph, and the sum of the connectivity of all graph nodes within each disconnected sub-graph, it is possible to calculate the partitioning evaluation value of the split disconnected sub-graphs with the Modularity function.

For example, when partitioning clusters, a criterion needs to be specified. In the absence of a criterion, the entire quantum connectivity graph may belong to a cluster, and each graph node may itself belong to a cluster. Therefore, it is necessary to define an index to measure how well or badly the partitioning is. The inventors have studied that the connection between clusters is weaker than the connection within clusters, the Modularity function Q is defined as follows:

$$Q = \frac{1}{2m} \sum_{ij} (A_{ij} - P_{ij}) \delta_{C_i, C_j}$$

Wherein, $A_{ij}$ is the connectivity matrix of the algorithm itself, and the meaning of $P_{ij}$ is that, assuming that the connectivity $k_i$ of all nodes is currently known, the probability of a connection between i and j for a completely random graph node is $$p_{ij} = \frac{k_i k_j}{4m^2},$$

while $P_{ij} = 2m p_{ij}$ is the expectation that there are connecting lines. Based on this, the Modularity function Q can also be summarized as follows:

$$Q = \sum_{c=1}^{n_c} \left[ \frac{l_c}{m} - \left( \frac{d_c}{2m} \right)^2 \right]$$

Wherein, $n_c$ is the number of clusters, $l_c$ is the total number of connecting lines within the cluster, and $d_c$ is the sum of the connectivity of all nodes inside the cluster. If the Modularity function has a peak, then the peak may usually be understood as the node that is better selected by partitioning.

Sub-step S6136, recalculating the connecting line betweenness degree for all connecting lines according to the partitioning evaluation value, and returning to the step of calculating the node betweenness degree of all the graph nodes in the quantum connectivity graph until completely disconnected target sub-graph clusters are obtained, so as to partition the quantum connectivity graph into multiple disconnected target sub-graph clusters.

In the present embodiment, after obtaining the partitioning evaluation value, a new cluster may be formed by partitioning after the nodes have been better selected by partitioning, and then recalculating the connectivity betweenness degree of all connecting lines or, continuing with the above steps, until completely disconnected target sub-graph clusters are obtained, so as to partition the quantum connectivity graph into multiple disconnected target sub-graph clusters.

Based on the same inventive concept, see FIG. 47, it shows a schematic diagram of functional modules of a cluster partitioning apparatus 6110 of a quantum connectivity graph provided by embodiments of the present disclosure. This embodiment may divide the functional modules of the cluster partitioning apparatus 6110 of the quantum connectivity graph according to the method implementation described above. For example, it is possible to divide individual functional modules corresponding to individual functions, or it is possible to integrate two or more functions in a single processing module. The integrated module may be implemented either in the form of hardware or in the form of a software function module. It should be noted that the division of modules in the embodiments of the present disclosure is schematic and is only a logical functional division, and that another division may be used in practical implementation. For example, in the case of dividing individual functional modules corresponding to individual functions, the cluster partitioning apparatus 6110 of the quantum connectivity graph shown in FIG. 4 is only a schematic diagram of an apparatus. Wherein, the cluster partitioning apparatus 6110 of the quantum connectivity graph may include an obtaining module 6111, a calculating module 6112 and a partitioning module 6113. The functions of individual functional modules of the cluster partitioning apparatus 6110 of the quantum connectivity graph are described in detail below.

The obtaining module 6111 is configured to obtain a quantum connectivity graph of a target quantum algorithm, and the quantum connectivity graph includes a plurality of graph nodes and connecting lines between two graph nodes, wherein the graph nodes are used to represent logic bits in the target quantum algorithm, and the connecting lines are used to represent qubit logic gates between two logic bits. It is to be understood that the obtaining module 6111 may be used to perform the step S6110 described above, and the details of the implementation of the obtaining module 6111 may be found above in relation to step S6110.

The calculating module 6112 is configured to calculate connecting line betweenness degree for all connecting lines in the quantum connectivity graph, and calculating node betweenness degree for all graph nodes in the quantum connectivity graph. It is to be understood that the obtaining module 6112 may be used to perform the step S6120 described above, and the details of the implementation of the calculating module 6112 may be found above in relation to step S6120.

The partitioning module 6113 is configured to partition the quantum connectivity into multiple disconnected target sub-graph clusters according to the connecting line betweenness degree for all connecting lines and the node betweenness degree for all graph nodes. It is to be understood that the partitioning module 6113 may be used to perform the step S6130 described above, and the details of the implementation of the partitioning module 6113 may be found above in relation to step S6130.

In one possible embodiment, the calculating module 6112 is specifically configured that:
  calculating the shortest connecting path of every two graph nodes in the quantum connectivity graph;
  calculating the connecting line betweenness degree of the connecting line between each two graph nodes based on the shortest connecting path.

In one possible embodiment, the calculating module 6112 is specifically configured that:
  for each graph node, performing initialization to give a first distance of 0 between the graph node and other graph nodes in the quantum connectivity graph, as well as a first node weight of 1, to the graph node;
  for each of the other first graph nodes adjacent to the graph node, giving a second distance between each first graph node and the graph node as the first distance plus 1, giving a second node weight as the first node weight, and marking a path consisting of the connecting lines between the first graph node and the graph node as the shortest connecting path between the graph node and the first graph node;
  for each of second graph nodes adjacent to the first graph nodes, giving a third distance as the second distance plus 1, a third node weight as the second node weigh, to the second graph node, and marking a path consisting of connecting lines between the second graph node and the first graph node, as well as connecting lines between the first graph node and the graph node as the shortest connecting path between the graph node and the second graph node.

In one possible embodiment, the calculating module 6112 is specifically configured that:
  obtaining all leaf nodes associated with a rootnode in the shortest connecting path, and calculating a first connecting line score of all connecting lines between the leaf nodes and neighboring nodes of the leaf nodes;
  traversing from the farthest leaf node from the rootnode and calculating a second connecting line score of connecting lines between each two neighboring leaf nodes respectively until reaching the rootnode, so as to obtain the second connecting line score of all the connecting lines;
  summing the first connecting line score with all second connecting line scores so as to obtain the connecting line betweenness degree of connecting lines between each two graph nodes.

In one possible embodiment, the calculating module 6112 is specifically configured that:
  calculating a total number of shortest connecting paths through each graph node;
  obtaining the node betweenness degree for each graph node based on the total number of shortest connecting paths through each graph node.

In one possible embodiment, the partitioning module 6113 is specifically configured that:
  obtaining a target graph node in the graph node with a node betweenness degree greater than the greatest connecting line betweenness degree for all the connecting lines;
  calculating node-to-node betweenness degree for the target graph node and calculating splitting betweenness degree for the target graph node according to the node-to-node betweenness degree;
  performing a node-splitting operation on the target graph node if the splitting betweenness degree of the target graph node is greater than the maximum connecting line betweenness degree, otherwise performing a connecting line removing operation on the target graph node;
  detecting whether the quantum connectivity graph is split into disconnected sub-graphs after the node-splitting operation or the connecting line removing operation is performed;
  calculating the partitioning evaluation value of the split disconnected sub-graphs with the Modularity function if the quantum connectivity graph is detected to split into disconnected sub-graphs;
  recalculating the connecting line betweenness degree for all connecting lines according to the partitioning evaluation value, and returning to the step of calculating the node betweenness degree of all the graph nodes in the quantum connectivity graph until completely disconnected target sub-graph clusters are obtained, so as to partition the quantum connectivity graph into multiple disconnected target sub-graph clusters.

In one possible embodiment, the partitioning module 6113 is specifically configured that:
  calculating the total number of shortest paths through the connecting lines of the target graph node and each neighboring node of the target graph node, as the node-to-node betweenness degree of the target graph node;
  determining two selected graph nodes corresponding to the lowest node-to-node betweenness degree as one attributed graph node, the node-to-node betweenness degree of the attributed graph node is a sum of the node-to-node betweenness degree of two selected graph nodes
  for a sub-graph composed of all neighboring graph nodes of the target graph node, replacing connecting lines connection between all neighboring graph nodes and the attributed graph node by the attributed graph node and the auxiliary graph node, respectively, and taking the sum of the node-to-node betweenness degree between the auxiliary graph node and the two selected graph nodes as the node-to-node betweenness degree of the secondary graph node to the attributed graph node;
  repeating the step of determining two selected graph nodes corresponding to the lowest node-to-node betweenness degree as one attributed graph node for a preset number, wherein the preset number is the betweenness degree for the target graph node minus 2;
  obtaining two final graph nodes after performing the step of determining two selected graph nodes corresponding to the lowest node-to-node betweenness degree as one attributed graph node for a preset number, and determining the sum of the node-to-node betweenness degree between the two final graph nodes as the splitting betweenness degree of the target graph node.

In one possible embodiment, the partitioning module 6113 is specifically configured that:

obtaining the number of split sub-graphs of the split disconnected sub-graph, the number of connecting lines within each disconnected sub-graph, and the sum of the connectivity of all graph nodes within each disconnected sub-graph;

based on the number of split sub-graphs of the split disconnected sub-graph, the number of connecting lines within each disconnected sub-graph, and the sum of the connectivity of all graph nodes within each disconnected sub-graph, calculating the partitioning evaluation value of the split disconnected sub-graphs with the Modularity function.

Based on the same inventive concept, see FIG. 19, it shows a schematic block diagram of the structure of the computer terminal 300 for executing the above cluster partitioning method of the quantum connectivity graph provided by embodiments of the present disclosure. The computer terminal 300 may include a cluster partitioning apparatus 310 of the quantum connectivity graph, a machine-readable storage medium 320 and a processor 330.

In the present embodiment, the machine-readable storage medium 320 and the processor 330 are located in the computer terminal 300 and are provided separately. However, it should be understood that the machine-readable storage medium 320 may also be independent of the computer terminal 300, and may be accessed by the processor 330 through a bus interface. Alternatively, the machine-readable storage medium 320 may also be integrated into the processor 330, for example, may be a cache and/or a general-purpose register.

Figure 46:
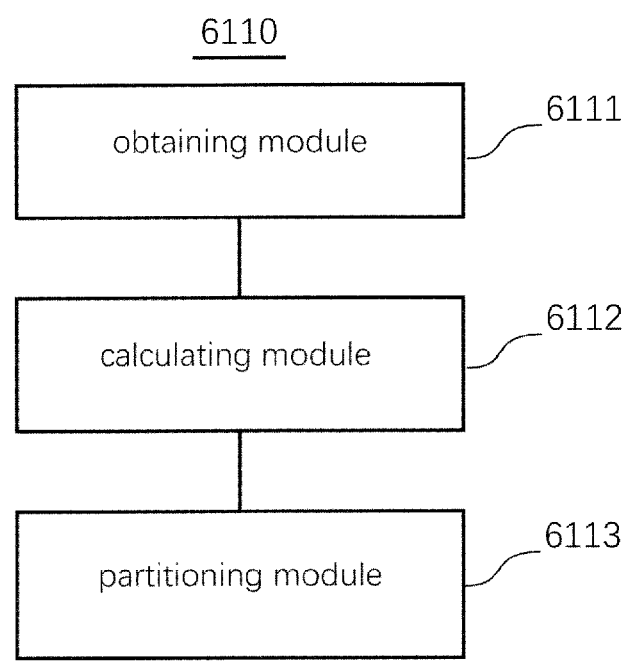
FIG. 46 illustrates a schematic diagram of functional modules of a cluster partitioning apparatus of a quantum connectivity graph provided by an embodiment of the present disclosure.

The cluster partitioning apparatus 310 of the quantum connectivity graph may include software functional modules stored in the machine-readable storage medium 320 (such as the obtaining module 6111, the calculating module 6112 and the partitioning module 6113 as shown in FIG. 46), and when the processor 330 executes the software functional modules in the cluster partitioning apparatus 310 of the quantum connectivity graph, it is possible to implement the cluster partitioning method of the quantum connectivity graph provided by the aforementioned method embodiment.

Since the computer terminal 300 provided by the embodiment of the present disclosure is another embodiment of the cluster partitioning method of the quantum connectivity graph embodiment executed by the computer terminal 300, and the computer terminal 300 may be used to execute the cluster partitioning method of the quantum connectivity graph provided by the above method embodiment, the technical effect it can obtain may refer to the above method embodiment, which will not be repeated herein.

In the related art, a quantum algorithm is a method that is simulated in a quantum circuit and needs to run on a quantum chip to implement quantum computing. When the quantum algorithm is compiled on the quantum chip, the structure of the quantum chip is usually designed based on the pre-generated quantum connectivity graph of the quantum algorithm. However, when there is a connected clustering structure in the quantum connectivity graph, if one is looking for a path that connects graph nodes of two different clustering structures, then the choices become fewer due to the fact that connections between clustering structures are sparser than connections within clustering structures, and if calculating all connecting paths and counting the number of all connecting paths passing through all connecting lines, then the number of passing through the connecting lines between clustering structures will be significantly higher than the number of passing through the connecting lines within the clusters, leading to the poor running effect of the algorithm.

Based on the shortcomings of prior arts, the present disclosure provide a cluster partitioning method, apparatus of a quantum connectivity graph, a terminal, and a storage medium, which by partitioning the quantum connectivity graph into multiple disconnected target sub-graph clusters, may be convenient to carry out subsequent quantum algorithm design based on each disconnected target sub-graph cluster later, so as to improve the operation effect of the algorithm.

I1. A cluster partitioning method of a quantum connectivity graph, characterized by including:

obtaining a quantum connectivity graph of a target quantum algorithm, and the quantum connectivity graph includes a plurality of graph nodes and connecting lines between two graph nodes, wherein the graph nodes are used to represent logic bits in the target quantum algorithm, and the connecting lines are used to represent qubit logic gates between two logic bits;

calculating connecting line betweenness degree for all connecting lines in the quantum connectivity graph, and calculating node betweenness degree for all graph nodes in the quantum connectivity graph;

partitioning the quantum connectivity into multiple disconnected target sub-graph clusters according to the connecting line betweenness degree for all connecting lines and the node betweenness degree for all graph nodes.

I2. The cluster partitioning method of a quantum connectivity graph of I1, characterized in that the step of calculating connecting line betweenness degree for all connecting lines in the quantum connectivity graph, includes:

calculating the shortest connecting path of every two graph nodes in the quantum connectivity graph;

calculating the connecting line betweenness degree of the connecting line between each two graph nodes based on the shortest connecting path.

I3. The cluster partitioning method of a quantum connectivity graph of I1 or I2, characterized in that the step of calculating the shortest connecting path of every two graph nodes in the quantum connectivity graph, includes:

for each graph node, performing initialization to give a first distance of 0 between the graph node and other graph nodes in the quantum connectivity graph, as well as a first node weight of 1, to the graph node;

for each of the other first graph nodes adjacent to the graph node, giving a second distance between each first graph node and the graph node as the first distance plus 1, giving a second node weight as the first node weight, and marking a path consisting of the connecting lines between the first graph node and the graph node as the shortest connecting path between the graph node and the first graph node;

for each of second graph nodes adjacent to the first graph nodes, giving a third distance as the second distance plus 1, a third node weight as the second node weigh, to the second graph node, and marking a path consisting of connecting lines between the second graph node and the first graph node, as well as connecting lines between the first graph node and the graph node as the shortest connecting path between the graph node and the second graph node I4. The cluster partitioning method of a quantum connectivity graph of I1 to I3, characterized in that the step of calculating the connecting line betweenness degree of the connecting line between each two graph nodes based on the shortest connecting path, includes:
  obtaining all leaf nodes associated with a rootnode in the shortest connecting path, and calculating a first connecting line score of all connecting lines between the leaf nodes and neighboring nodes of the leaf nodes;
  traversing from the farthest leaf node from the rootnode and calculating a second connecting line score of connecting lines between each two neighboring leaf nodes respectively until reaching the rootnode, so as to obtain the second connecting line score of all the connecting lines;
  summing the first connecting line score with all second connecting line scores so as to obtain the connecting line betweenness degree of connecting lines between each two graph nodes.

I5. The cluster partitioning method of a quantum connectivity graph of I1 to I4, characterized in that the step of calculating node betweenness degree for all graph nodes in the quantum connectivity graph, includes:
  calculating a total number of shortest connecting paths through each graph node;
  obtaining the node betweenness degree for each graph node based on the total number of shortest connecting paths through each graph node.

I6. The cluster partitioning method of a quantum connectivity graph of I1 to I5, characterized in that the step of partitioning the quantum connectivity into multiple disconnected target sub-graph clusters according to the connecting line betweenness degree for all connecting lines and the node betweenness degree for all graph nodes, includes:
  obtaining a target graph node in the graph node with a node betweenness degree greater than the greatest connecting line betweenness degree for all the connecting lines;
  calculating node-to-node betweenness degree for the target graph node and calculating splitting betweenness degree for the target graph node according to the node-to-node betweenness degree;
  performing a node-splitting operation on the target graph node if the splitting betweenness degree of the target graph node is greater than the maximum connecting line betweenness degree, otherwise performing a connecting line removing operation on the target graph node;
  detecting whether the quantum connectivity graph is split into disconnected sub-graphs after the node-splitting operation or the connecting line removing operation is performed;
  calculating the partitioning evaluation value of the split disconnected sub-graphs with the Modularity function if the quantum connectivity graph is detected to split into disconnected sub-graphs;
  recalculating the connecting line betweenness degree for all connecting lines according to the partitioning evaluation value, and returning to the step of calculating the node betweenness degree of all the graph nodes in the quantum connectivity graph until completely disconnected target sub-graph clusters are obtained, so as to partition the quantum connectivity graph into multiple disconnected target sub-graph clusters.

I7. The cluster partitioning method of a quantum connectivity graph of I1 to I6, characterized in that the step of calculating node-to-node betweenness degree for the target graph node and calculating splitting betweenness degree for the target graph node according to the node-to-node betweenness degree, includes:
  calculating the total number of shortest paths through the connecting lines of the target graph node and each neighboring node of the target graph node, as the node-to-node betweenness degree of the target graph node;
  determining two selected graph nodes corresponding to the lowest node-to-node betweenness degree as one attributed graph node, the node-to-node betweenness degree of the attributed graph node is a sum of the node-to-node betweenness degree of two selected graph nodes
  for a sub-graph composed of all neighboring graph nodes of the target graph node, replacing connecting lines connection between all neighboring graph nodes and the attributed graph node by the attributed graph node and the auxiliary graph node, respectively, and taking the sum of the node-to-node betweenness degree between the auxiliary graph node and the two selected graph nodes as the node-to-node betweenness degree of the secondary graph node to the attributed graph node;
  repeating the step of determining two selected graph nodes corresponding to the lowest node-to-node betweenness degree as one attributed graph node for a preset number, wherein the preset number is the betweenness degree for the target graph node minus 2;
  obtaining two final graph nodes after performing the step of determining two selected graph nodes corresponding to the lowest node-to-node betweenness degree as one attributed graph node for a preset number, and determining the sum of the node-to-node betweenness degree between the two final graph nodes as the splitting betweenness degree of the target graph node.

I8. The cluster partitioning method of a quantum connectivity graph of I1 to I7, characterized in that the step of calculating the partitioning evaluation value of the split disconnected sub-graphs with the Modularity function, includes:
  obtaining the number of split sub-graphs of the split disconnected sub-graph, the number of connecting lines within each disconnected sub-graph, and the sum of the connectivity of all graph nodes within each disconnected sub-graph;
  based on the number of split sub-graphs of the split disconnected sub-graph, the number of connecting lines within each disconnected sub-graph, and the sum of the connectivity of all graph nodes within each disconnected sub-graph, calculating the partitioning evaluation value of the split disconnected sub-graphs with the Modularity function.

I9. A cluster partitioning apparatus of a quantum connectivity graph, characterized in that the apparatus includes:
  an obtaining module configured to obtain a quantum connectivity graph of a target quantum algorithm, and the quantum connectivity graph includes a plurality of graph nodes and connecting lines between two graph nodes, wherein the graph nodes are used to represent logic bits in the target quantum algorithm, and the connecting lines are used to represent qubit logic gates between two logic bits;
  a calculating module configured to calculate connecting line betweenness degree for all connecting lines in the quantum connectivity graph, and calculating node betweenness degree for all graph nodes in the quantum connectivity graph;

a partitioning module configured to partition the quantum connectivity into multiple disconnected target sub-graph clusters according to the connecting line betweenness degree for all connecting lines and the node betweenness degree for all graph nodes.

I10. A computer terminal, characterized by including a machine-readable storage medium and a processor, the machine-readable storage medium stores a computer program therein, and the processor is configured to run the computer program to execute the cluster partitioning method of a quantum connectivity graph of any one of I1 to I8.

I11. A computer readable storage medium, characterized in that the computer readable storage medium stores a computer program therein, and the computer program is configured, when executed by a computer, to implement the cluster partitioning method of a quantum connectivity graph of any one of I1 to I8.

Based on any of the above aspects, in the present disclosure, calculating connecting line betweenness degree for all connecting lines in the quantum connectivity graph, and calculating node betweenness degree for all graph nodes in the quantum connectivity graph; and partitioning the quantum connectivity into multiple disconnected target sub-graph clusters according to the connecting line betweenness degree for all connecting lines and the node betweenness degree for all graph nodes. In this way, by partitioning the quantum connectivity into multiple disconnected target sub-graph clusters, it may be convenient to carry out subsequent quantum algorithm design based on each disconnected target sub-graph cluster later, so as to improve the operation effect of the algorithm.

The above embodiments based on the accompanying drawings detail the structure, characteristics and effects of the present disclosure, and are only better embodiments of the present disclosure, but the present disclosure does not limit the scope of implementation as shown in the drawings, and any change made in accordance with the conception of the present disclosure, or modified to an equivalent embodiment equivalent to the change, shall be within the scope of protection of the present disclosure if it does not exceed the spirit covered by the description and the drawings.

The invention claimed is:

1. A quantum topology graph optimization method, comprising:

obtaining a first quantum topology graph of a target quantum algorithm, the first quantum topology graph comprising a plurality of graph nodes and connecting lines between two graph nodes, wherein the graph nodes are used to represent logic bits in the target quantum algorithm, and the connecting lines are used to represent qubit logic gates between two logic bits;

when there are crossed connecting lines in the first quantum topology graph, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph;

when there is a node to be optimized in the second quantum topology graph or the third quantum topology graph, determining an optimized sub-graph corresponding to one node to be optimized and composed of N child nodes connected by connecting lines according to a preset way, wherein the node to be optimized is a graph node in the first quantum topology graph with connectivity greater than a connectivity threshold of a quantum chip to be applied, and none of the child nodes in the optimized sub-graph is of a connectivity greater than the connectivity threshold;

assigning connecting lines between non-optimized nodes and each child node so as to obtain a fourth quantum topology graph; wherein, the non-optimized nodes are graph nodes other than the node to be optimized; and restoring connecting lines between non-optimized nodes in the fourth quantum topology graph so as to obtain an optimized quantum topology graph.

2. The quantum topology graph optimization method of claim 1, wherein the step of obtaining a first quantum topology graph of a target quantum algorithm, comprises:

obtaining a number of qubit logic gates applied on any two logic bits in the target quantum algorithm;

obtaining an adjacency matrix based on the number of the qubit logic gates applied on any two logic bits, and converting the adjacency matrix into the first quantum topology graph.

3. The quantum topology graph optimization method of claim 1, wherein the connecting lines in the first quantum topology graph has a coarseness that represents a number of qubit logic gates applied between any two logic bits in the quantum algorithm, and the step of determining an intermediate node in the first quantum topology graph when there are crossed connecting lines in the first quantum topology graph, comprises:

obtaining connectivity, weight and/or dispersion of all graph nodes in the first quantum topology graph, wherein the connectivity is a quantity of connecting lines connected by each graph node, the weight is a sum of the coarseness of all connecting lines connected by each graph node, and the dispersion is a variance of the coarseness of all connecting lines connected by each graph node;

selecting a graph node with the maximum connectivity as the intermediate node;

selecting a graph node with the largest weight as the intermediate node when several graph nodes have the same connectivity; and selecting a graph node with the largest dispersion as the intermediate node when several graph nodes have the same connectivity and weight.

4. The quantum topology graph optimization method of claim 1, wherein the step of determining an optimized sub-graph corresponding to one node to be optimized and composed of N child nodes connected by connecting lines according to a preset way, comprises:

incrementing one child node sequentially until the connectivity of the N child nodes in a resulting optimized sub-graph is not greater than the connectivity threshold, and the optimized sub-graph is connected to the non-optimized node through the connecting lines, wherein N is a positive integer greater than 1.

5. The quantum topology graph optimization method of claim 4, wherein the step of determining an optimized sub-graph corresponding to one node to be optimized and composed of N child nodes connected by connecting lines according to a preset way, further comprises:

traversing all connection relationships between the N child nodes; and screening an optimized sub-graph composed of N child nodes connected by connecting lines, wherein there are no crossed connecting lines in the optimized sub-graph, and the connectivity of all child nodes in the optimized sub-graph is not greater than the connectivity threshold.

6. The quantum topology graph optimization method of claim 4, wherein the step of restoring connecting lines between non-optimized nodes in the fourth quantum topology graph so as to obtain an optimized quantum topology graph and optimizing the target quantum algorithm according to the optimized quantum topology graph, comprises:

selecting removed connecting lines in a descending order of coarseness and filling them back into the fourth quantum topology graph;

for currently selected connecting lines, checking for the presence of crossed connecting lines in an updated fourth quantum topology graph after filling the currently selected connecting lines back into the fourth quantum topology graph; if so, recording the fourth quantum topology graph before updating as the optimized quantum topology graph; if not, recording the updated fourth quantum topology graph as the optimized quantum topology graph.

7. The quantum topology graph optimization method of claim 1, wherein the step of assigning connecting lines between non-optimized nodes and each child node so as to obtain a fourth quantum topology graph, comprises:

obtaining a coupling intensity matrix and a distance matrix of each non-optimized node; wherein the coupling intensity matrix characterizes a sum of a number of qubit logic gates applied between two non-optimized nodes in the first quantum topology graph and a quantity of swap gates added after the non-optimized nodes are connected to the child nodes; the distance matrix characterizes distances between the non-optimized nodes and each child node;

obtaining a weighted distance of the non-optimized nodes and each child node based on the coupling intensity matrix and the distance matrix; and assigning each non-optimized node with a corresponding child node with the smallest weighted distance in a descending order of the coupling intensity matrices of the non-optimized nodes and the connecting the non-optimized node to the corresponding child node.

8. A computer terminal, comprising a machine-readable storage medium and a processor, the machine-readable storage medium stores a computer program therein, and the processor is configured to run the computer program to execute the quantum topology graph optimization method of claim 1.

9. A quantum topology graph optimization apparatus, comprising:

an obtaining module configured to obtain a first quantum topology graph of a target quantum algorithm, the first quantum topology graph comprises a plurality of graph nodes and connecting lines between two graph nodes, wherein the graph nodes are used to represent logic bits in the target quantum algorithm, and the connecting lines are used to represent qubit logic gates between two logic bits;

a cross processing module configured that when there are crossed connecting lines in the first quantum topology graph, determining an intermediate node in the first quantum topology graph, retaining connecting lines between the intermediate node and other graph nodes, and removing connecting lines between other graph nodes other than the intermediate node so as to obtain a second quantum topology graph without the crossed connecting lines; if not, updating the first quantum topology graph to a third quantum topology graph;

a determining module configured that when there is a node to be optimized in the second quantum topology graph or the third quantum topology graph, determining an optimized sub-graph corresponding to one node to be optimized and composed of N child nodes connected by connecting lines according to a preset way, wherein the node to be optimized is a graph node in the first quantum topology graph with connectivity greater than a connectivity threshold of a quantum chip to be applied, and none of the child nodes in the optimized sub-graph is of a connectivity greater than the connectivity threshold;

an assigning module configured to assign connecting lines between non-optimized nodes and each child node so as to obtain a fourth quantum topology graph; wherein, the non-optimized nodes are graph nodes other than the node to be optimized; and a restoring module configured to restore connecting lines between non-optimized nodes in the fourth quantum topology graph so as to obtain an optimized quantum topology graph.

* * * * *